(12) United States Patent
Huang et al.

(10) Patent No.: US 12,125,812 B2
(45) Date of Patent: Oct. 22, 2024

(54) INTEGRATED CIRCUIT PACKAGES AND METHODS OF FORMING THE SAME

(71) Applicant: Taiwan Semiconductor Manufacturing Company, Ltd., Hsinchu (TW)

(72) Inventors: Chien-Yuan Huang, Hsinchu (TW); Shih-Chang Ku, Taipei (TW); Chuei-Tang Wang, Taichung (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 408 days.

(21) Appl. No.: 17/676,866

(22) Filed: Feb. 22, 2022

(65) Prior Publication Data

US 2023/0025094 A1 Jan. 26, 2023

Related U.S. Application Data

(60) Provisional application No. 63/224,877, filed on Jul. 23, 2021.

(51) Int. Cl.
*H01L 23/48* (2006.01)
*H01L 23/00* (2006.01)
(Continued)

(52) U.S. Cl.
CPC .............. *H01L 24/08* (2013.01); *H01L 23/36* (2013.01); *H01L 23/5226* (2013.01);
(Continued)

(58) Field of Classification Search
CPC ..... H01L 24/08; H01L 23/36; H01L 23/5226; H01L 24/80; H01L 2224/08145; H01L 2224/80895; H01L 25/0657; H01L 2224/0401; H01L 24/06; H01L 2225/06541; H01L 23/481; H01L 2224/48247; H01L 24/81; H01L 2225/06513; H01L 2224/16227; H01L 2224/73253; H01L 24/09; H01L 2224/0603; H01L 2225/06517; H01L 23/3735; H01L 2224/80001
See application file for complete search history.

(56) References Cited

U.S. PATENT DOCUMENTS 8,993,380 B2 3/2015 Hou et al.
9,281,254 B2 3/2016 Yu et al.
(Continued)

*Primary Examiner* — Niki H Nguyen
(74) *Attorney, Agent, or Firm* — JCIPRNET

(57) ABSTRACT

An integrated circuit package includes first and second dies bonded to each other. The first die includes first die pads over a first device, first bonding pads over the first die pads, a first conductive via disposed between and electrically connected to a first one of the first die pads and a first one of the first bonding pads, and a first thermal via disposed between a second one of the first die pads and a second one of the first bonding pads and electrically insulated from the second one of the first die pads or the second one of the first bonding pads. The second die includes second bonding pads. The first one of the first bonding pads is connected to a first one of the second bonding pads. The second one of the first bonding pads is connected to a second one of the second bonding pads.

20 Claims, 49 Drawing Sheets

(51) Int. Cl.
*H01L 23/36* (2006.01)
*H01L 23/52* (2006.01)
*H01L 23/522* (2006.01)
*H01L 29/40* (2006.01)

(52) U.S. Cl.
CPC .... *H01L 24/80* (2013.01); *H01L 2224/08145* (2013.01); *H01L 2224/80895* (2013.01); *H01L 2224/80896* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 10,840,190 B1 * | 11/2020 | Yang .................... H01L 23/5226 |
| 11,114,433 B2 * | 9/2021 | Chen ...................... H01L 24/06 |
| 2019/0164914 A1 * | 5/2019 | Hu .......................... H01L 24/33 |
| 2020/0251518 A1 * | 8/2020 | Ogino .................... H01L 24/08 |
| 2020/0395339 A1 * | 12/2020 | Chen ...................... H01L 24/06 |
| 2021/0296269 A1 * | 9/2021 | Sharangpani ........... H01L 24/06 |
| 2021/0391302 A1 * | 12/2021 | Kao ....................... H01L 24/08 |
| 2023/0260940 A1 * | 8/2023 | Tsai ....................... H01L 24/03 257/773 |

* cited by examiner

INTEGRATED CIRCUIT PACKAGES AND METHODS OF FORMING THE SAME

CROSS-REFERENCE TO RELATED APPLICATION

This application claims the priority benefit of U.S. provisional application Ser. No. 63/224,877, filed on Jul. 23, 2021. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area. However, the heat dissipation is a challenge in a variety of packages including more components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 to FIG. 48 are cross-sectional views schematically illustrating integrated circuit packages in accordance with some embodiments of the present disclosure.

DETAILED DESCRIPTION

Figure 1:
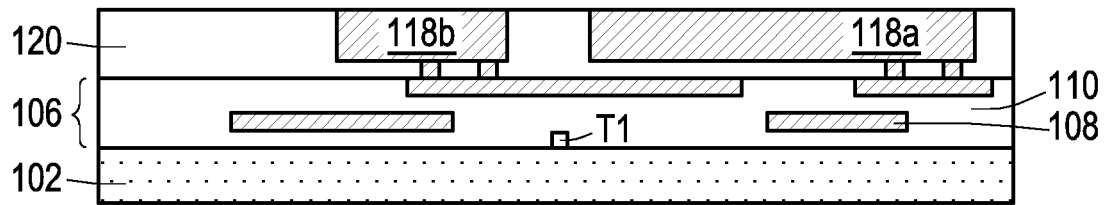
FIG. 1 to FIG. 6 are cross-sectional views schematically illustrating a method of forming an integrated circuit package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The thermal control may protect the device in the integrated circuit packages from a thermal damage. In the disclosure, the heat dissipation efficiency is improved by adding at least one thermal via around the bonding interface between two adjacent semiconductor dies.

Herein, a "thermal" or "thermally conductive" element indicates the element is configured to conduct heat from inside a structure to outside the structure. In some embodiments, a thermal element is both thermally and electrically conductive, but merely conductive to the adjacent element rather than a device or a transistor of the structure. In other embodiments, a thermal element is merely thermally conductive.

Herein, when an element is described as being "thermally connected to" another element, it means that the element is in direct contact with or in physical contact with the another element, or that a thermally conductive element or a very thin insulator is positioned between the element and the another element.

FIG. 1 to FIG. 6 are cross-sectional views schematically illustrating a method of forming an integrated circuit package in accordance with some embodiments of the present disclosure. It is understood that the disclosure is not limited by the method described below. Additional operations can be provided before, during, and/or after the method and some of the operations described below can be replaced or eliminated, for additional embodiments of the methods. Although FIG. 1 to FIG. 6 are described in relation to a method, it is appreciated that the structures disclosed in FIG. 1 to FIG. 6 are not limited to such a method, but instead may stand alone as structures independent of the method.

Referring to FIG. 1 to FIG. 4, a semiconductor dies 100 (e.g., logic die, memory die, or the like) is provided. In some embodiments, the semiconductor die 100 includes an active side (e.g., front surface) and a non-active side (e.g., back surface) opposite to the active side. Throughout the description, the side of the semiconductor die 100 with die pads is referred to as an active side.

In some embodiments, as shown in FIG. 1, the semiconductor die 100 includes a semiconductor substrate 102, at least one device T1, an interconnect structure 106, die pads 118a and 118b, and a passivation layer 120.

The semiconductor substrate 102 may include an elementary semiconductor such as silicon, germanium and/or a compound semiconductor such as silicon germanium, silicon carbide, gallium arsenic, indium arsenide, gallium nitride or indium phosphide. In some embodiments, the semiconductor substrate 102 may take the form of a planar substrate, a substrate with multiple fins, nanowires, or other forms. In some embodiments, the semiconductor die 100 may further include at least one through substrate via (TSV) formed in the semiconductor substrate 102 and electrically connected to interconnect wirings or lines of the interconnect structure 106. The TSV may include Cu, Ti, Ta, W, Ru, Co, Ni, the like, an alloy thereof, or a combination thereof.

In some embodiments, an insulating liner may be provided between the semiconductor substrate 102 and the TSV.

The device T1 is disposed on/in the semiconductor substrate 102 and includes one or more functional devices. The functional devices may include active components, passive components, or a combination thereof. In some embodiments, the functional devices may include integrated circuits devices. The functional devices are, for example, transistors, capacitors, resistors, diodes, photodiodes, fuse devices and/ or other similar devices. In some embodiments, the semiconductor die 100 may be referred to as a "first device die," "first-tier semiconductor die," or "lower integrated circuit structure."

The interconnect structure 106 is formed on the semiconductor substrate 102 and electrically connected to the device T1. The interconnect structure 106 may include one or more dielectric layers, collectively referred to as a dielectric layer 110, and metal features 108 embedded in the dielectric layer 110. The metal features 108 are disposed in the dielectric layer 110 and electrically connected with each other. Portions of the metal features 108, such as top metal lines, are exposed by the dielectric layer 110. In some embodiments, the dielectric layer 110 includes an inter-layer dielectric (ILD) layer on the semiconductor substrate 102, and at least one inter-metal dielectric (IMD) layer over the inter-layer dielectric layer. In some embodiments, the dielectric layer 110 includes silicon oxide, silicon oxynitride, silicon nitride, a low-k material having a dielectric constant less than 3.5 or 3, or a combination thereof. The dielectric layer 110 may be a single layer or a multiple-layer structure. In some embodiments, the metal features 108 include metal plugs and metal lines. The plugs may include contacts formed in the inter-layer dielectric layer, and vias formed in the inter-metal dielectric layer. The contacts are formed between and in contact with a bottom metal line and the underlying device T1. The vias are formed between and in contact with two metal lines. The metal features 108 may include Cu, Ti, Ta, W, Ru, Co, Ni, the like, an alloy thereof, or a combination thereof. In some embodiments, a seed layer and/or a barrier layer may be disposed between each metal feature 108 and the dielectric layer 110 to serve as a seed and/or prevent the material of the metal feature 108 from migrating to the underlying device T1. The seed layer includes Ti/Cu. The barrier layer includes Ta, TaN, Ti, TiN, CoW, the like, or a combination thereof, for example. In some embodiments, the interconnect structure 106 is formed by a dual damascene process. In other embodiments, the interconnect structure 106 is formed by multiple single damascene processes. In other embodiments, the interconnect structure 106 is formed by an electroplating process.

The die pads 118a and 118b are formed over the interconnect structure 106. In some embodiments, the die pads 118a and 118b are electrically connected to the interconnect structure 106 and therefore the device T1. The die pads 118a and 118b are referred to as "active die pads" in some examples. In some embodiments, the die pads 118a and 118b are aluminum pads. However, the disclosure is not limited thereto. In other embodiments, the dies pads 118a and 118b are copper pads, nickel pads or pads made by other suitable materials. In some embodiments, some of the die pads 118a and 118b have probe marks on the top surfaces thereof. The semiconductor die 100 may be referred to as a "known good die" after passing testing. In some embodiments, the die pads 118a and 118b are free of probe marks. In some embodiments, the die pads 118a and 118b are formed by a sputtering process, a deposition process, an electroplating process, the like, or a combination thereof.

The passivation layer 120 is formed over the interconnect structure 106 and covers the sidewalls and top surfaces of the die pads 118a and 118b. In some embodiments, the passivation layer 120 includes silicon oxide, silicon nitride, benzocyclobutene (BCB) polymer, polyimide (PI), polybenzoxazole (PBO), the like, or a combination thereof, and is formed by a suitable process such as spin coating, CVD or the like.

Figure 2:
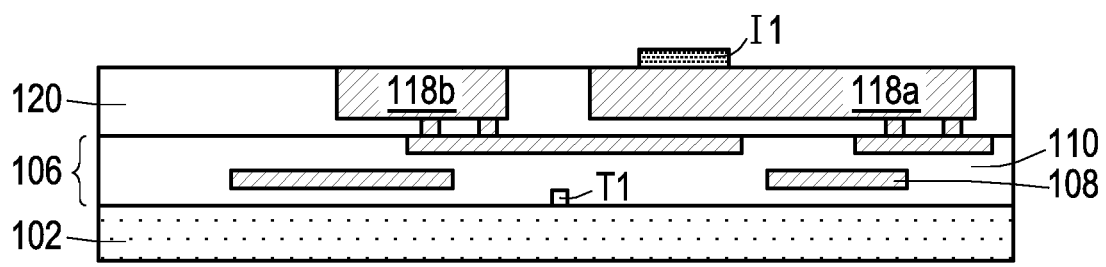

Referring to FIG. 2, an insulator I1 is formed on the die pad 118a. Specifically, the insulator I1 is in physical contact with the die pad 118a. In some embodiments, the insulator I1 includes an insulating material or a dielectric material, such as silicon oxide, silicon oxynitride, silicon nitride, a low-k material having a dielectric constant less than 3.5 or 3, or a combination thereof. In some embodiments, the method of forming the insulator I1 includes forming an insulating layer over the interconnect structure 106, and patterning the insulating layer with photolithography and etching steps.

Figure 3:
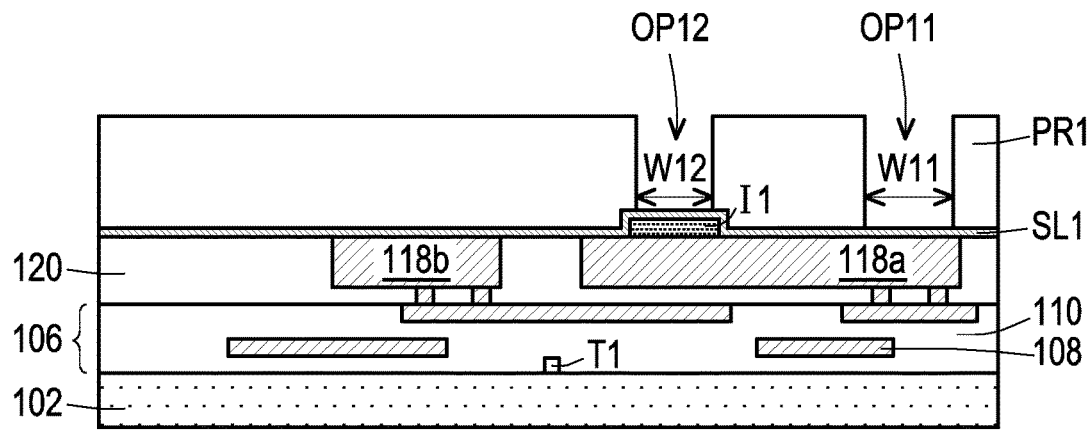

Referring to FIG. 3, a seed layer SL1 is formed on the die pads 118a and 118b. In some embodiments, the seed layer SL1 covers the top surfaces of the passivation layer 120 the die pads 118a and 118b, and covers the top and sidewall of the insulator I1. In some embodiments, the seed layer SL1 may include Ti/Cu, and is formed by a sputtering process.

Thereafter, a photoresist layer PR1 is formed on the seed layer SL1. In some embodiments, the photoresist layer PR1 has openings OP11 and OP12, the opening OP11 corresponds to a portion of the die pad 118a, and the opening OP12 corresponds to the insulator I1. In some embodiments, the width W11 of the opening OP11 is different from (e.g., greater than) the width W12 of the opening OP12. However, the disclosure is not limited thereto. In other embodiments, the width W11 of the opening OP11 is substantially the same as or less than the width W12 of the opening OP12.

Figure 4:
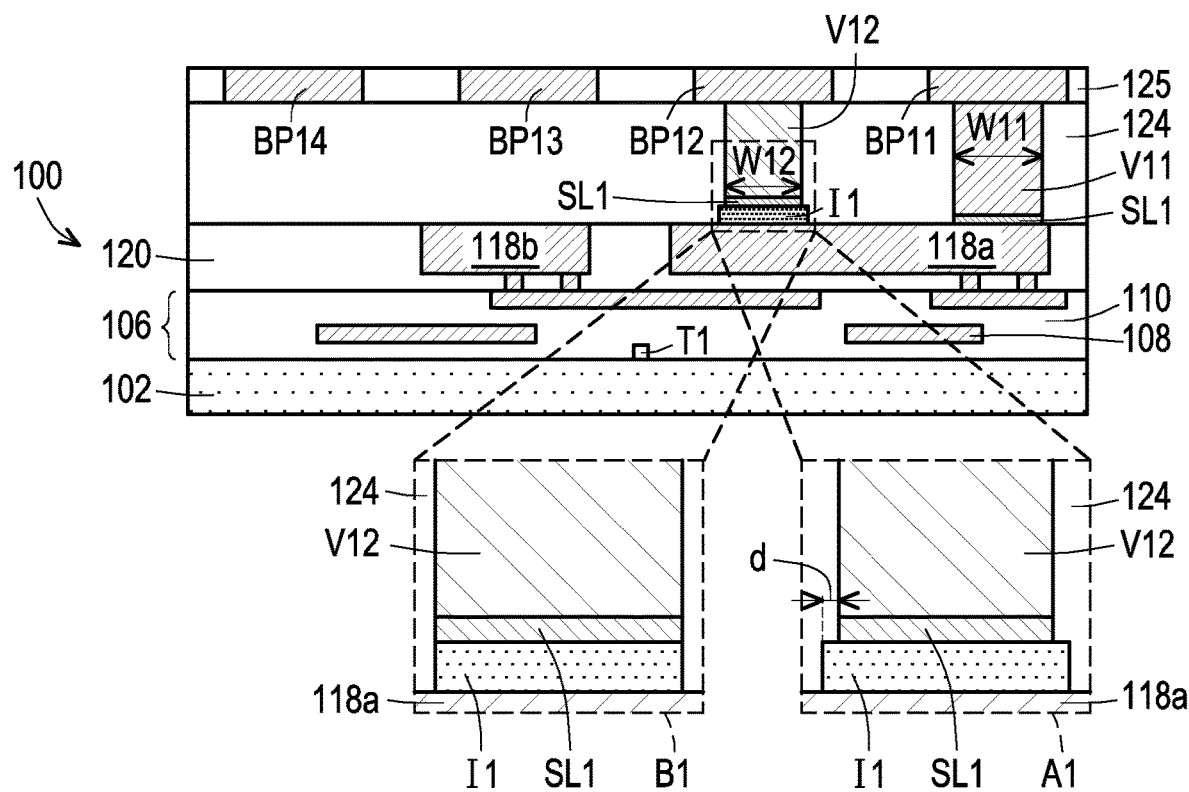

Referring to FIG. 4, a conductive via V11 and a thermal via V12 are formed in the openings OP11 and OP12 of the photoresist layer PR1 with an electroplating process is performed by using the seed layer SL1 as a seed. In some embodiments, the conductive via V11 and the thermal via V12 include Cu, Ti, Ta, W, Ru, Co, Ni, the like, an alloy thereof, or a combination thereof. In some embodiments, a portion of the seed layer SL1 is in contact with the conductive via V11 and the die pad 118a, and another portion of the seed layer SL1 is in contact with the thermal via V12 and the insulator I1. The conductive via V11 and the thermal via V12 are made by the same material (e.g., Cu), wherein the conductive via V11 is electrically connected to the die pad 118a while the thermal via V12 is electrically insulated from the die pad 118a. The photoresist layer PR1 and the underlying seed layer SL1 are then removed.

Thereafter, a dielectric layer 124 is formed around the conductive via V11 and the thermal via V12 and the underlying insulator I1. Specifically, the top surface of the dielectric layer 124 is level with the top surfaces of the conductive via V11 and the thermal via V12. In some embodiments, the dielectric layer 124 includes silicon oxide, silicon nitride, silicon oxynitirde, the like, or a combination thereof. The method of forming the dielectric layer 124 includes forming a dielectric material over the conductive via V11 and the thermal via V12, and performing a planarization process until the top surfaces of the conductive via V11 and the thermal via V12 are exposed.

In some embodiments, as shown in the local enlarged view A1 of FIG. 4, the sidewall of the thermal via V12 is slightly recessed from the sidewall of the insulator I1 by a non-zero distance d. The non-zero distance d ranges from about 0.01-0.5 um, for example. However, the disclosure is not limited thereto. In some embodiments, as shown in the local enlarged view B1 of FIG. 4, the sidewall of the thermal via V12 is substantially aligned with the sidewall of the underlying insulator I1.

Afterwards, bonding pads BP11 and BP12 are formed over the conductive via V11 and thermal via V12, respectively. In some embodiments, the bonding pads BP11 and BP12 are embedded in the bonding dielectric layer 125 and in contact with the conductive via V11 and thermal via V12, respectively. In some embodiments, bonding pads BP13 and BP14 are embedded in the bonding dielectric layer 125 and formed aside the bonding pads BP11 and BP12. The bonding pads BP11 to BP14 may include Cu, Ti, Ta, W, Ru, Co, Ni, the like, an alloy thereof, or a combination thereof. In some embodiments, a seed layer and/or a barrier layer may be disposed between each bonding pad and the dielectric layer 125 to serve as a seed and/or prevent the material of the bonding pad from migrating to the underlying device T1. The seed layer includes Ti/Cu. The barrier layer includes Ta, TaN, Ti, TiN, CoW, the like, or a combination thereof, for example. In some embodiments, the bonding pads BP11 to BP14 are formed by damascene processes. In other embodiments, the bonding pads BP11 to BP14 are formed by an electroplating process. In some embodiments, the bonding dielectric layer 125 includes silicon (Si), silicon oxide ($SiO_x$, where x>0), silicon nitride ($SiN_x$, where x>0), silicon oxynitride ($SiO_xN_y$, where x>0 and y>0) or other suitable bonding materials. The semiconductor die 100 is thus completed.

The bonding pad BP11 is called an "active bonding pad" in some examples, because it provides electrical path between dies. The bonding pads BP12, BP13 and BP14 are called "dummy bonding pads" or "floating bonding pads" in some examples, because they enhance the bonding strength between dies without providing electrical paths. The bonding pad BP12 is called a "thermal bonding pad" in some examples, because the bonding pad BP12 enhances the heat dissipation efficiency between dies. In some embodiments, the bonding pads BP11 to BP14 have substantially the same size (e.g., width). However, the disclosure is not limited thereto. In other embodiments, the bonding pads BP11 to BP14 may have different sizes.

Figure 5:
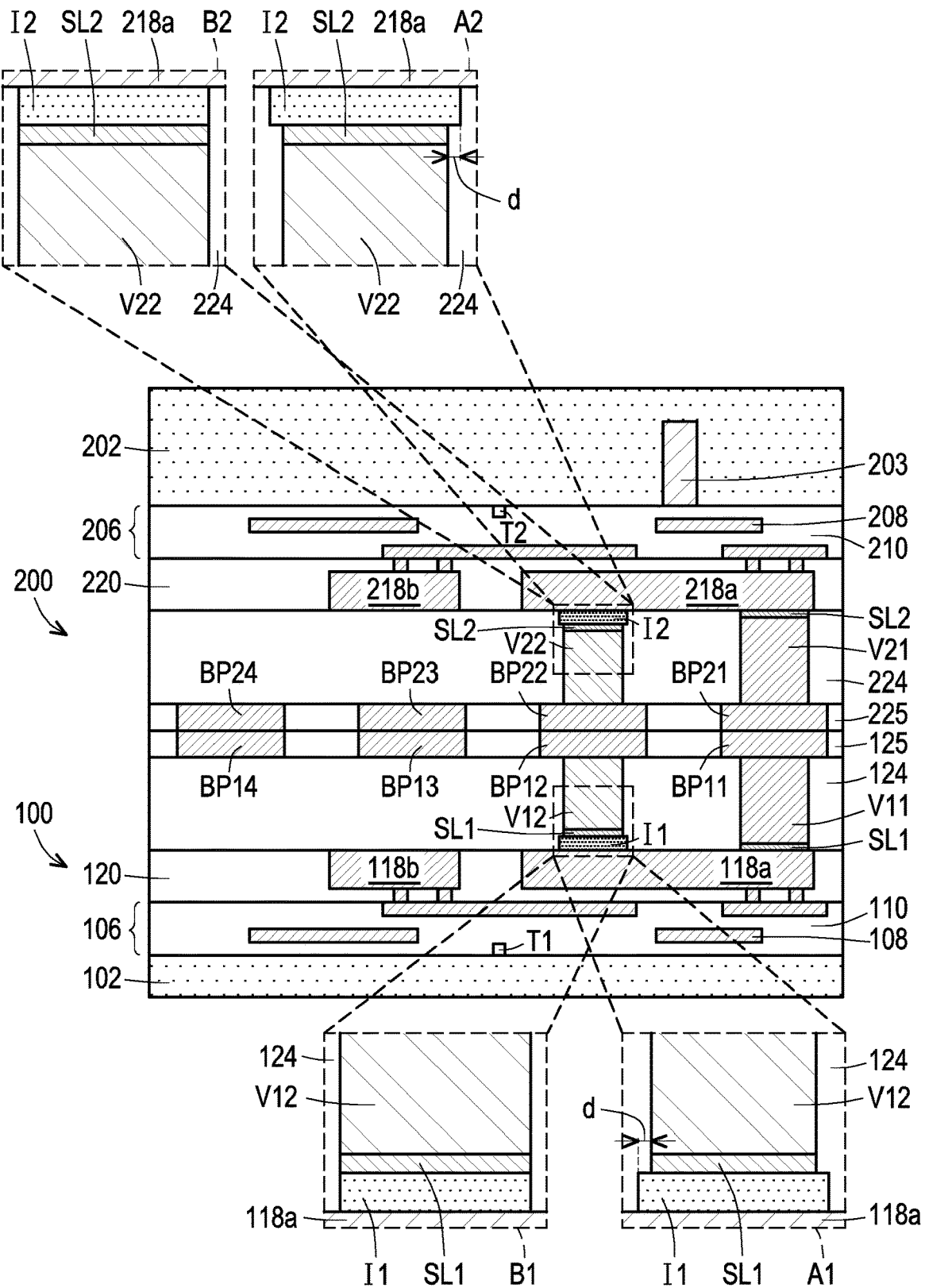

Referring to FIG. 5, a semiconductor die 200 (e.g., logic die, memory die, or the like) is provided and bonded to the semiconductor die 100. In some embodiments, the semiconductor die 200 includes an active side (e.g., front surface) and a non-active side (e.g., back surface) opposite to the active side. Throughout the description, the side of the semiconductor die 200 with die pads is referred to as an active side. In some embodiments, the second semiconductor die 200 has a structure similar to that of the first semiconductor die 100, so the difference between them is illustrated below, and the similarity is not iterated herein.

In some embodiments, the semiconductor die 200 includes a semiconductor substrate 202, at least one device T2, an interconnect structure 206, die pads 218a and 218b, and a passivation layer 220.

Figure 6:
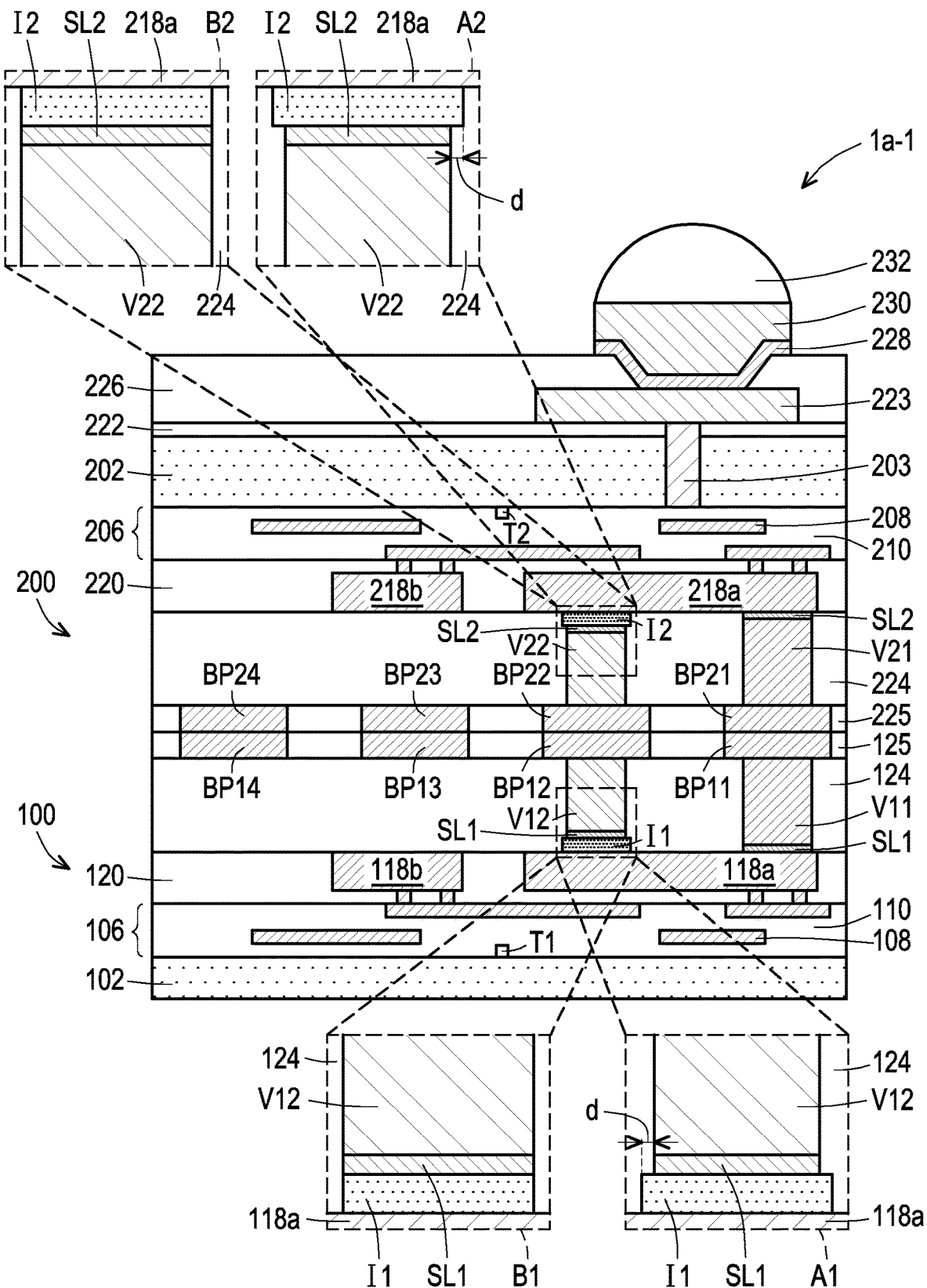

The semiconductor substrate 202 may include an elementary semiconductor such as silicon, germanium and/or a compound semiconductor such as silicon germanium, silicon carbide, gallium arsenic, indium arsenide, gallium nitride or indium phosphide. In some embodiments, the semiconductor substrate 202 may take the form of a planar substrate, a substrate with multiple fins, nanowires, or other forms. In some embodiments, the semiconductor die 200 may further include at least one through substrate via (TSV) 203 formed in the semiconductor substrate 202 and electrically connected to interconnect wirings or lines of the interconnect structure 206. As illustrated in FIG. 6, the at least one TSV 203 is embedded in the semiconductor substrate 202, and the TSV 203 is not revealed from the back surface of the semiconductor substrate 202 at this stage. The TSV may include Cu, Ti, Ta, W, Ru, Co, Ni, the like, an alloy thereof, or a combination thereof. In some embodiments, an insulating liner may be provided between the semiconductor substrate 202 and the TSV 203.

The device T2 is disposed on/in the semiconductor substrate 202 and includes one or more functional devices. The functional devices may include active components, passive components, or a combination thereof. In some embodiments, the functional devices may include integrated circuits devices. The functional devices are, for example, transistors, capacitors, resistors, diodes, photodiodes, fuse devices and/or other similar devices. In some embodiments, the semiconductor die 200 may be referred to as a "second device die," "second-tier semiconductor die," or "upper integrated circuit structure."

The interconnect structure 206 is formed on the semiconductor substrate 202 and electrically connected to the device T2. The interconnect structure 206 may include one or more dielectric layers, collectively referred to as a dielectric layer 210, and metal features 208 embedded in the dielectric layer 210. The metal features 208 are disposed in the dielectric layer 210 and electrically connected with each other. Portions of the metal features 208, such as top metal lines, are exposed by the dielectric layer 210. In some embodiments, the dielectric layer 210 includes an inter-layer dielectric (ILD) layer on the semiconductor substrate 202, and at least one inter-metal dielectric (IMD) layer over the inter-layer dielectric layer. In some embodiments, the dielectric layer 210 includes silicon oxide, silicon oxynitride, silicon nitride, a low-k material having a dielectric constant less than 3.5 or 3, or a combination thereof. The dielectric layer 210 may be a single layer or a multiple-layer structure. In some embodiments, the metal features 208 include metal plugs and metal lines. The plugs may include contacts formed in the inter-layer dielectric layer, and vias formed in the inter-metal dielectric layer. The contacts are formed between and in contact with a bottom metal line and the underlying device T2. The vias are formed between and in contact with two metal lines. The metal features 208 may include Cu, Ti, Ta, W, Ru, Co, Ni, the like, an alloy thereof, or a combination thereof. In some embodiments, a barrier layer may be disposed between each metal feature 208 and the dielectric layer 210 to prevent the material of the metal feature 108 from migrating to the underlying device T2. The barrier layer includes Ta, TaN, Ti, TiN, Co W, the like, or a combination thereof, for example. In some embodiments, the interconnect structure 206 is formed by a dual damascene process. In other embodiments, the interconnect structure 206 is formed by multiple single damascene processes. In other embodiments, the interconnect structure 206 is formed by an electroplating process.

The die pads 218a and 218b are formed over the interconnect structure 106. In some embodiments, the die pads 218a and 218b are electrically connected to the interconnect structure 206 and therefore the device T2. In some embodiments, the die pads 218a and 218b are aluminum pads. However, the disclosure is not limited thereto. In other embodiments, the dies pads 218a and 218b are copper pads, nickel pads or pads made by other suitable materials. In some embodiments, some of the die pads 218a and 218b have probe marks on the top surfaces thereof. The semiconductor die 200 may be referred to as a "known good die"

after passing testing. In some embodiments, the die pads 218a and 218b are free of probe marks. In some embodiments, the die pads 218a and 218b are formed by a sputtering process, a deposition process, an electroplating process, the like, or a combination thereof.

The passivation layer 220 is formed over the interconnect structure 206 and covers the sidewalls and top surfaces of the die pads 218a and 218b. In some embodiments, the passivation layer 220 includes silicon oxide, silicon nitride, benzocyclobutene (BCB) polymer, polyimide (PI), polybenzoxazole (PBO), the like, or a combination thereof, and is formed by a suitable process such as spin coating, CVD or the like.

Thereafter, an insulator 12 is formed on the die pad 218a. Specifically, the insulator 12 is in physical contact with the die pad 218a. In some embodiments, the insulator 12 includes an insulating material or a dielectric material, such as silicon oxide, silicon oxynitride, silicon nitride, a low-k material having a dielectric constant less than 3.5 or 3, or a combination thereof. In some embodiments, the method of forming the insulator 12 includes forming an insulating material over the passivation layer 220 and the die pads 218a and 218b, and patterning the insulating material with photolithography and etching steps.

Afterwards, a seed layer SL2, a conductive via V21 and a thermal via V22 are formed over the die pad 218a. A portion of the seed layer SL2 is formed between the conductive via V21 and the die pad 218a, and a portion of the seed layer SL2 is formed between the thermal via V22 and the insulator 12. The materials and forming methods of the seed layer SL2, the conductive via V21 and the thermal via V22 are similar to those of the seed layer SL1, the conductive via V21 and the thermal via V22 described above, so the details are not iterated herein.

Thereafter, a dielectric layer 224 is formed around the conductive via V21 and the thermal via V22 and the underlying insulator 12. In some embodiments, the dielectric layer 224 includes silicon oxide, silicon nitride, silicon oxynitride, the like, or a combination thereof. The method of forming the dielectric layer 224 includes forming a dielectric material over the conductive via V21 and the thermal via V22, and performing a planarization process until the top surfaces of the conductive via V21 and the thermal via V22 are exposed.

In some embodiments, as shown in the local enlarged view A2 of FIG. 5, the sidewall of the thermal via V22 is slightly recessed from the sidewall of the underlying insulator 12 by a non-zero distance d. The non-zero distance d ranges from about 0.01-0.5 um, for example. However, the disclosure is not limited thereto. In some embodiments, as shown in the local enlarged view B2 of FIG. 5, the sidewall of the overlying thermal via V22 is substantially level with the sidewall of the underlying insulator 12.

Afterwards, bonding pads BP21 and BP22 are formed over the conductive via V21 and thermal via V22, respectively. In some embodiments, the bonding pads BP21 and BP22 are embedded in the bonding dielectric layer 225 and in contact with the conductive via V21 and thermal via V22, respectively. In some embodiments, bonding pads BP23 and BP24 are embedded in the bonding dielectric layer 225 and formed aside the bonding pads BP21 and BP22.

The bonding pads BP21 to BP24 may include Cu, Ti, Ta, W, Ru, Co, Ni, the like, an alloy thereof, or a combination thereof. In some embodiments, a seed layer and/or a barrier layer may be disposed between each bonding pad and the dielectric layer 225 to serve as a seed and/or prevent the material of the bonding pad from migrating to the underlying device T2. The seed layer includes Ti/Cu. The barrier layer includes Ta, TaN, Ti, TiN, CoW, the like, or a combination thereof, for example. In some embodiments, the bonding pads BP21 to BP24 are formed by damascene processes. In other embodiments, the bonding pads BP21 to BP24 are formed by an electroplating process. In some embodiments, the bonding dielectric layer 225 includes silicon (Si), silicon oxide ($SiO_x$, where x>0), silicon nitride ($SiN_x$, where x>0), silicon oxynitride ($SiO_xN_y$, where x>0 and y>0) or other suitable bonding materials. The semiconductor die 200 is thus completed.

The bonding pad BP21 is called an "active bonding pad" in some examples, because it provides electrical path between dies. The bonding pads BP22, BP23 and BP24 are called "dummy bonding pads" or "floating bonding pads" in some examples, because they enhance the bonding strength between dies without providing electrical paths. The bonding pad BP22 is called a "thermal bonding pad" in some examples, because the bonding pad BP22 enhances the heat dissipation efficiency between dies. In some embodiments, the bonding pads BP21 to BP24 have substantially the same size (e.g., width). However, the disclosure is not limited thereto. In other embodiments, the bonding pads BP11 to BP14 may have different sizes.

Still referring to FIG. 5, the semiconductor die 200 is turned over and then bonded to the semiconductor die 100. In some embodiments, the semiconductor die 200 and the semiconductor die 100 are bonded in a face-to-face alignment, wherein the front side or active side of the semiconductor die 200 faces the front side or active side of the semiconductor die 100. Specifically, the bonding pads BP21 to BP24 of the semiconductor die 200 are aligned and in physical contact with the corresponding bonding pads BP11 to BP14 of the semiconductor die 100, and the bonding dielectric layer 225 of the semiconductor die 200 is aligned and in physical contact with the corresponding bonding dielectric layer 125 of the semiconductor die 100. In some embodiments, the dimension of the bonding pads BP21 to BP24 is the same as that of the bonding pads BP11 to BP14. In other embodiments, the dimension of one or more of the bonding pads BP21 to BP24 is different from that of the bonding pads BP11 to BP14. The semiconductor die 200 and the semiconductor die 100 are heated and/or pressed to enable a metal-to-metal bonding (e.g., copper-to-copper bonding) and a dielectric-to-dielectric bonding (e.g., oxide-to-oxide bonding). Such bonding is called a "hybrid bonding".

Referring to FIG. 6, the semiconductor die 200 is thinned to expose an upper portion of the TSV 203 of the semiconductor die 200. In some embodiments, the semiconductor substrate 202 is thinned from the backside and a portion of the semiconductor substrate 202 is removed through a suitable grinding process and/or a polishing process such as chemical mechanical polishing (CMP) or the like to reveal the upper portion of the TSV 203.

Thereafter, an isolation layer 222 is formed over the semiconductor die 200, covers the backside of the semiconductor die 200 and aside the exposed portion of the TSV 203. The isolation layer 222 includes silicon oxide, silicon nitride, silicon oxynitride or a combination thereof and is formed by a suitable process such as CVD.

Afterwards, a backside metal feature 223 is formed over and electrically connected to the TSV 203. The backside metal feature 223 includes redistribution layer (RDL) lines and/or pads embedded in a passivation layer 226. An under bump metallization (UBM) layer 228 is formed over the backside metal feature 223, and a bump is formed or mounted over the UBM layer 228. In some embodiments, the bump is electrically connected to the TSV 203 through the backside metal feature 223. In some embodiments, the UBM layer 228 is made of Ti, TiN, Ta, TaN, or the like and formed by a suitable process such as CVD. In some embodiments, the bump is made of a conductive material with low resistivity, such as Sn, Pb, Ag, Cu, Ni, Bi or an alloy thereof, and formed by a suitable process such as evaporation, plating, ball drop, or screen printing. In some embodiments, the bump includes a lower portion 230 (e.g., Cu pillar) and an upper portion 232 (e.g., solder ball) made by different materials. An integrated circuit package 1a-1 is thus completed.

In the integrated circuit package 1a-1, the thermal control performance is improved by adding thermal vias V12 and V22 around the bonding interface between two adjacent semiconductor dies 100 and 200, respectively. Specifically, each of the thermal vias V12 and V22 is thermally conductive to the bonding pads BP12 and BP22, but electrically insulated from the device T1 and the device T2 by inserting the insulators I1 and I2 to block the electrical paths. In this embodiment, the bonding pads BP12 and BP22 are called "thermal bonding pads". The thermal resistance of SoIC bond is significantly reduced by adding the thermal vias and/or thermal bonding pads of the disclosure.

Thermal vias with various configurations are contemplated as falling within the spirit and scope of the present disclosure, as long as such thermal vias provide thermal paths but block conductive paths.

FIG. 7 to FIG. 10 are cross-sectional views schematically illustrating a method of forming an integrated circuit package in accordance with some embodiments of the present disclosure. It is understood that the disclosure is not limited by the method described below. Additional operations can be provided before, during, and/or after the method and some of the operations described below can be replaced or eliminated, for additional embodiments of the methods. Although FIG. 7 to FIG. 10 are described in relation to a method, it is appreciated that the structures disclosed in FIG. 7 to FIG. 10 are not limited to such a method, but instead may stand alone as structures independent of the method.

Figure 9:
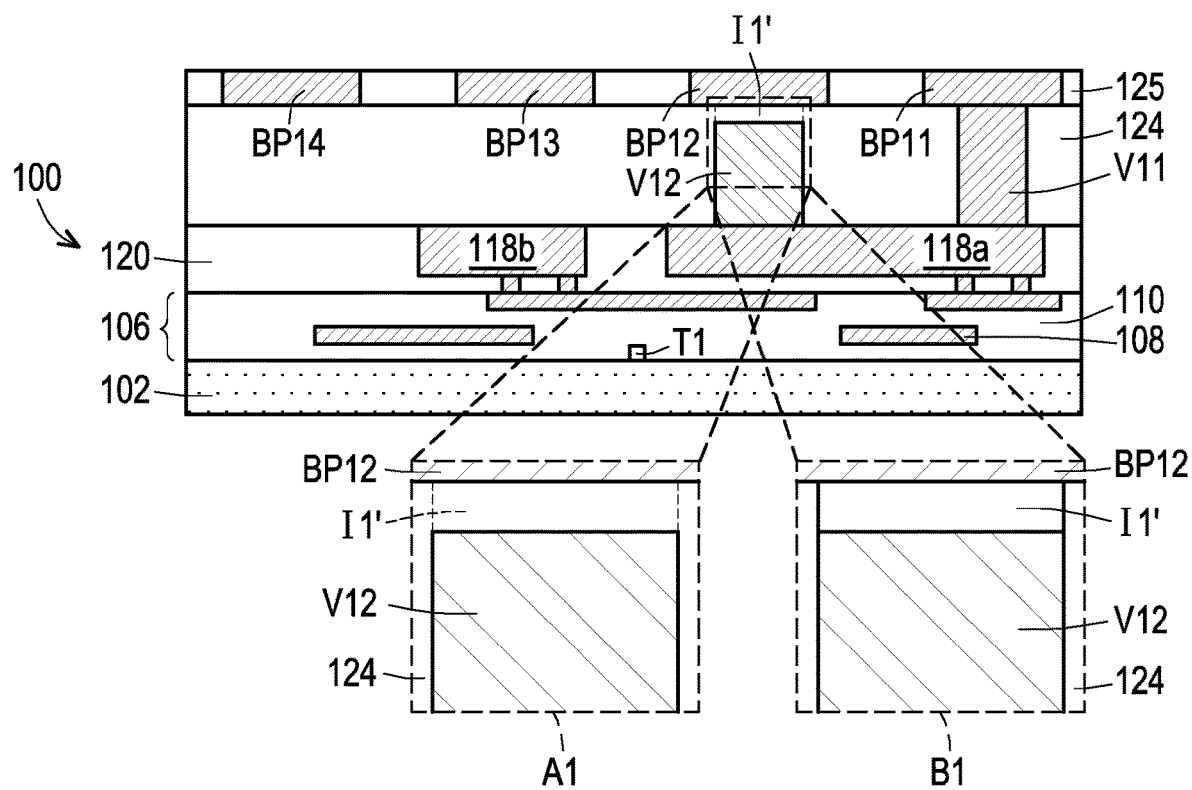
Figure 10:
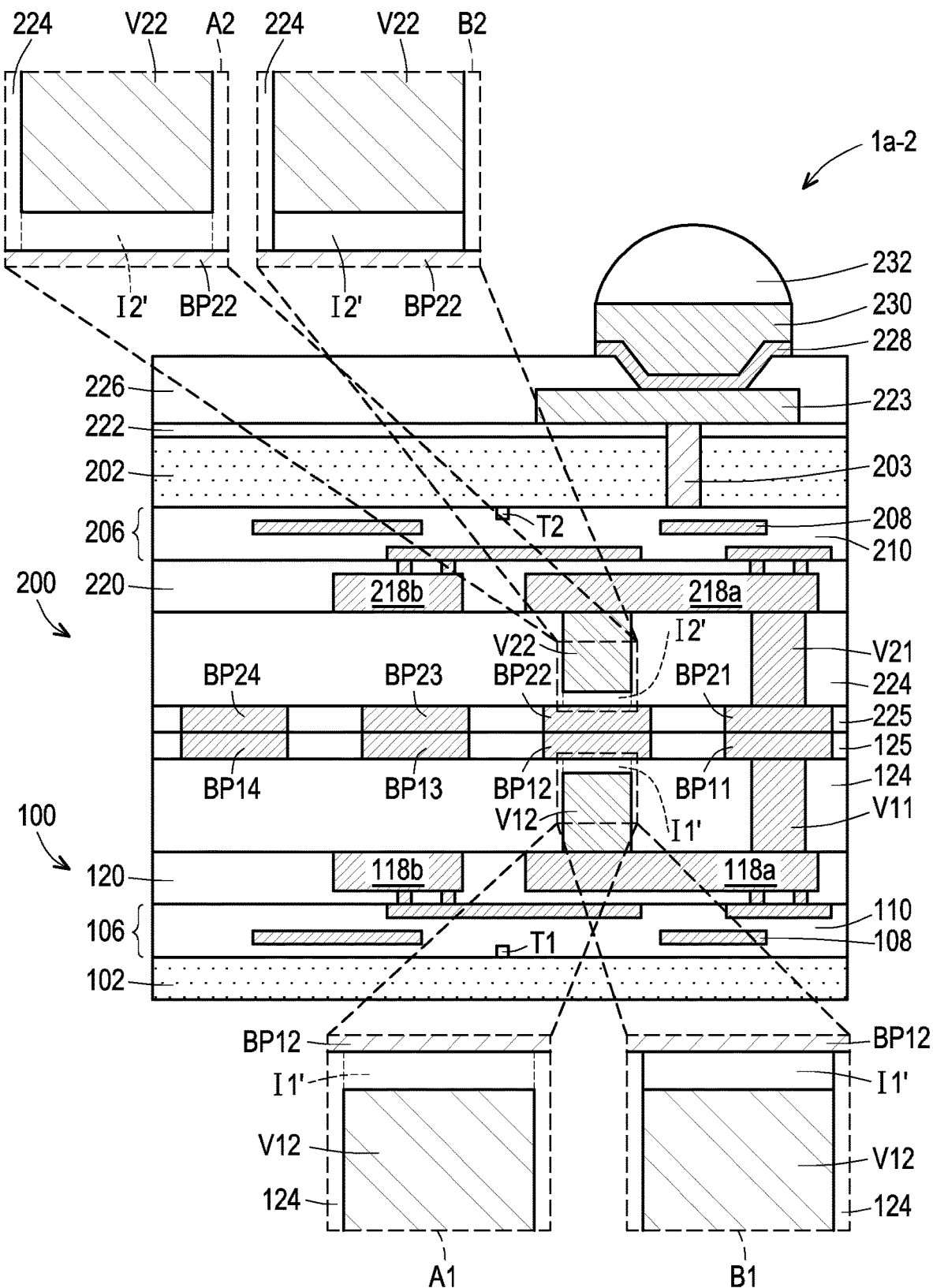

The integrated circuit package 1a-2 of FIG. 10 is similar to the integrated circuit package 1a-1 of FIG. 6, wherein like reference numerals refer to like elements. The materials, configurations and forming methods of elements of FIG. 7 to FIG. 10 may refer to those of similar elements described in the previous embodiments. The integrated circuit package 1a-2 of FIG. 10 may be beneficial for process flexibility.

Figure 7:
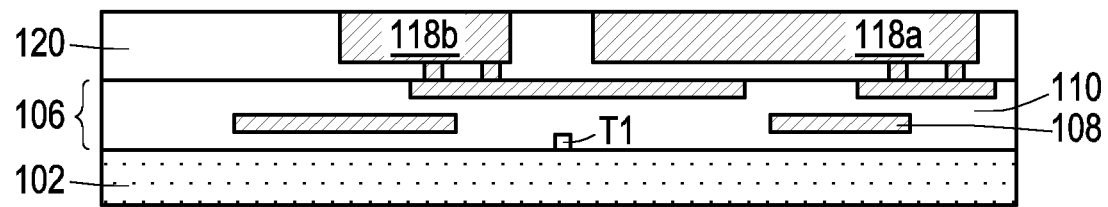
FIG. 7 to FIG. 10 are cross-sectional views schematically illustrating a method of forming an integrated circuit package in accordance with some embodiments of the present disclosure.
Figure 8:
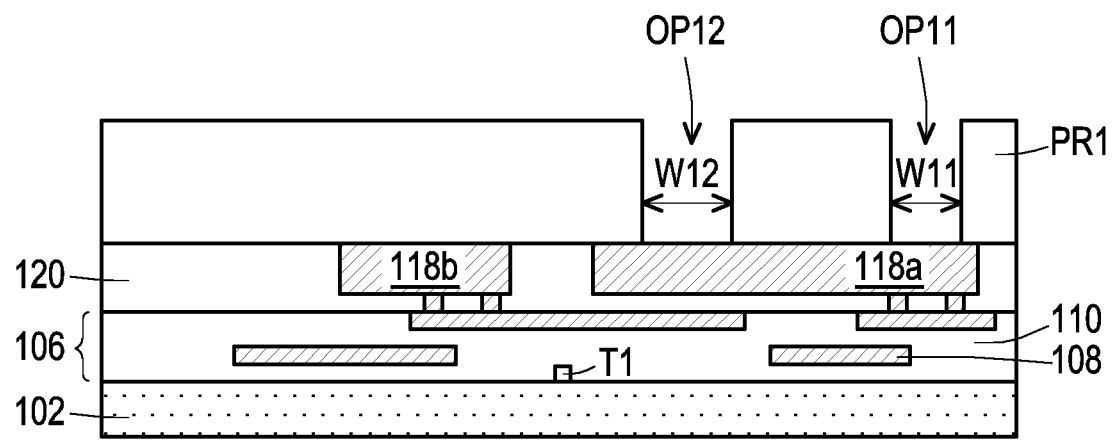

Referring to FIG. 7 to FIG. 9, a semiconductor dies 100 (e.g., logic die, memory die, or the like) is provided. In some embodiments, as shown in FIG. 7, the semiconductor die 100 includes a semiconductor substrate 102, at least one device T1, an interconnect structure 106, die pads 118a and 118b, and a passivation layer 120.

Thereafter, as shown in FIG. 8, a photoresist layer PR1 is formed on the passivation layer 120. In some embodiments, the photoresist layer PR1 has openings OP11 and OP12, the opening OP11 corresponds to a portion of the die pad 118a, and the opening OP12 corresponds to another portion of the die pad 118a. In some embodiments, the width W11 of the opening OP11 is different from (e.g., less than) the width W12 of the opening OP12. However, the disclosure is not limited thereto. In other embodiments, the width W11 of the opening OP11 is substantially the same as the width W12 of the opening OP12.

Referring to FIG. 9, a conductive via V11 and a thermal via V12 are formed in the openings OP11 and OP12 of the photoresist layer PR1 with an electroplating process by using the die pad 118a as a seed. In some embodiments, the conductive via V11 and the thermal via V12 include Cu, Ti, Ta, W, Ru, Co, Ni, the like, an alloy thereof, or a combination thereof. The conductive via V11 and the thermal via V12 are made by the same material (e.g., Cu), wherein the conductive via V11 and the thermal via V12 are electrically connected to the die pad 118a. In some embodiments, since the width W11 of the opening OP11 is less than the width W12 of the opening OP12, the conductive via V11 is formed higher than the thermal via V12 during the same electroplating process. The photoresist layer PR1 is then removed.

Thereafter, a dielectric layer 124 is formed around the conductive via V11 and the thermal via V12. Specifically, the top surface of the dielectric layer 124 is level with the top surface of the conductive via V11 but higher than the top surface of the thermal via V12. Specifically, the dielectric layer 124 covers the top surface and the sidewall of the thermal via V12. From another point of view, the portion of the dielectric layer 124 above the thermal via V22 is regarded as an insulator I1' in some examples.

In some embodiments, the dielectric layer 124 includes silicon oxide, silicon nitride, silicon oxynitirde, the like, or a combination thereof. The method of forming the dielectric layer 124 includes forming a dielectric material over the conductive via V11 and the thermal via V12, and performing a planarization process until the top surface of the conductive via V11 is exposed.

In some embodiments, as shown in the local enlarged view A1 of FIG. 9, the insulator I1' marked by dotted line is part of the dielectric layer 124, so an interface is not present between the insulator I1' and the dielectric layer 124. The insulator I1' and the dielectric layer 124 of the local enlarged view A1 are made by the same material. However, the disclosure is not limited thereto. In some embodiments, as shown in the local enlarged view B1 of FIG. 9, a patterning process (including, for example, a deposition step followed by photolithography and etching steps) may be performed to provide an insulator I1' over the thermal via V12, so a visible interface is present between the insulator I1' and the dielectric layer 124. The insulator I1' and the dielectric layer 124 of the local enlarged view B1 are made by the same material or different materials.

Afterwards, bonding pads BP11 and BP12 are formed over the conductive via V11 and thermal via V12, respectively. In some embodiments, the bonding pads BP11 and BP12 are embedded in the bonding dielectric layer 125 and in contact with the conductive via V11 and the insulator I', respectively. Specifically, the insulator I1' is disposed between and in contact with the bonding pad BP11 and the conductive via V11. In some embodiments, bonding pads BP13 and BP14 are embedded in the bonding dielectric layer 125 and formed aside the bonding pads BP11 and BP12. The bonding pads BP11 to BP14 may include Cu, Ti, Ta, W, Ru, Co, Ni, the like, an alloy thereof, or a combination thereof. In some embodiments, a seed layer and/or a barrier layer may be disposed between each bonding pad and the dielectric layer 125 to serve as a seed and/or prevent the material of the bonding pad from migrating to the underlying device T1. The seed layer includes Ti/Cu. The barrier layer includes Ta, TaN, Ti, TiN, CoW, the like, or a combination thereof, for example. In some embodiments, the seed layer and/or the barrier layer is disposed between and in physical contact with the insulator I' and the bonding pad BP11. In some embodiments, the bonding dielectric layer 125 includes silicon (Si), silicon oxide ($SiO_x$, where x>0), silicon nitride ($SiN_x$, where x>0), silicon oxynitride (Si- $O_xN_y$, where x>0 and y>0) or other suitable bonding materials. The semiconductor die 100 is thus completed.

The bonding pads BP12, BP13 and BP14 are referred to "dummy bonding pads" or "floating bonding pads" in some examples because they enhance the bonding strength between dies. The bonding pad BP12 is called a "thermal bonding pad" in some examples, because the bonding pad BP12 enhances the heat dissipation efficiency between dies. In some embodiments, the bonding pads BP11 to BP14 have substantially the same size (e.g., width), as shown in FIG. 4. However, the disclosure is not limited thereto. In other embodiments, the bonding pads BP11 to BP14 may have different sizes.

Referring to FIG. 10, a semiconductor die 200 (e.g., logic die, memory die, or the like) is provided and bonded to the semiconductor die 100. In some embodiments, the semiconductor die 200 has a structure similar to that of the semiconductor die 100, so the details are not iterated herein. An integrated circuit package 1*a*-2 is thus completed.

In the integrated circuit package 1*a*-2, the thermal control performance is improved by adding thermal vias V12 and V22 around the bonding interface between two adjacent semiconductor dies 100 and 200, respectively. Specifically, each of the thermal vias V12 and V22 is thermally conductive to the die pads 118*a* and 218*a*, but electrically insulated from the device T1 and the device T2 by inserting the insulators I1' and 12' to block the electrical paths. In this embodiment, the bonding pads BP12 and BP22 are called "thermal bonding pads" although the thermal vias V12 and V22 are not in physical contact with the bonding pads BP12 and BP22. Specifically, the insulator I1'/I2' is so thin such that the heat dissipation is not affected much by the thin insulator I1'/I2' between the thermal via V12/V22 and thermal pad BP12/BP22. For example, the thickness of the insulator I1'/I2' is about 1/10-1/50 of the thickness of the thermal via V12/V22. The thermal resistance of SoIC bond is significantly reduced by adding the thermal vias and/or thermal bonding pads of the disclosure.

The above embodiments in which the thermal vias and/or thermal bonding pads are provided in both of the facing semiconductor dies are provided for illustration purposes, and are not to be construed as limiting the present disclosure. In some embodiments, the thermal vias and/or thermal bonding pads are provided in one of the facing semiconductor dies. Besides, the thermal vias may have other configurations as long as they provide thermal paths around the bonding interface of the dies.

FIG. 11 to FIG. 20 are cross-sectional views schematically illustrating integrated circuit packages in accordance with some embodiments of the present disclosure. The integrated circuit packages 1*a*-3 to 1*a*-12 of FIG. 11 to FIG. 20 are similar to the integrated circuit packages 1*a*-1 to 1*a*-2 of FIG. 6 and FIG. 10, wherein like reference numerals refer to like elements. The materials, configurations and forming methods of elements of FIG. 11 to FIG. 20 may refer to those of similar elements described in the previous embodiments. The integrated circuit packages of FIG. 11 to FIG. 20 may be beneficial for product flexibility.

Figure 11:
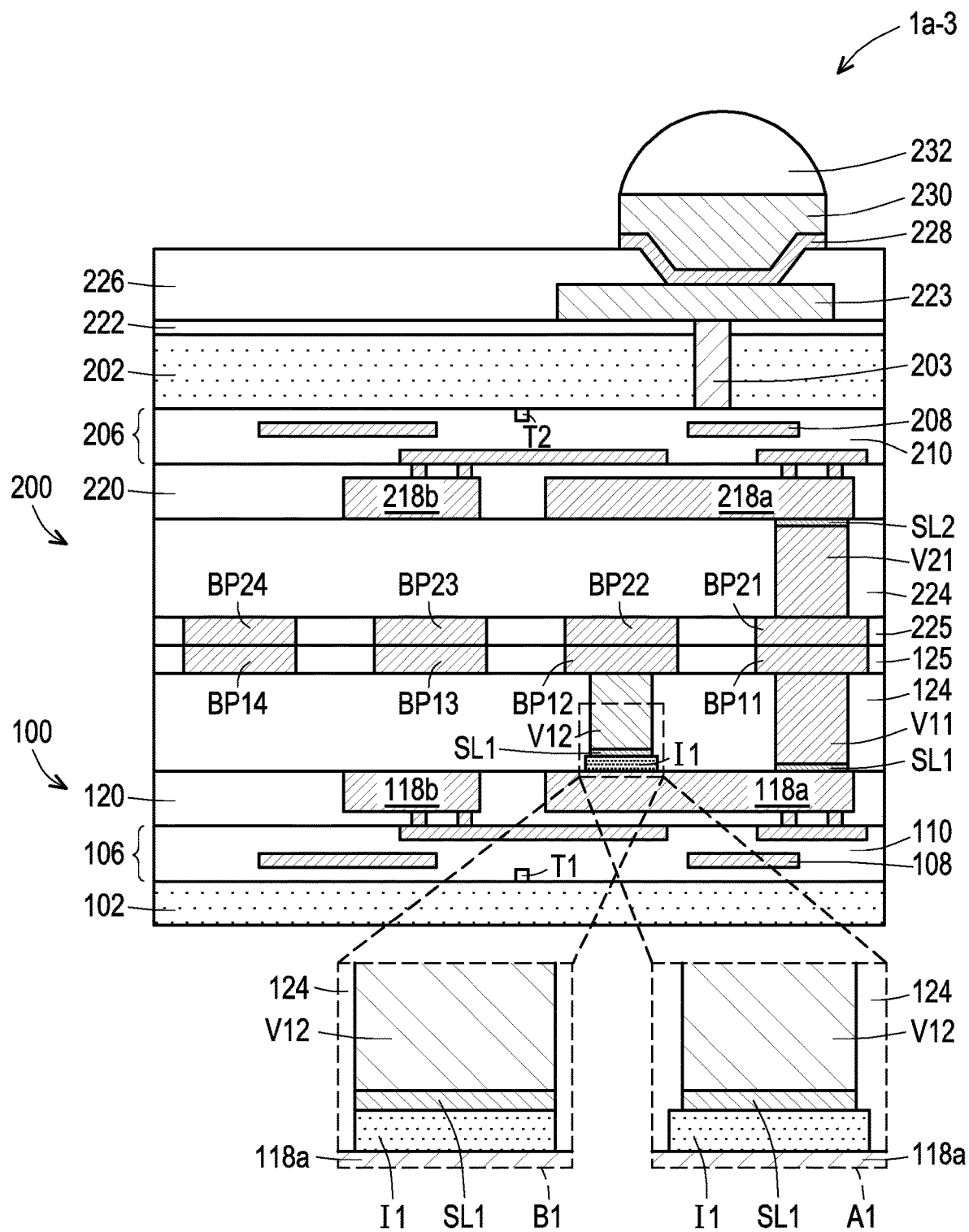

The integrated circuit package 1*a*-3 of FIG. 11 is similar to the integrated circuit packages 1*a*-1 of FIG. 6, and the difference between them lies in that, in the integrated circuit package 1*a*-3 of FIG. 11, the thermal via V22 and the insulator 12 are omitted from the semiconductor die 200 facing the ball array.

Figure 12:
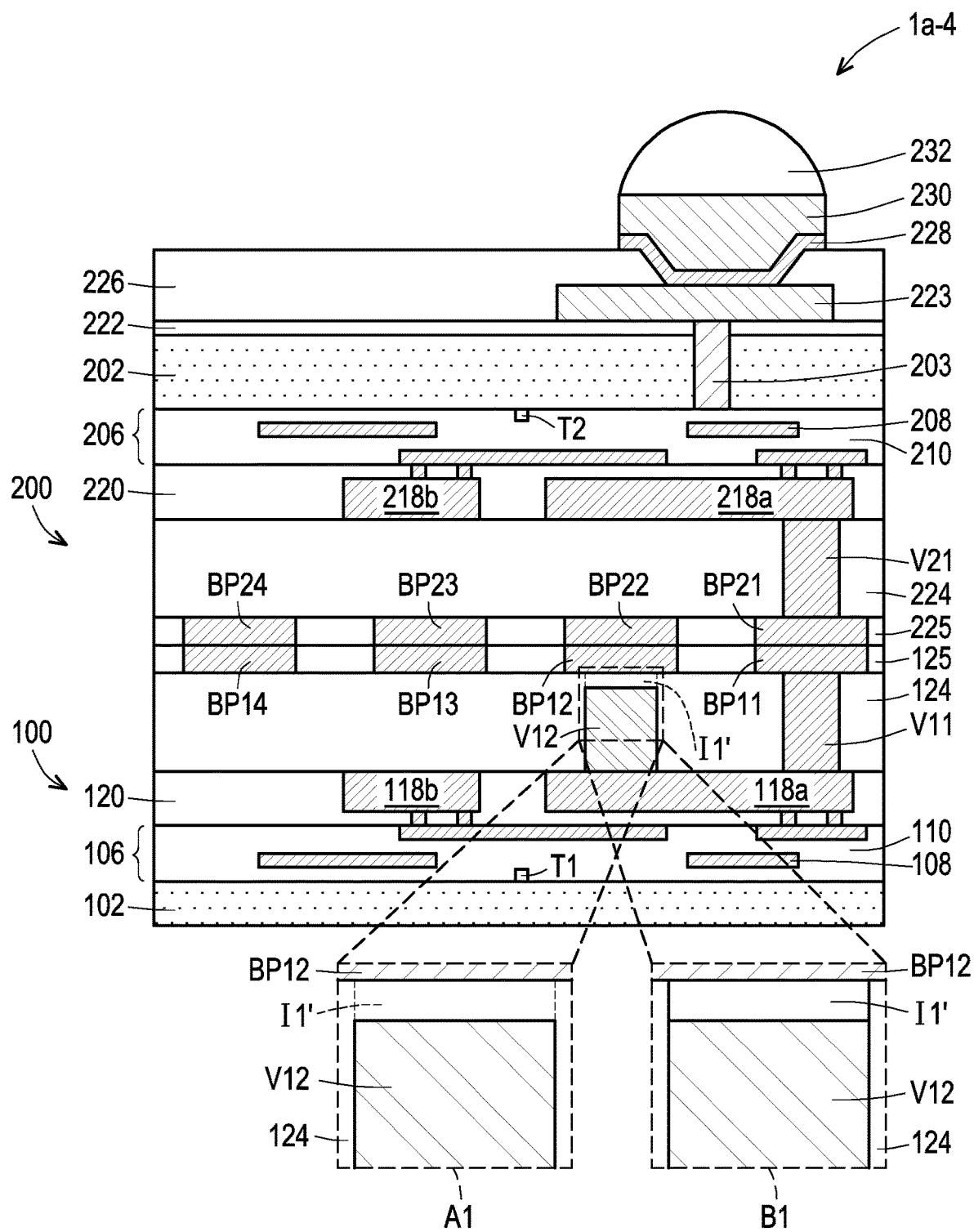

The integrated circuit package 1*a*-4 of FIG. 12 is similar to the integrated circuit package 1*a*-2 of FIG. 10, and the difference between them lies in that, in the integrated circuit package 1*a*-4 of FIG. 12, the thermal via V22 and the insulator 12' are omitted from the semiconductor die 200 facing the ball array.

Figure 13:
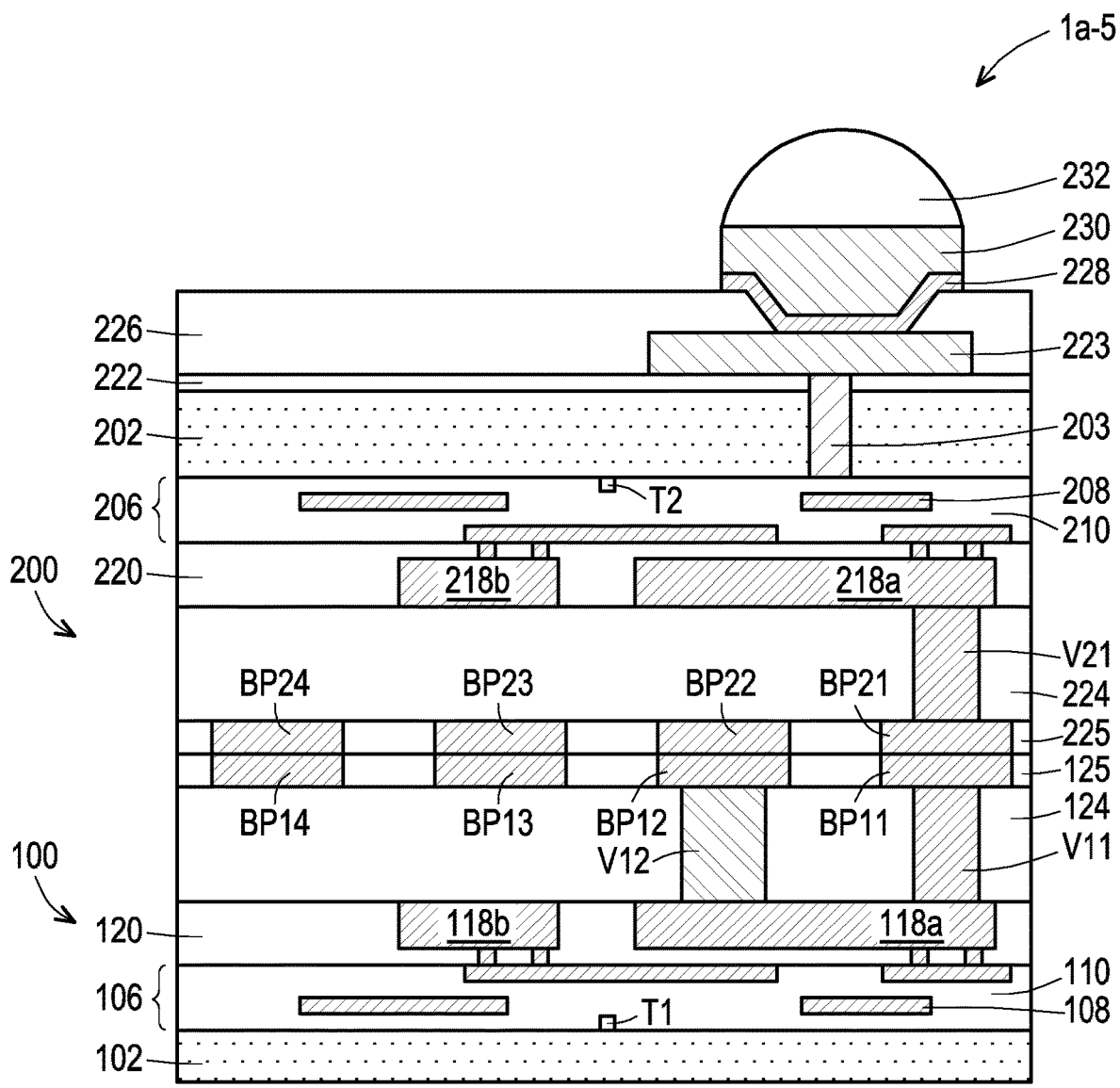

The integrated circuit packages 1*a*-5 of FIG. 13 is similar to the integrated circuit package 1*a*-1 of FIG. 6, and the difference between them lies in that, in the integrated circuit package 1*a*-5 of FIG. 13, the thermal via V22 and the insulator 12 are omitted from the semiconductor die 200 facing the ball array, and the insulator I1 is omitted from the semiconductor die 100 facing away from the ball array. In this embodiment, the thermal via V12 is in physical contact with the bonding pad BP12 and the die pad 118*a* but electrically insulated from the device T2.

Figure 14:
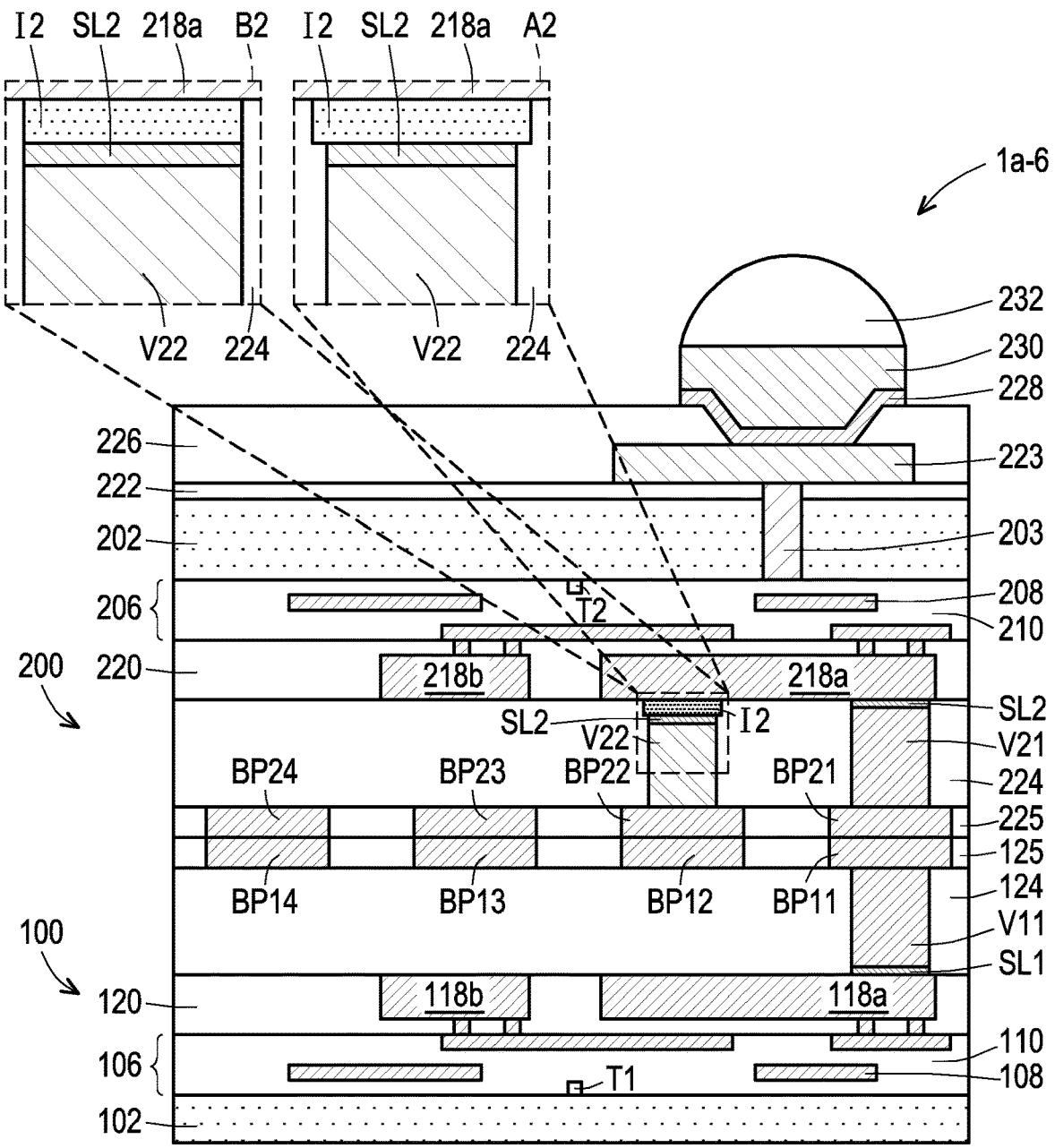

The integrated circuit package 1*a*-6 of FIG. 14 is similar to the integrated circuit package 1*a*-1 of FIG. 6, and the difference between them lies in that, in the integrated circuit package 1*a*-6 of FIG. 14, the thermal via V12 and the insulator I1 are omitted from the semiconductor die 100 facing away from the ball array.

Figure 15:
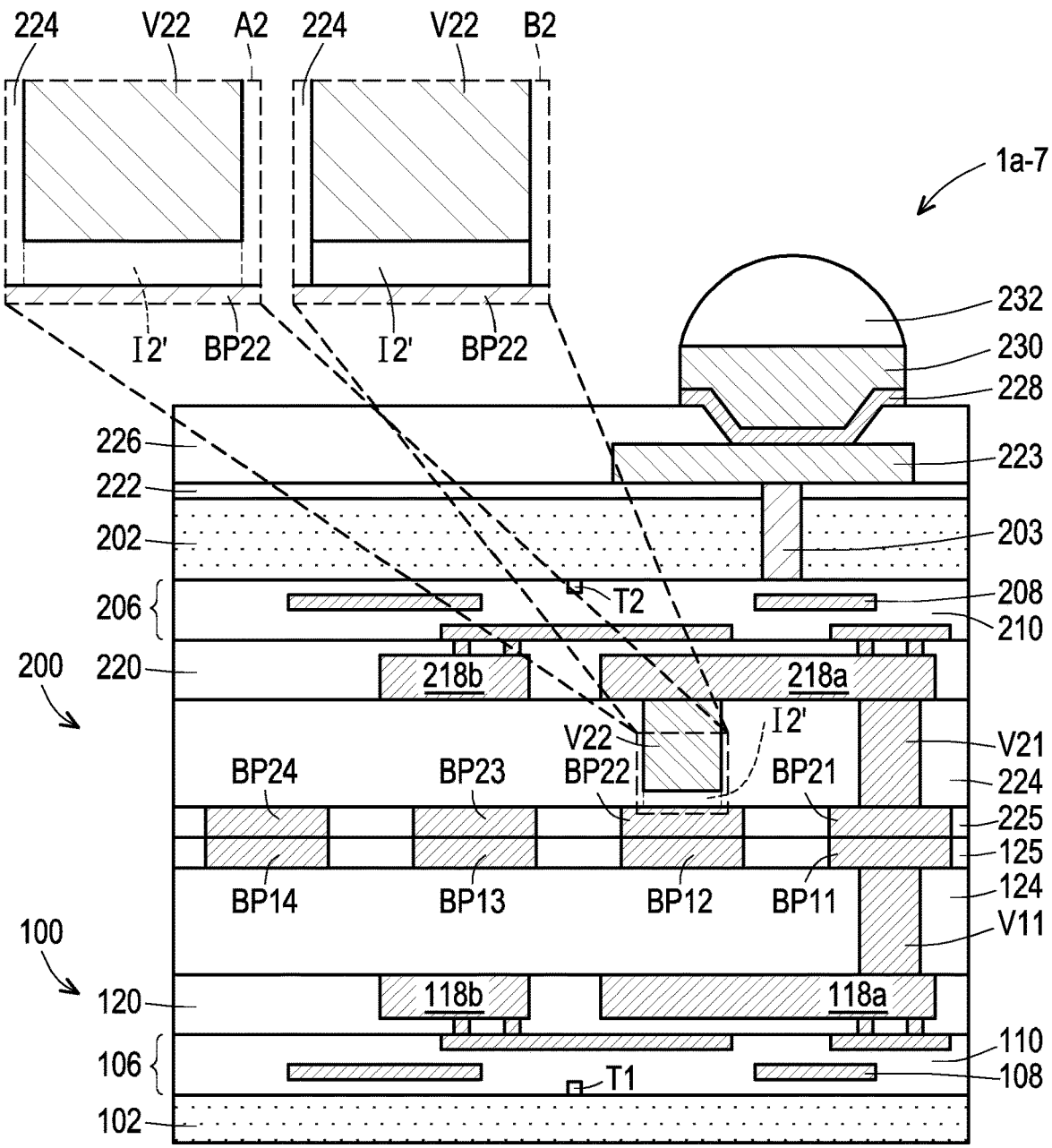

The integrated circuit package 1*a*-7 of FIG. 15 is similar to the integrated circuit package 1*a*-2 of FIG. 10, and the difference between them lies in that, in the integrated circuit package 1*a*-7 of FIG. 15, the thermal via V12 and the insulator I1' are omitted from the semiconductor die 100 facing away from the ball array.

Figure 16:
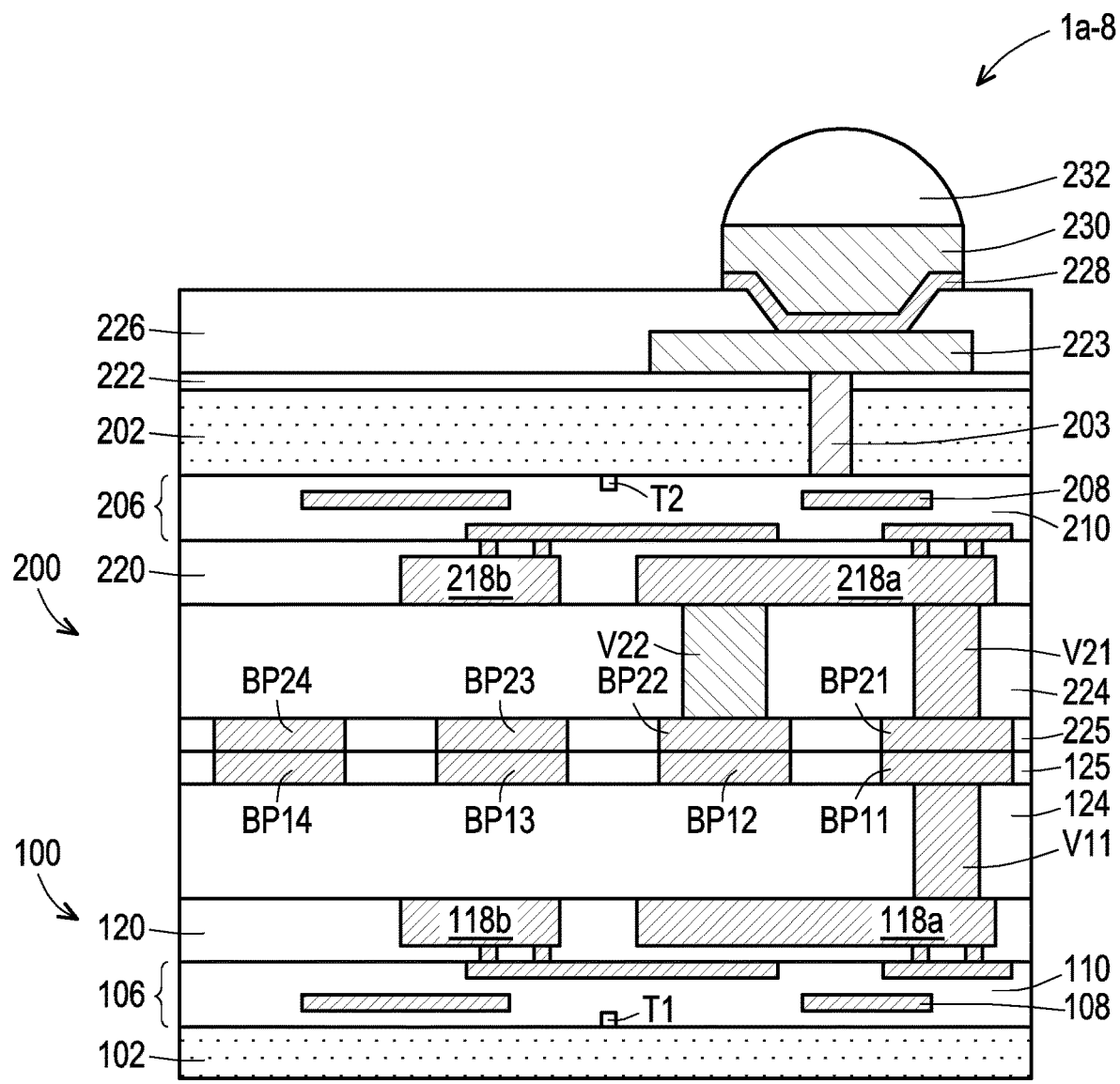

The integrated circuit packages 1*a*-8 of FIG. 16 is similar to the integrated circuit package 1*a*-1 of FIG. 6, and the difference between them lies in that, in the integrated circuit package 1*a*-8 of FIG. 16, the thermal via V12 and the insulator I1 are omitted from the semiconductor die 100 facing away from the ball array, and the insulator 12 is omitted from the semiconductor die 200 facing the ball array. In this embodiment, the thermal via V22 is in physical contact with the bonding pad BP22 and the die pad 218*a* but electrically insulated from the device T1.

Figure 17:
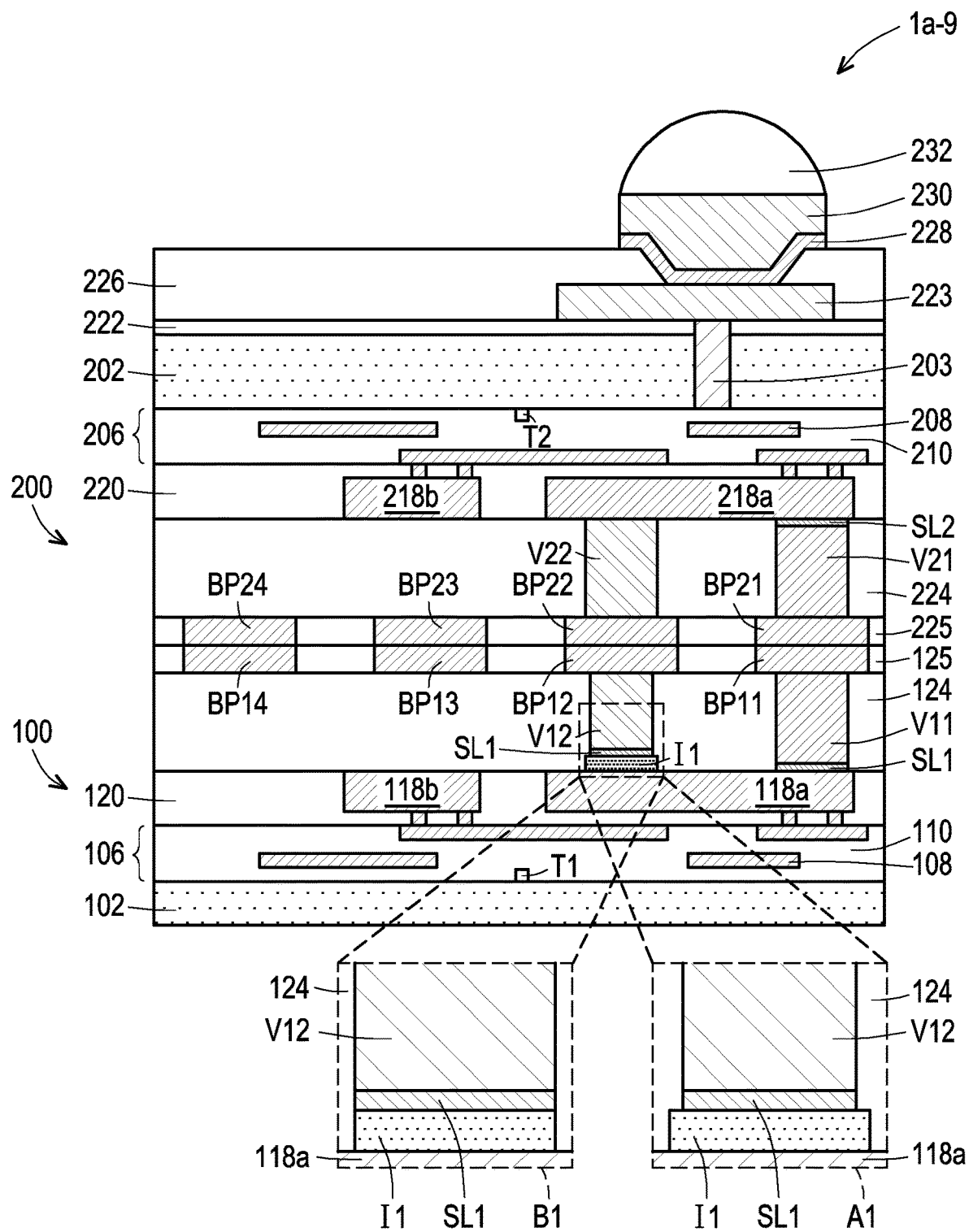

The integrated circuit package 1*a*-9 of FIG. 17 is similar to the integrated circuit packages 1*a*-1 of FIG. 6, and the difference between them lies in that, in the integrated circuit package 1*a*-9 of FIG. 17, the insulator 12 is omitted from the semiconductor die 200 facing the ball array. In this embodiment, the thermal via V22 is in physical contact with the bonding pad BP22 and the die pad 218*a* but electrically insulated from the device T1.

Figure 18:
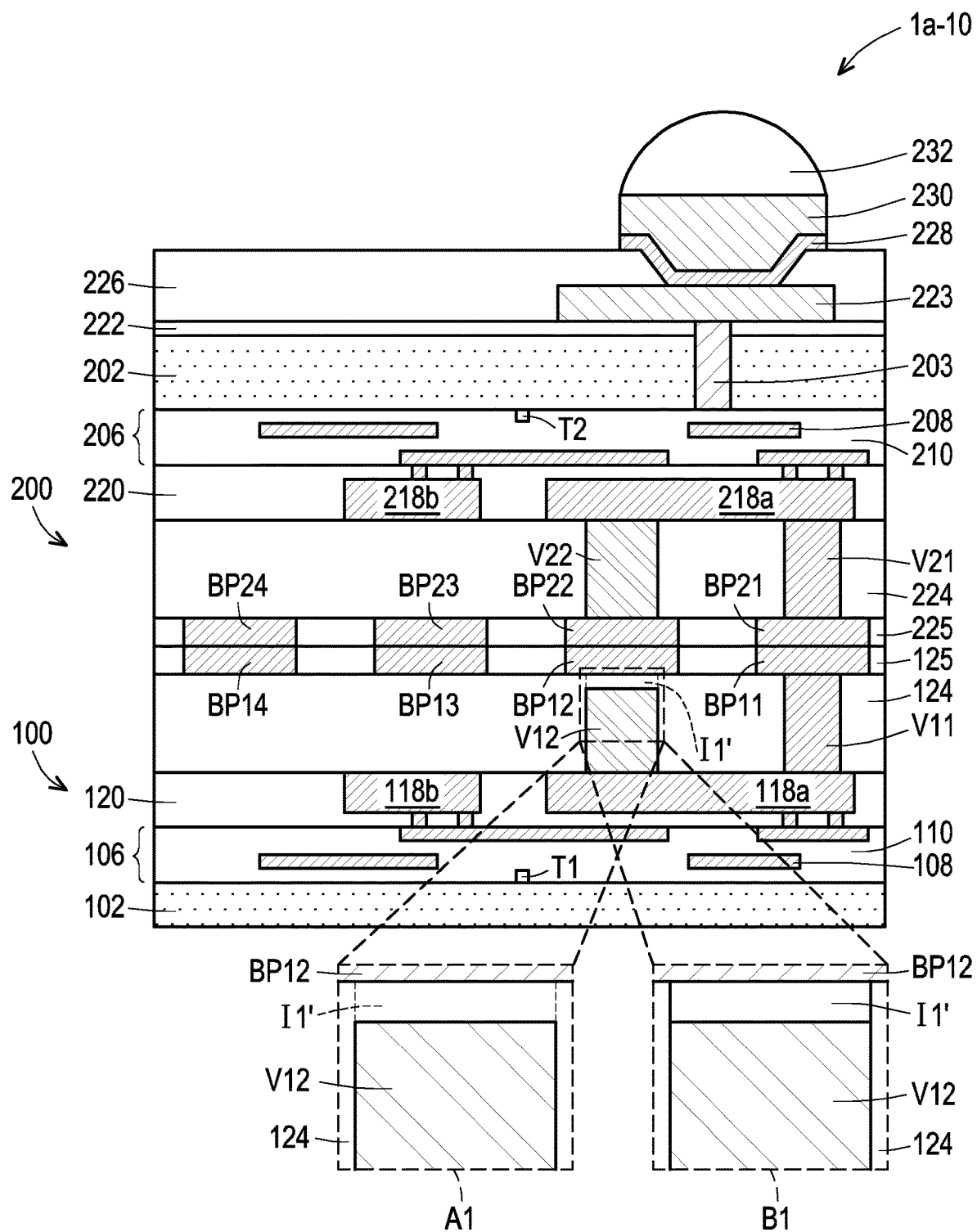

The integrated circuit package 1*a*-10 of FIG. 18 is similar to the integrated circuit packages 1*a*-2 of FIG. 10, and the difference between them lies in that, in the integrated circuit package 1*a*-10 of FIG. 18, the insulator 12' is omitted from the semiconductor die 200 facing the ball array. In this embodiment, the thermal via V22 is in physical contact with the bonding pad BP22 and the die pad 218*a* but electrically insulated from the device T1.

Figure 19:
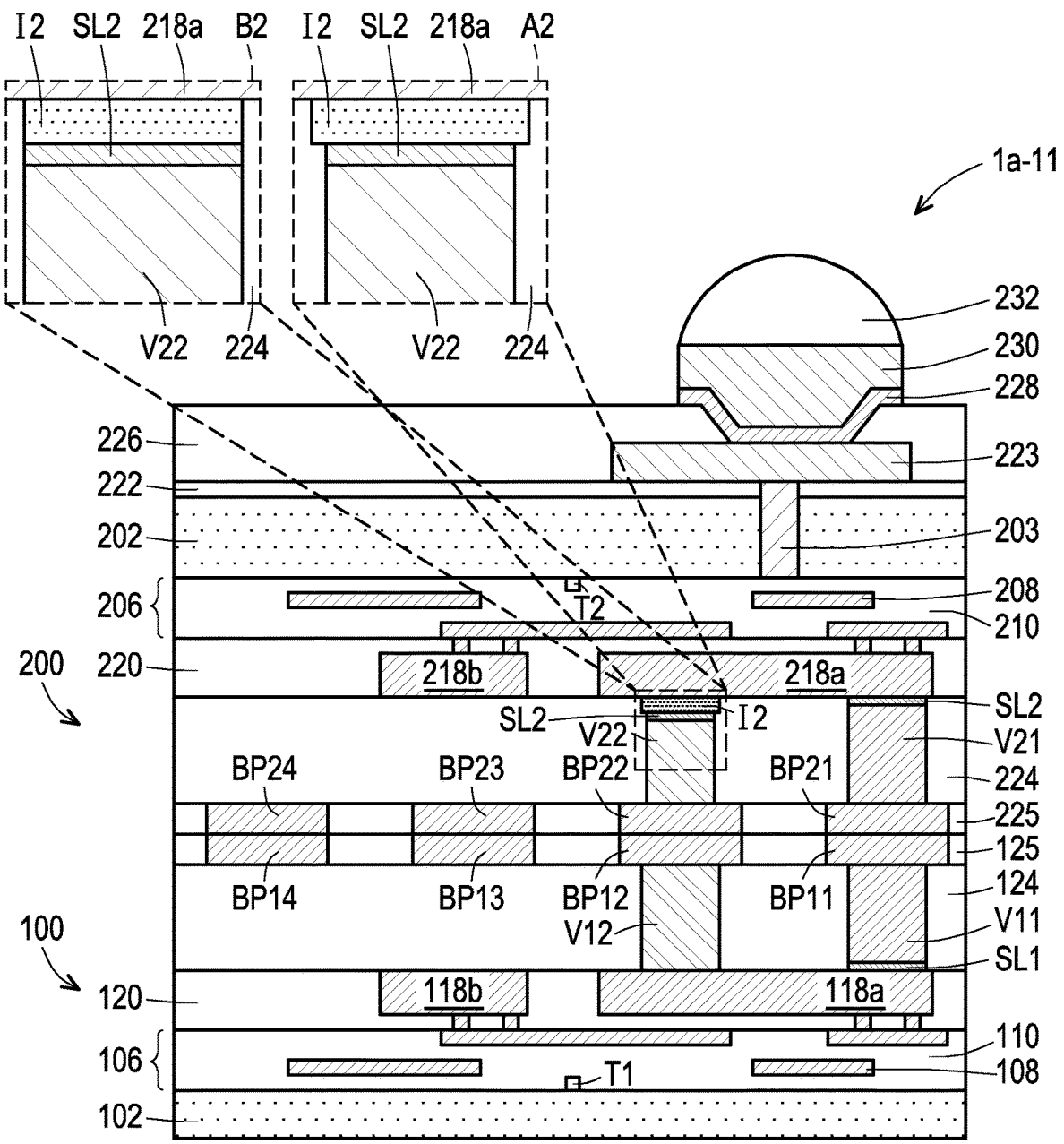

The integrated circuit package 1*a*-11 of FIG. 19 is similar to the integrated circuit packages 1*a*-1 of FIG. 6, and the difference between them lies in that, in the integrated circuit package 1*a*-9 of FIG. 17, the insulator I1 is omitted from the semiconductor die 100 facing away from the ball array. In this embodiment, the thermal via V12 is in physical contact with the bonding pad BP12 and the die pad 118*a* but electrically insulated from the device T2.

Figure 20:
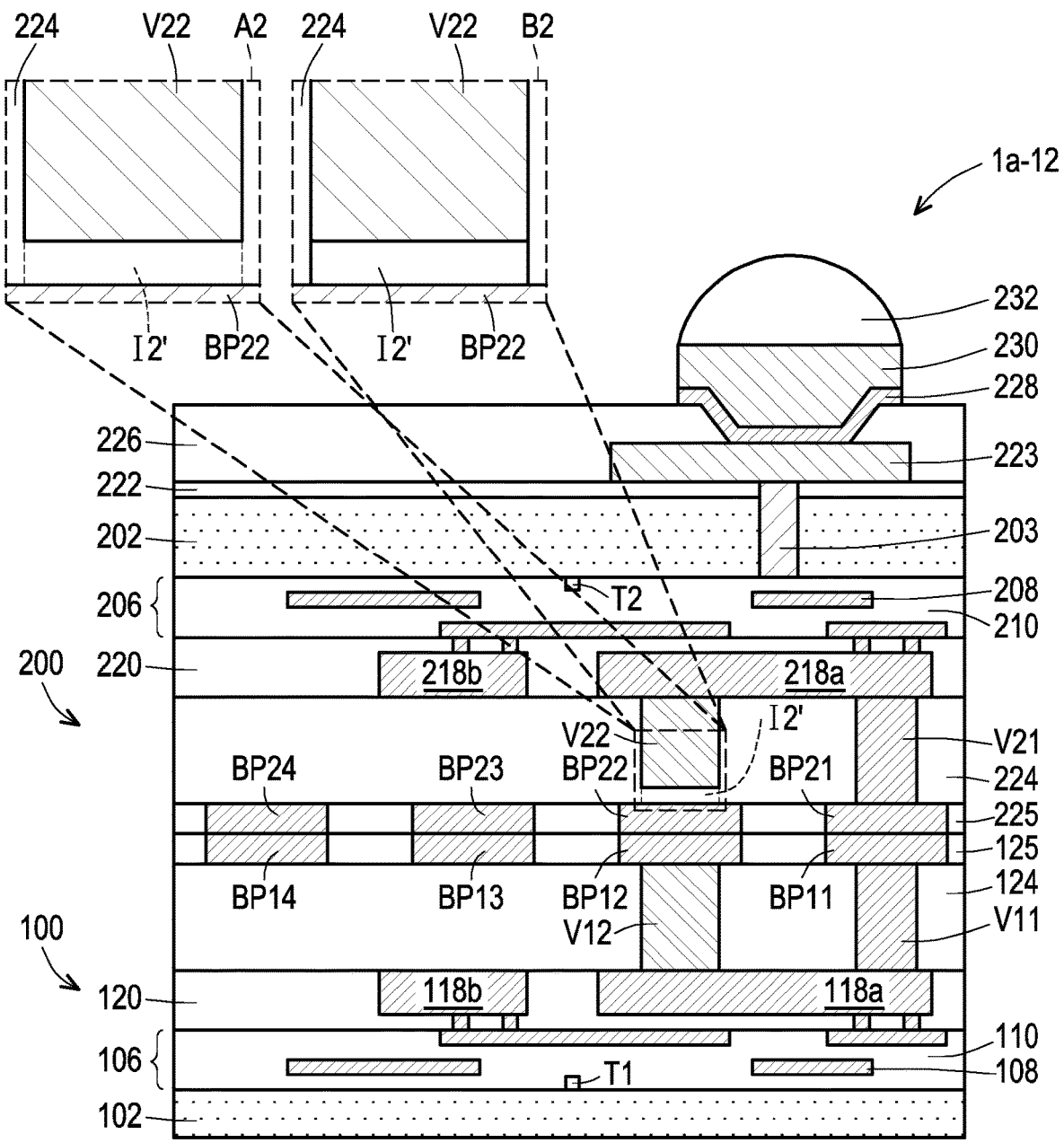
Figure 21:
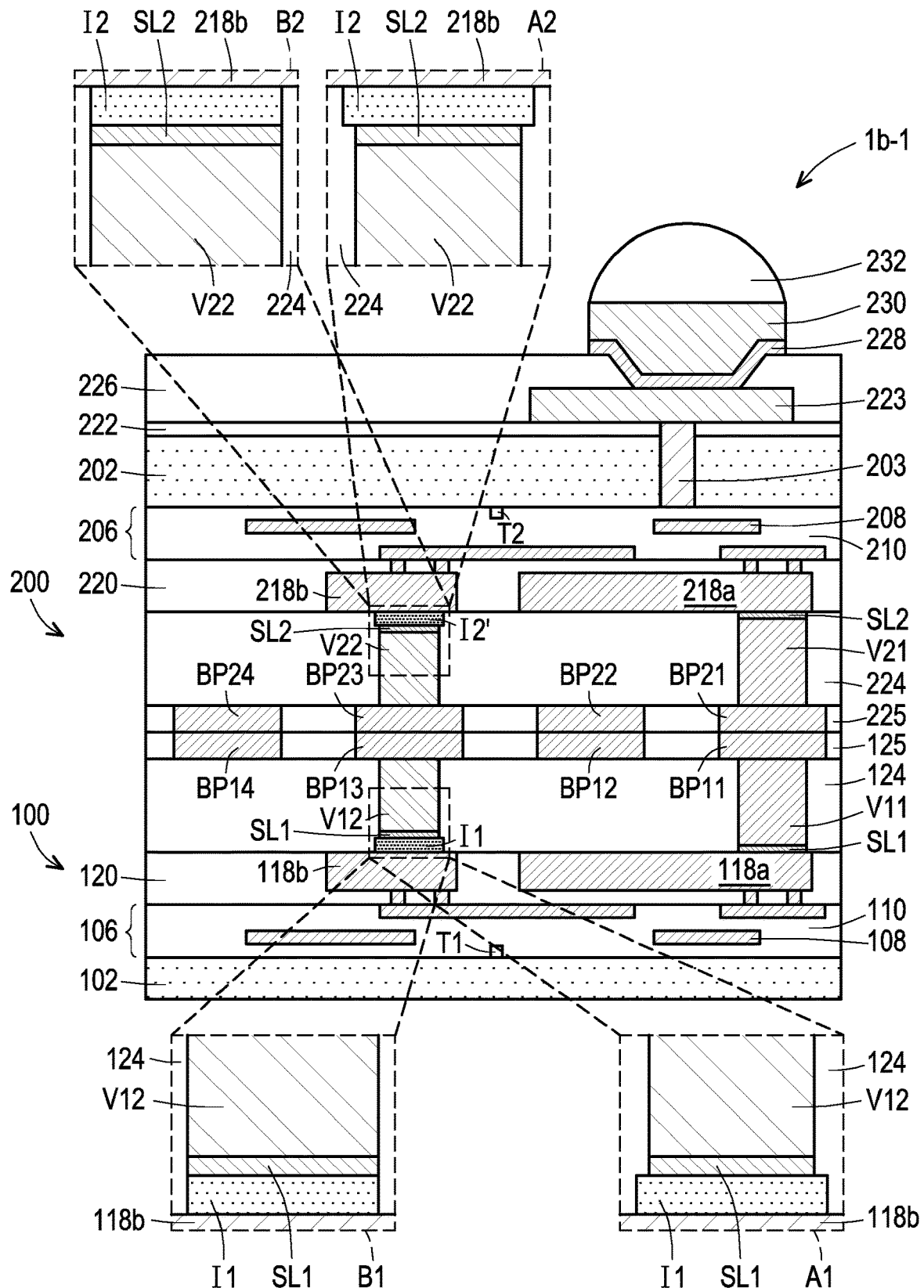
Figure 22:
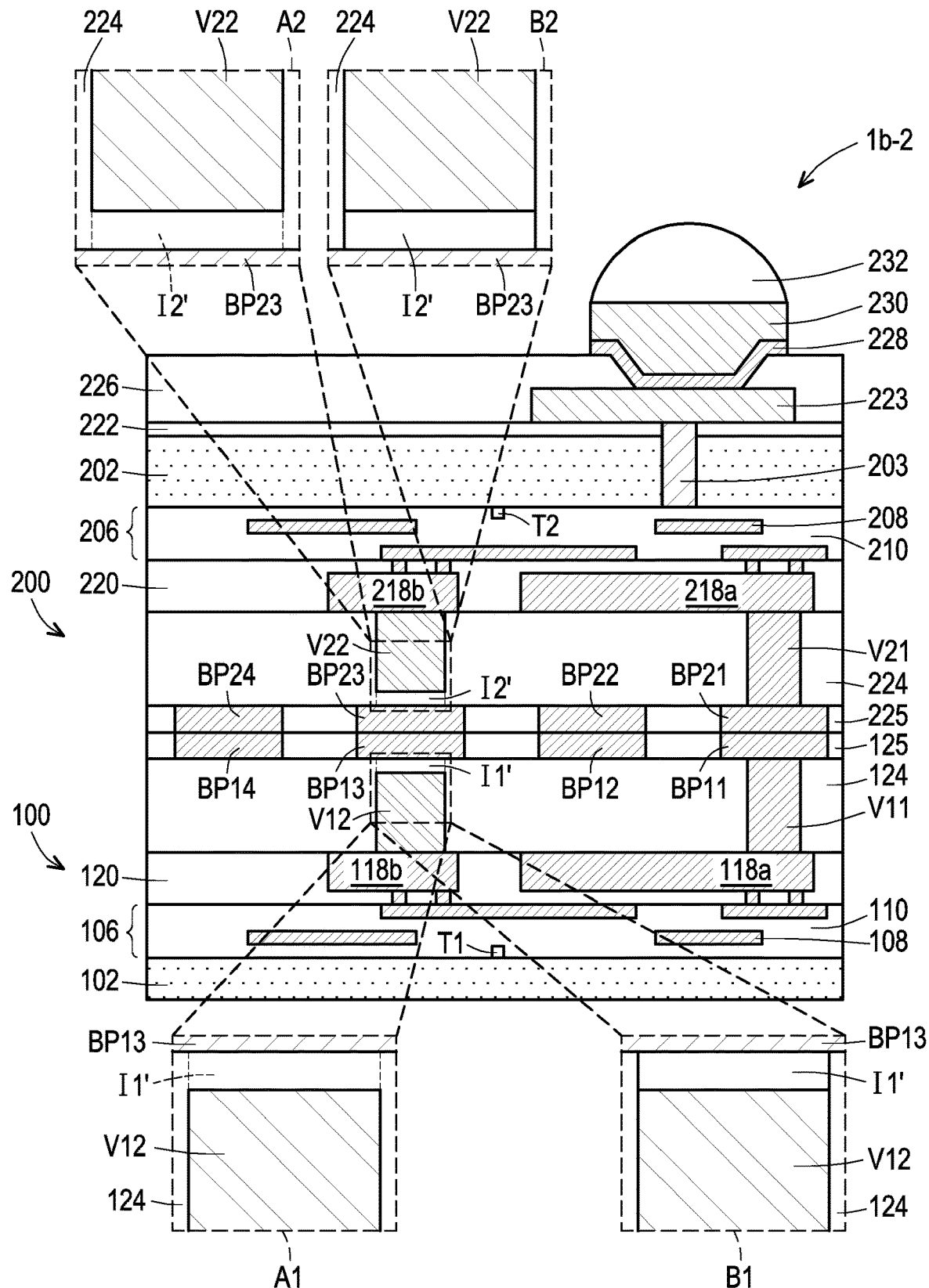
Figure 23:
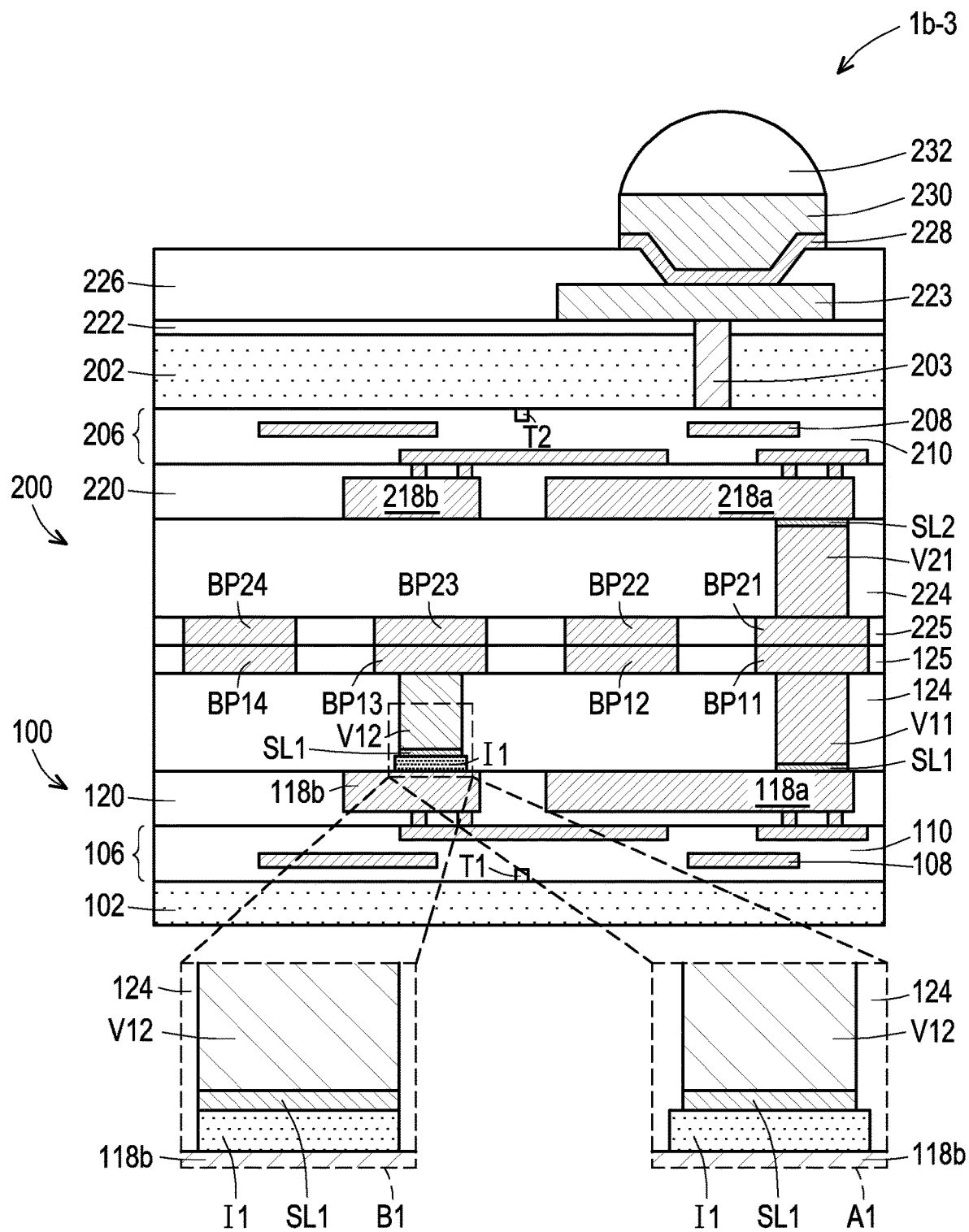
Figure 24:
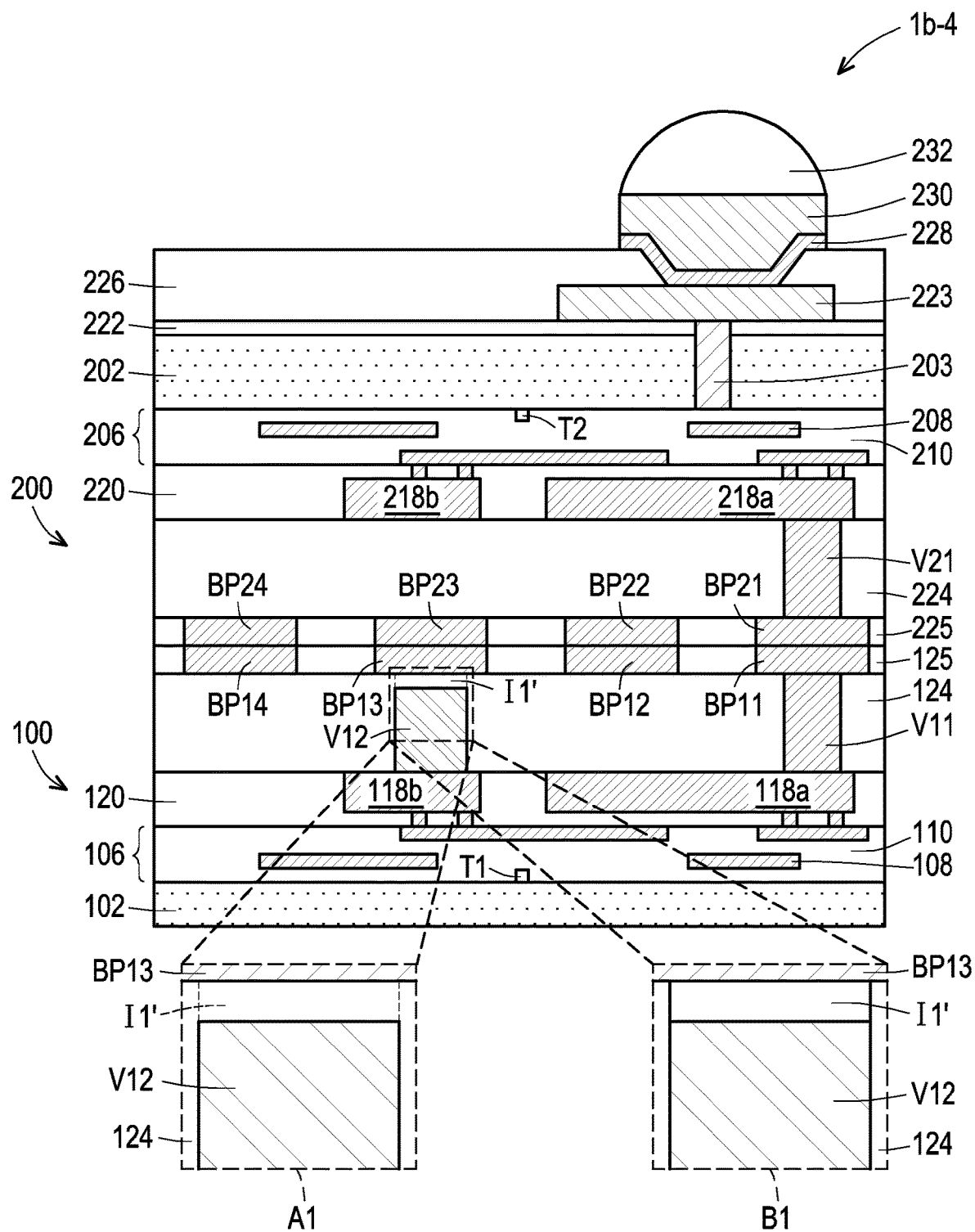
Figure 25:
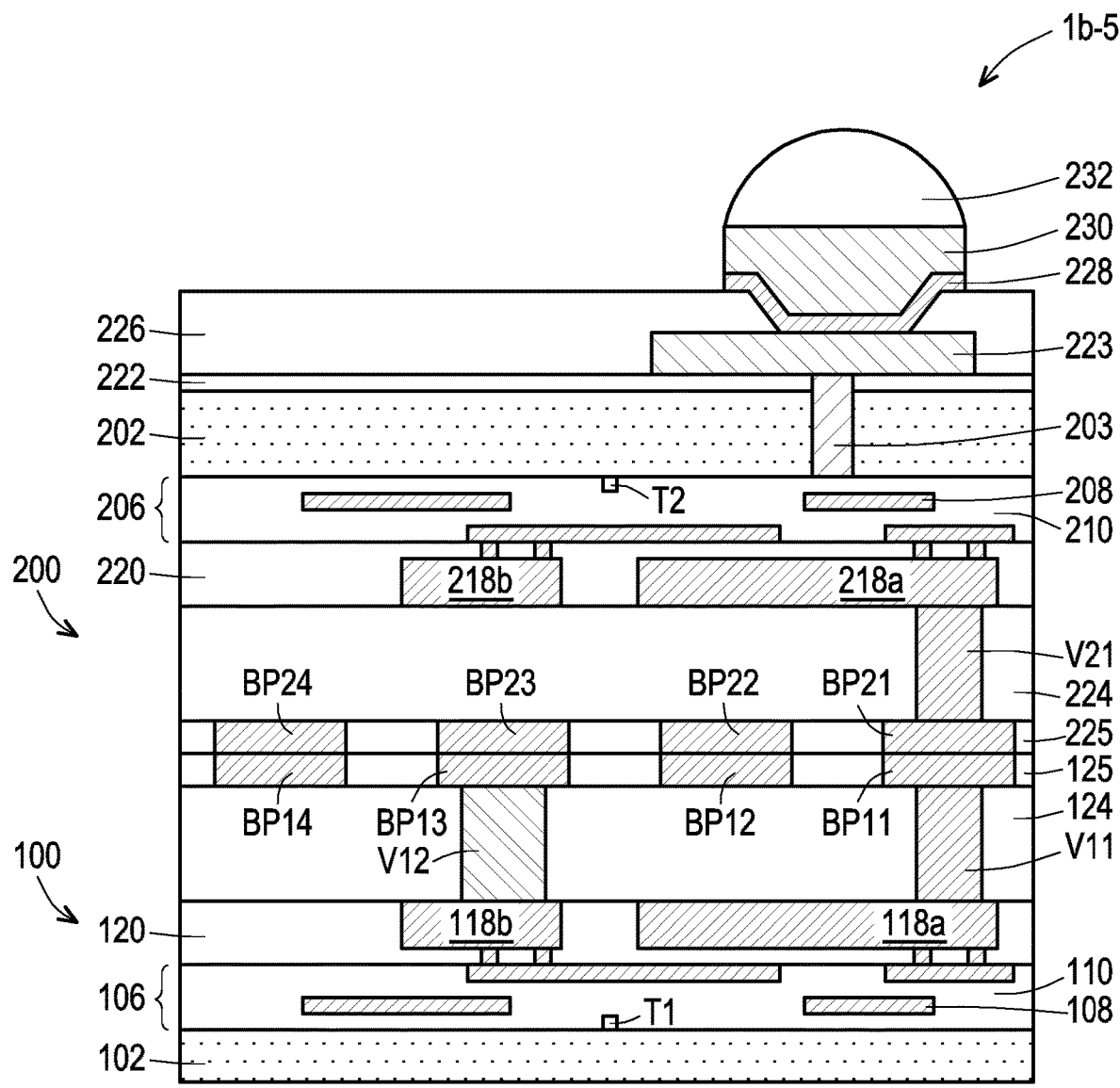
Figure 26:
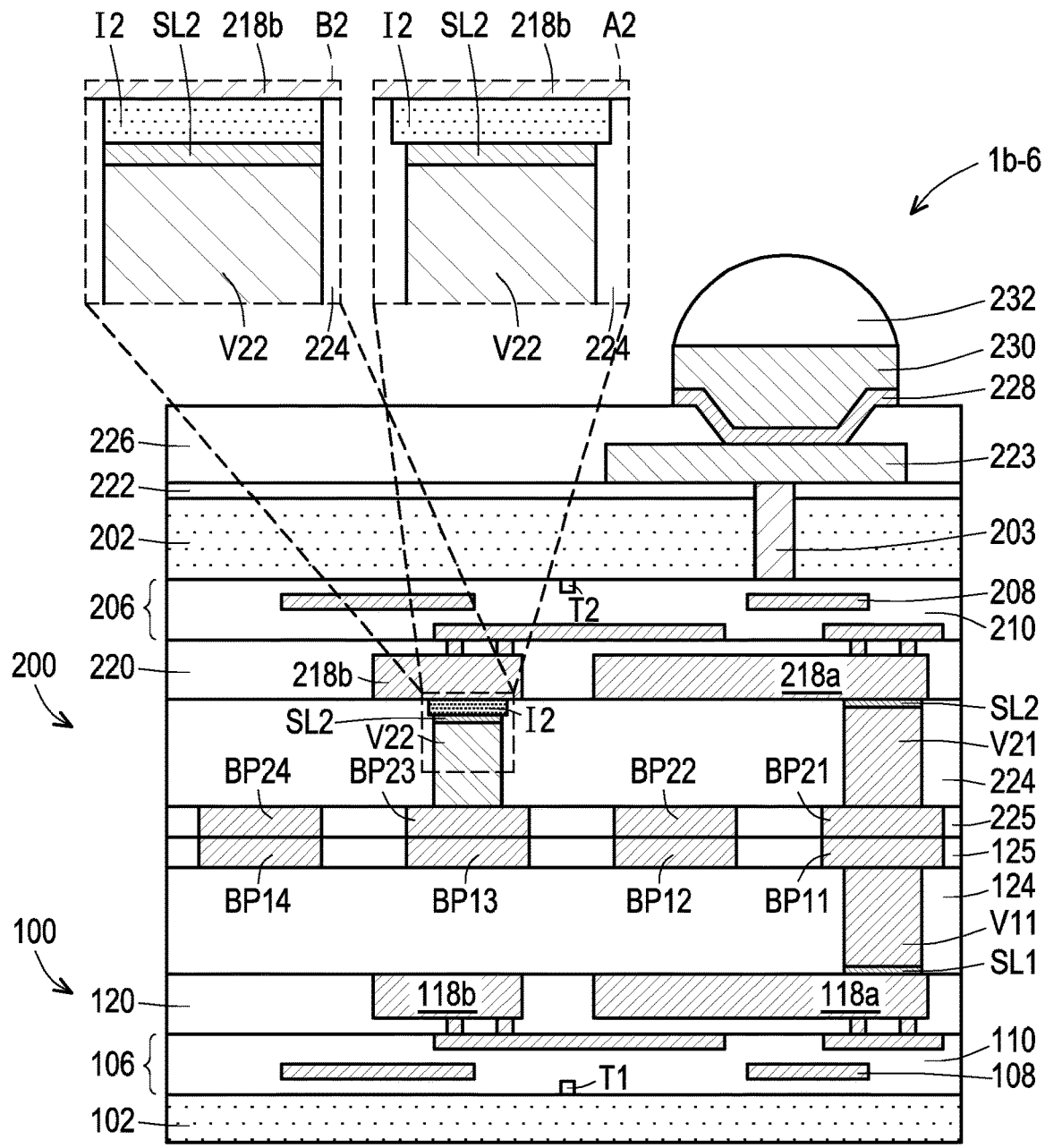
Figure 27:
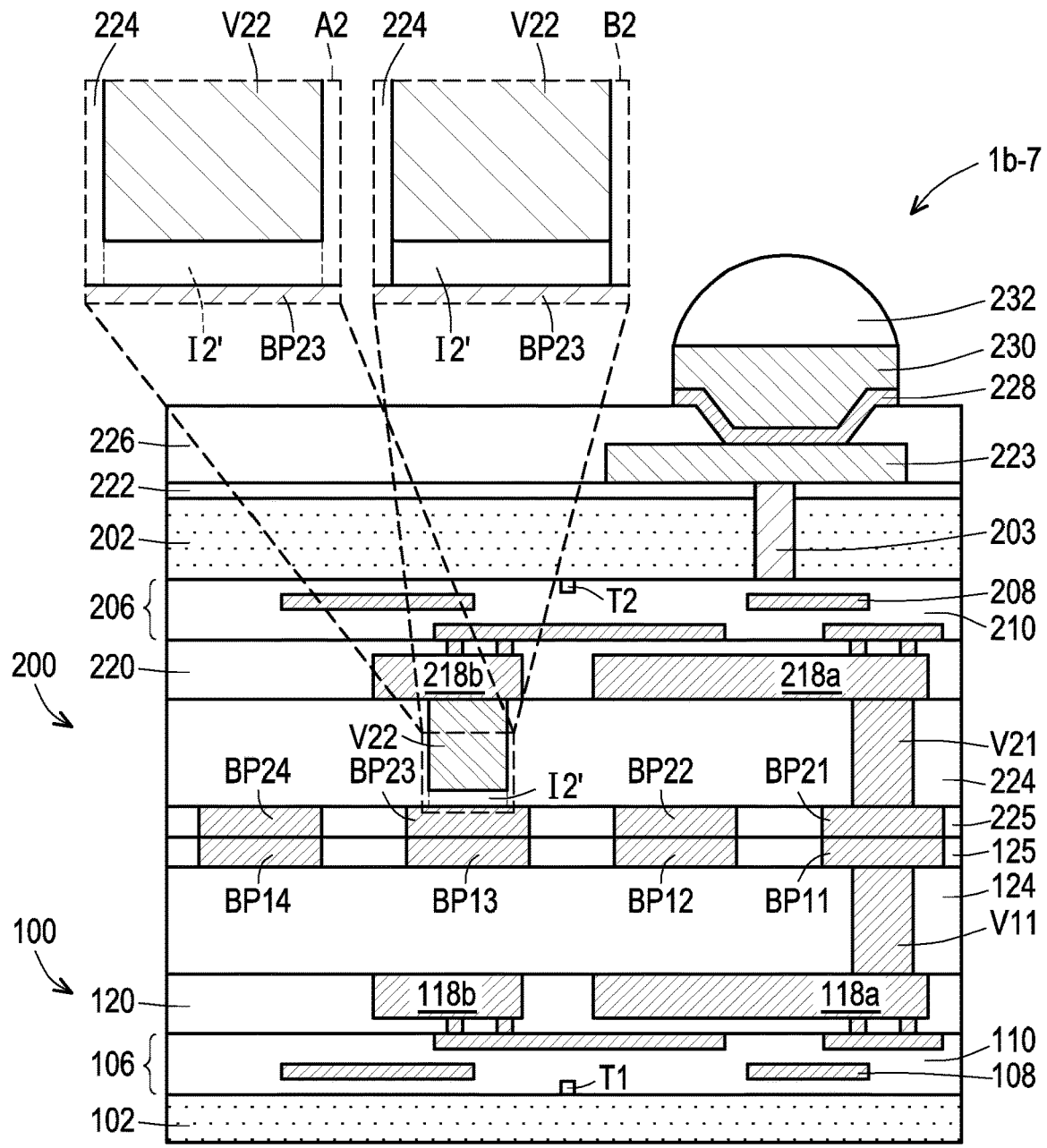
Figure 28:
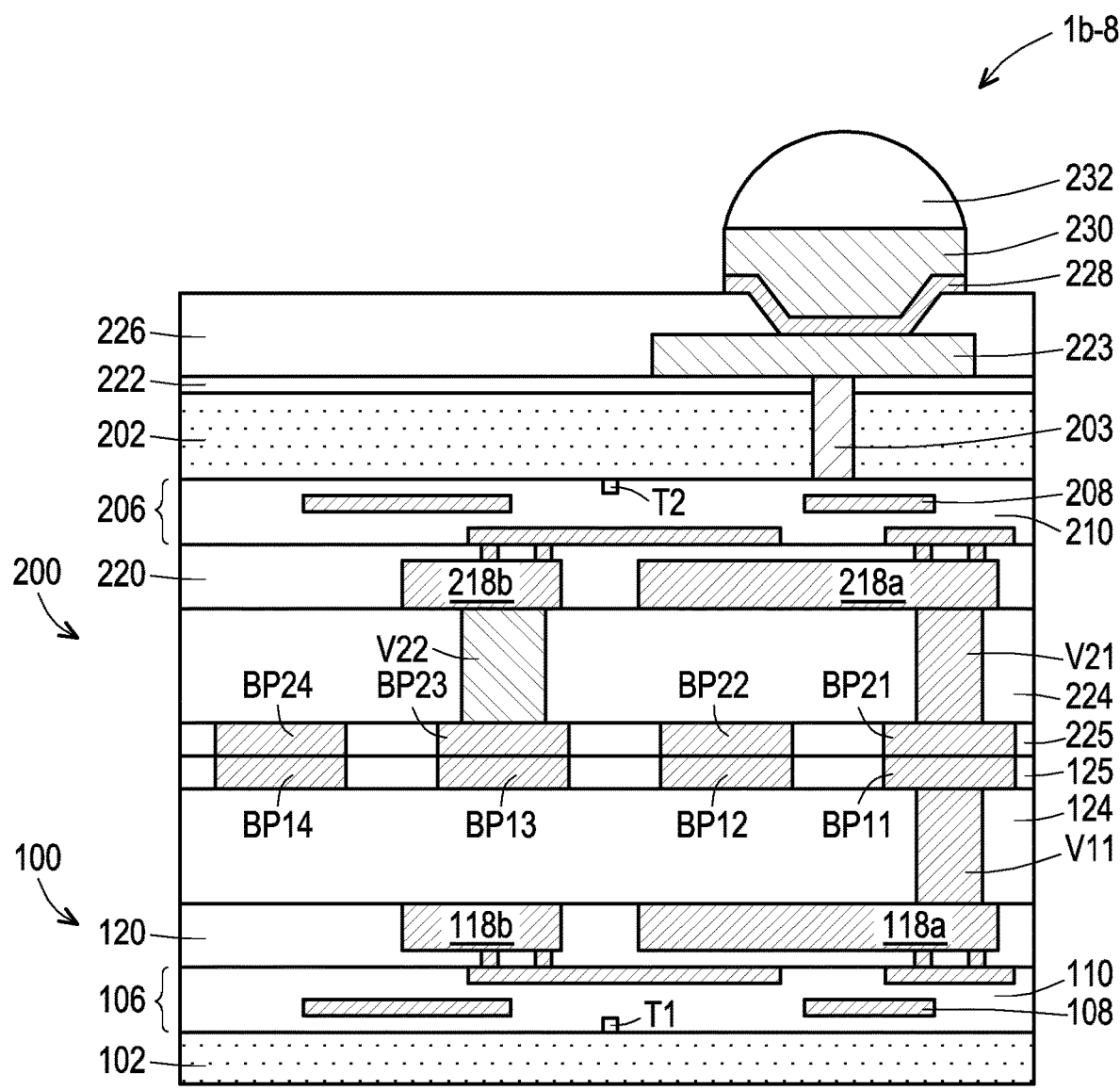
Figure 29:
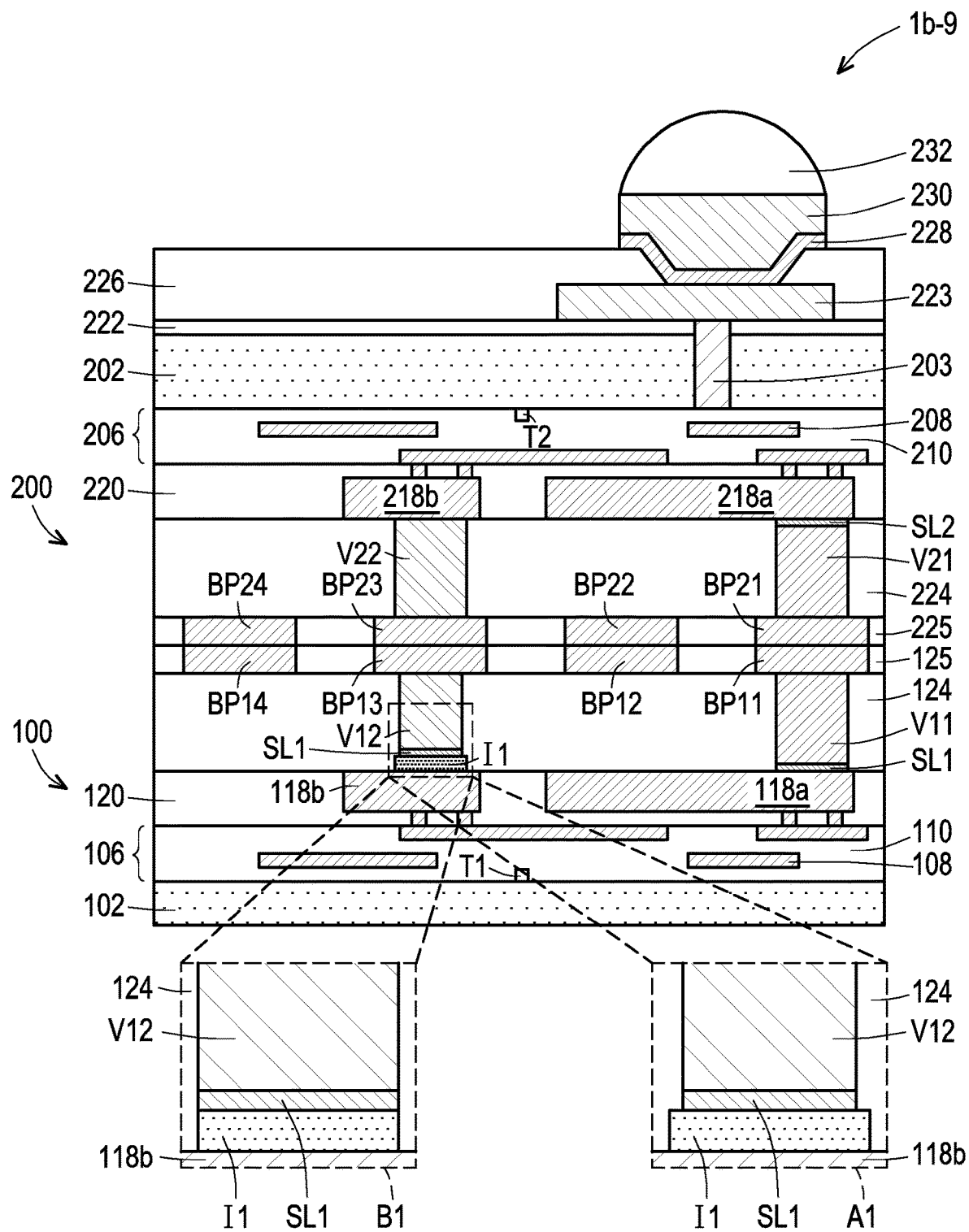
Figure 30:
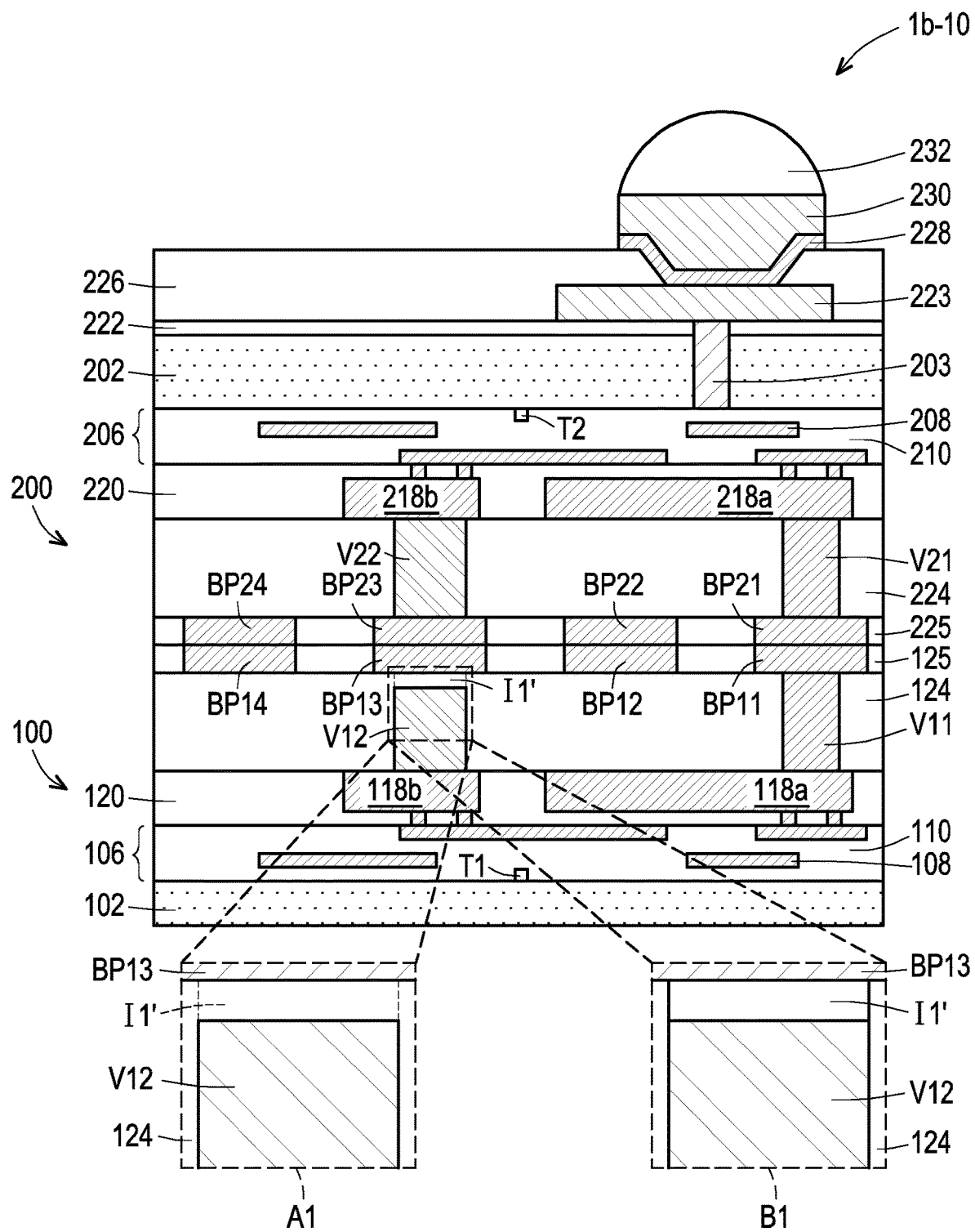
Figure 31:
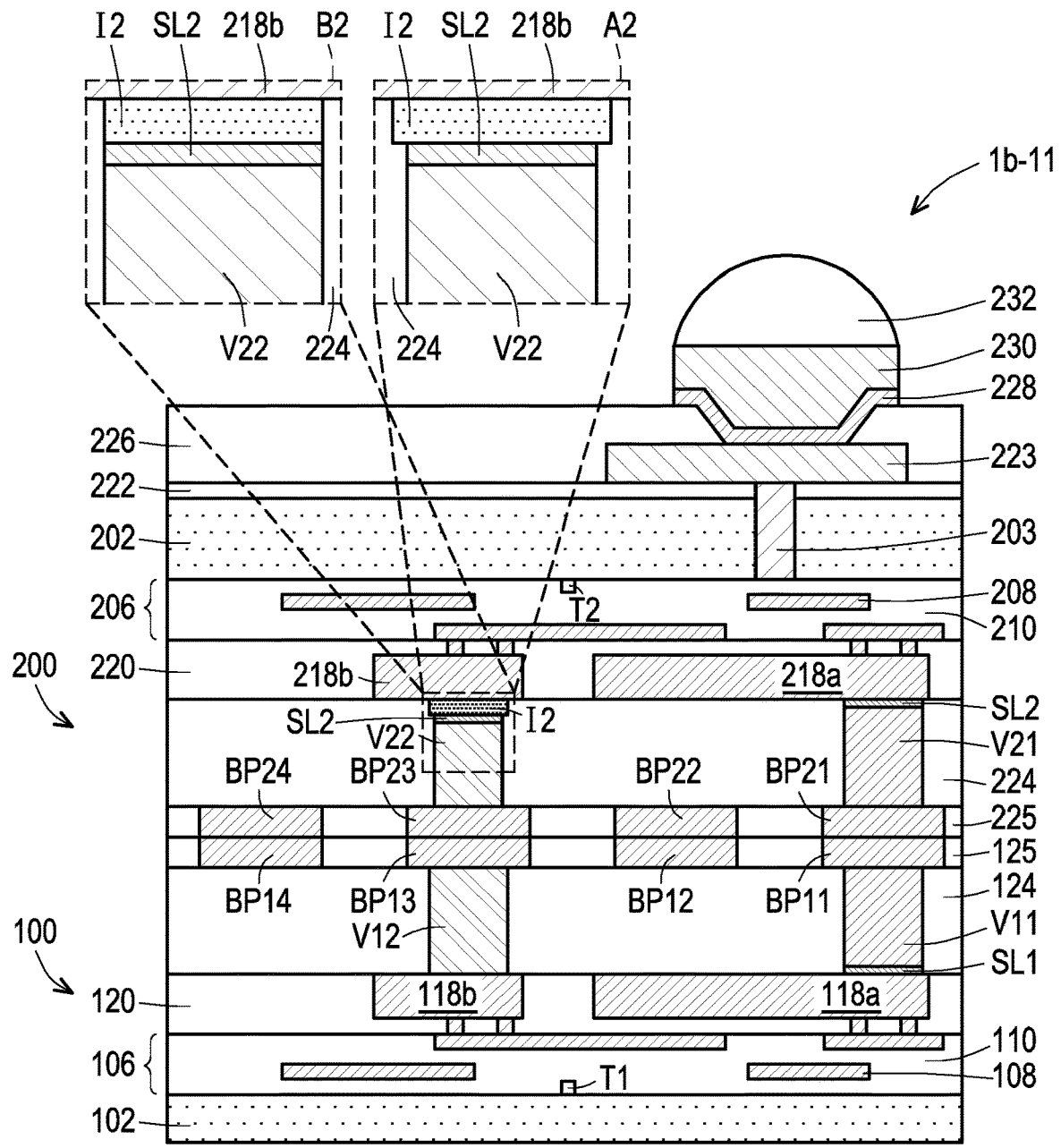
Figure 32:
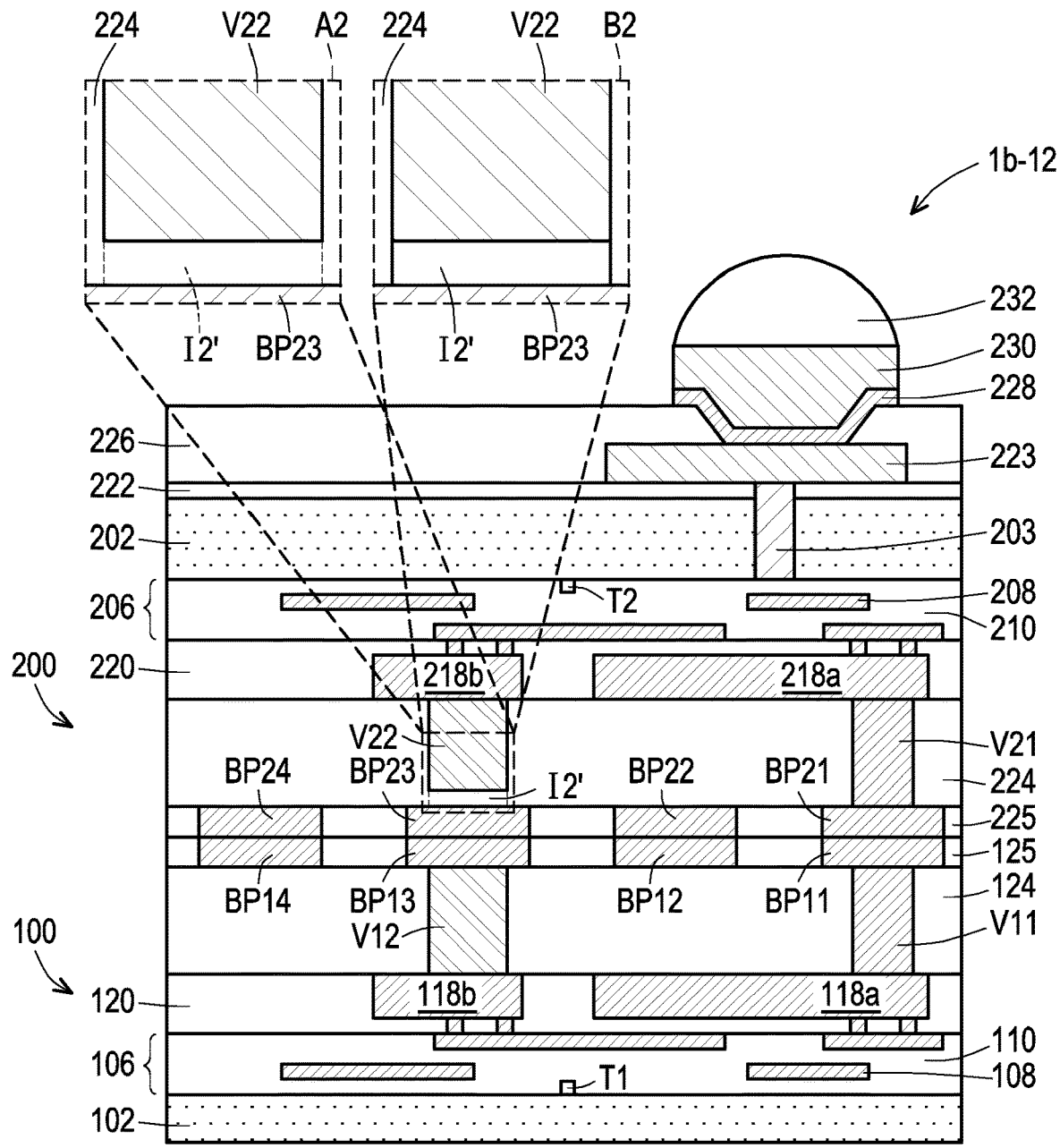
Figure 33:
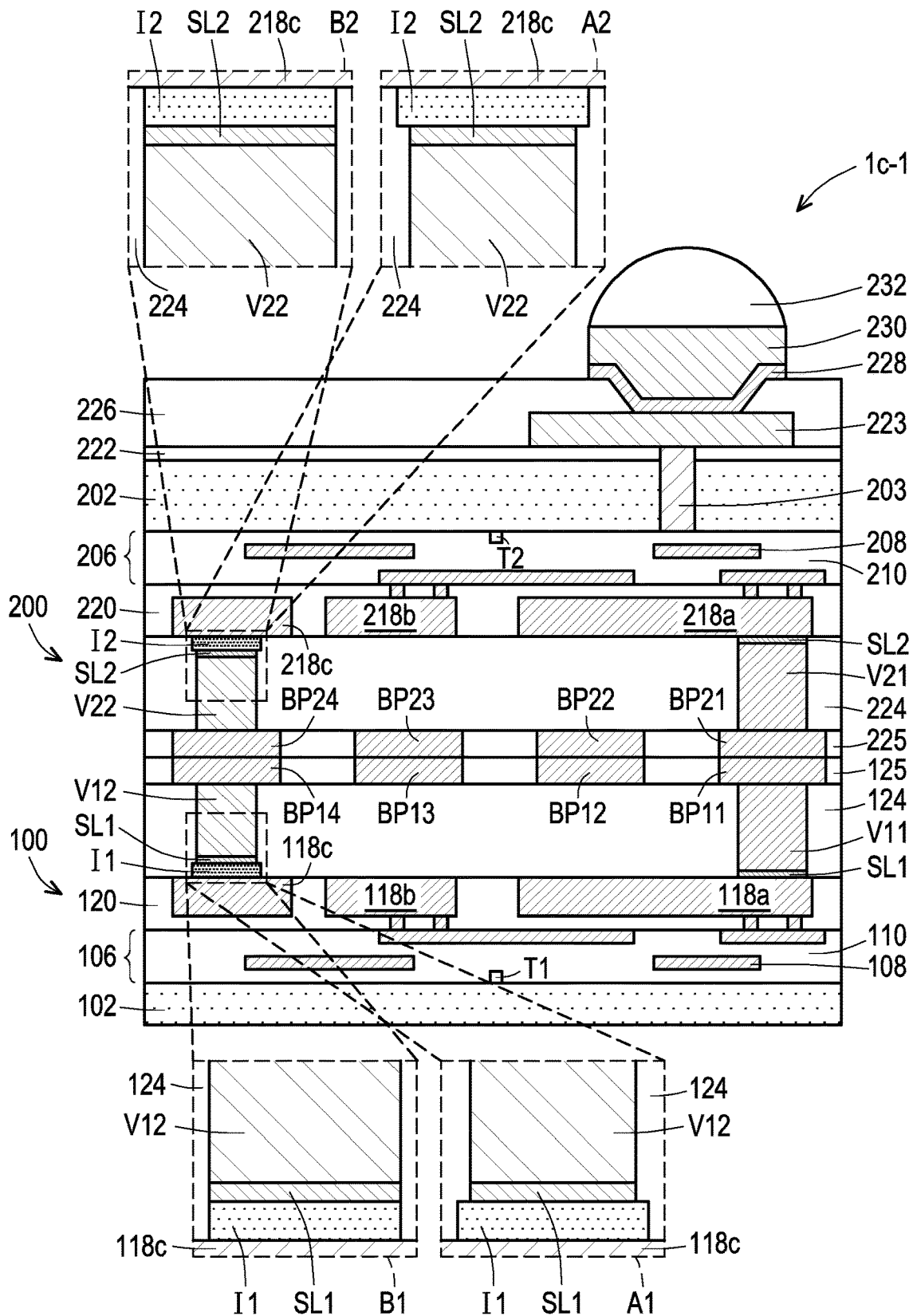
Figure 34:
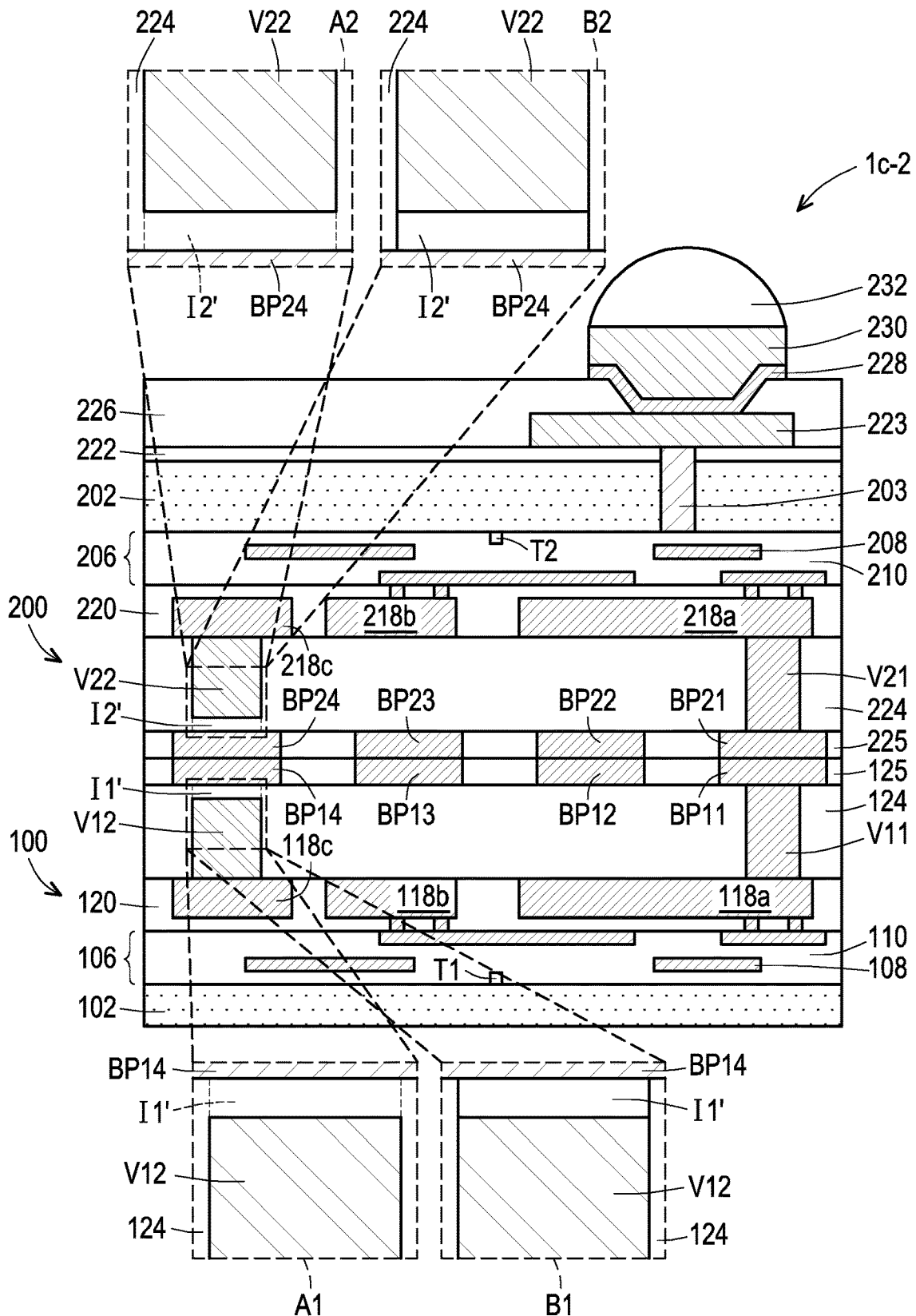
Figure 35:
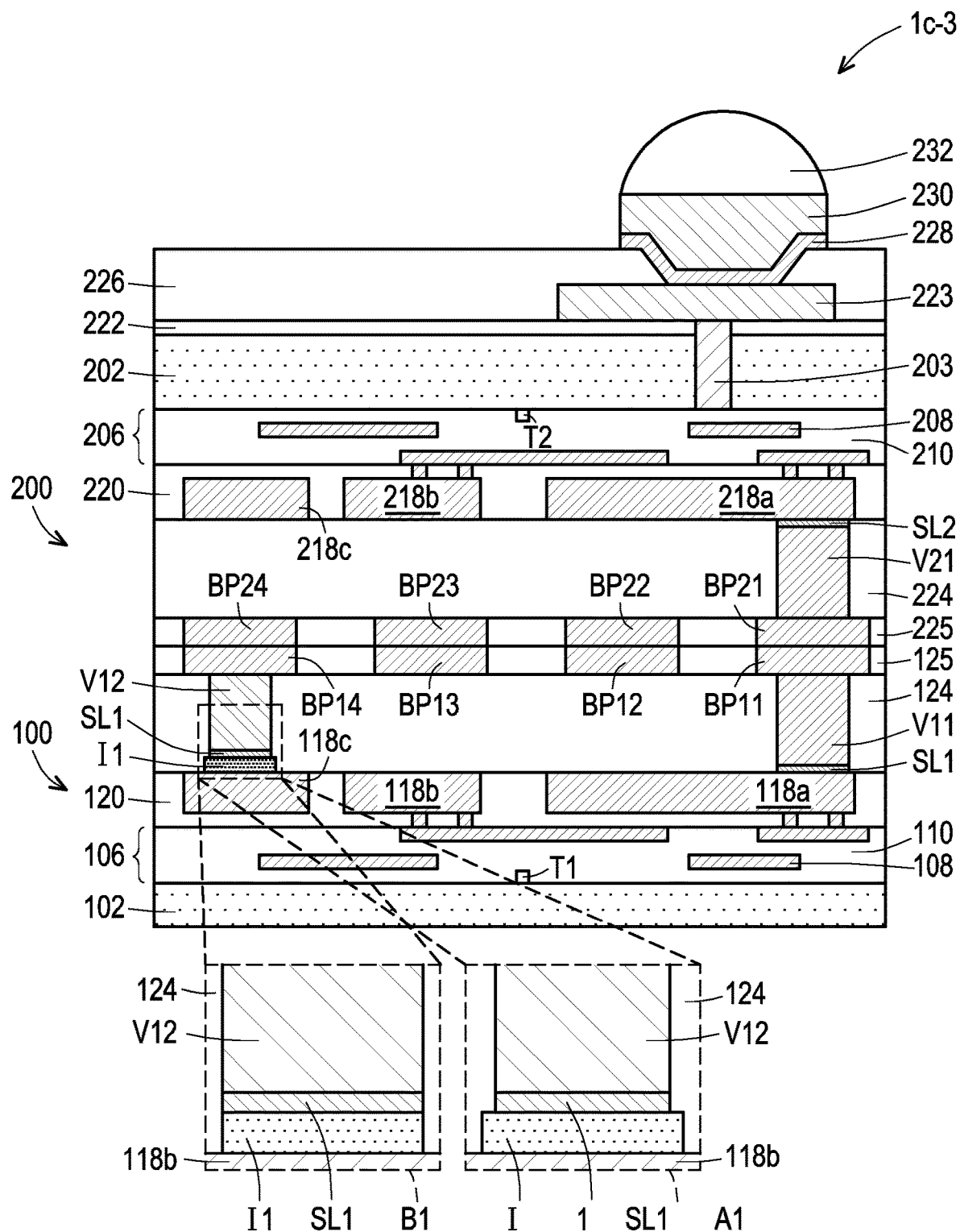
Figure 36:
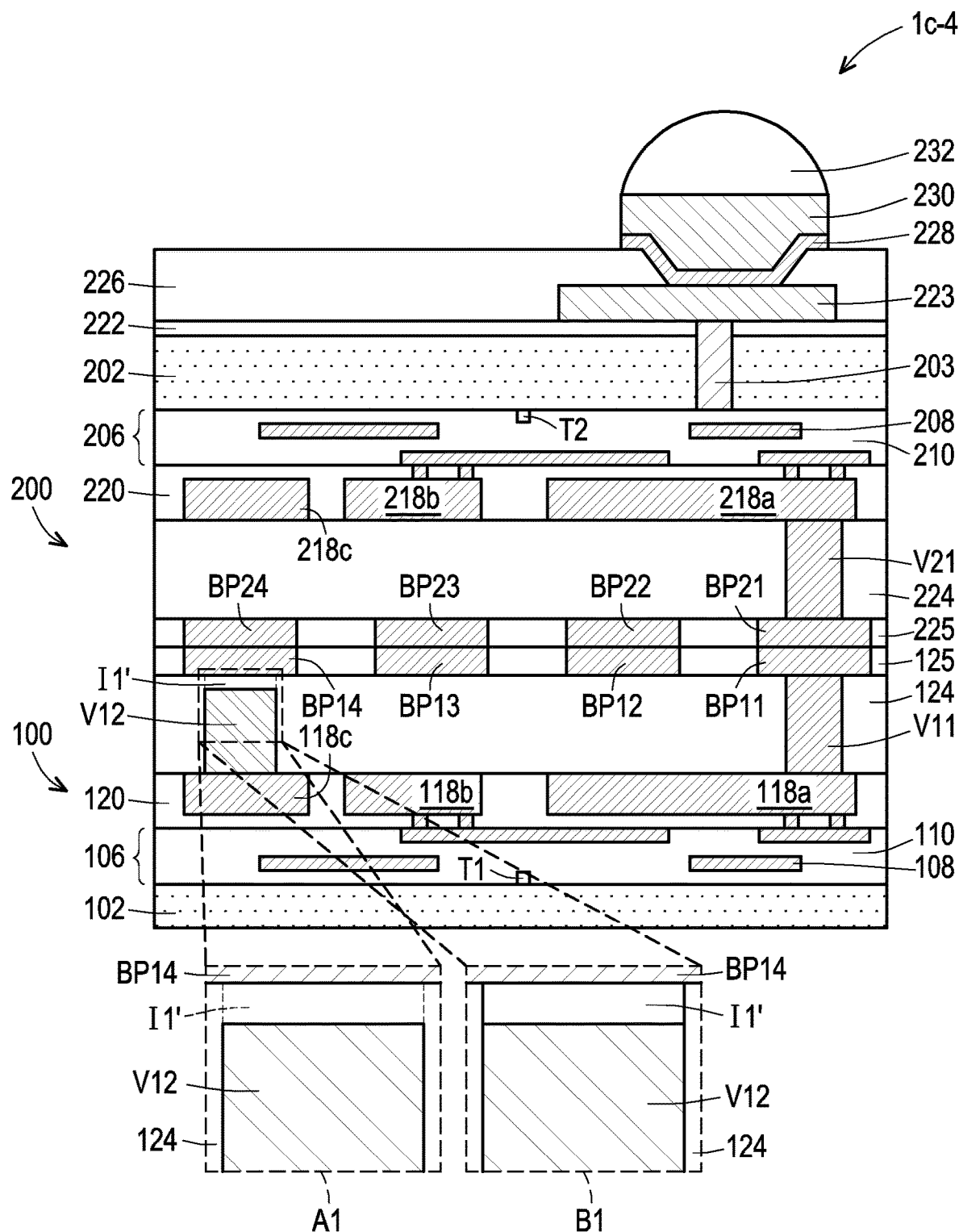
Figure 37:
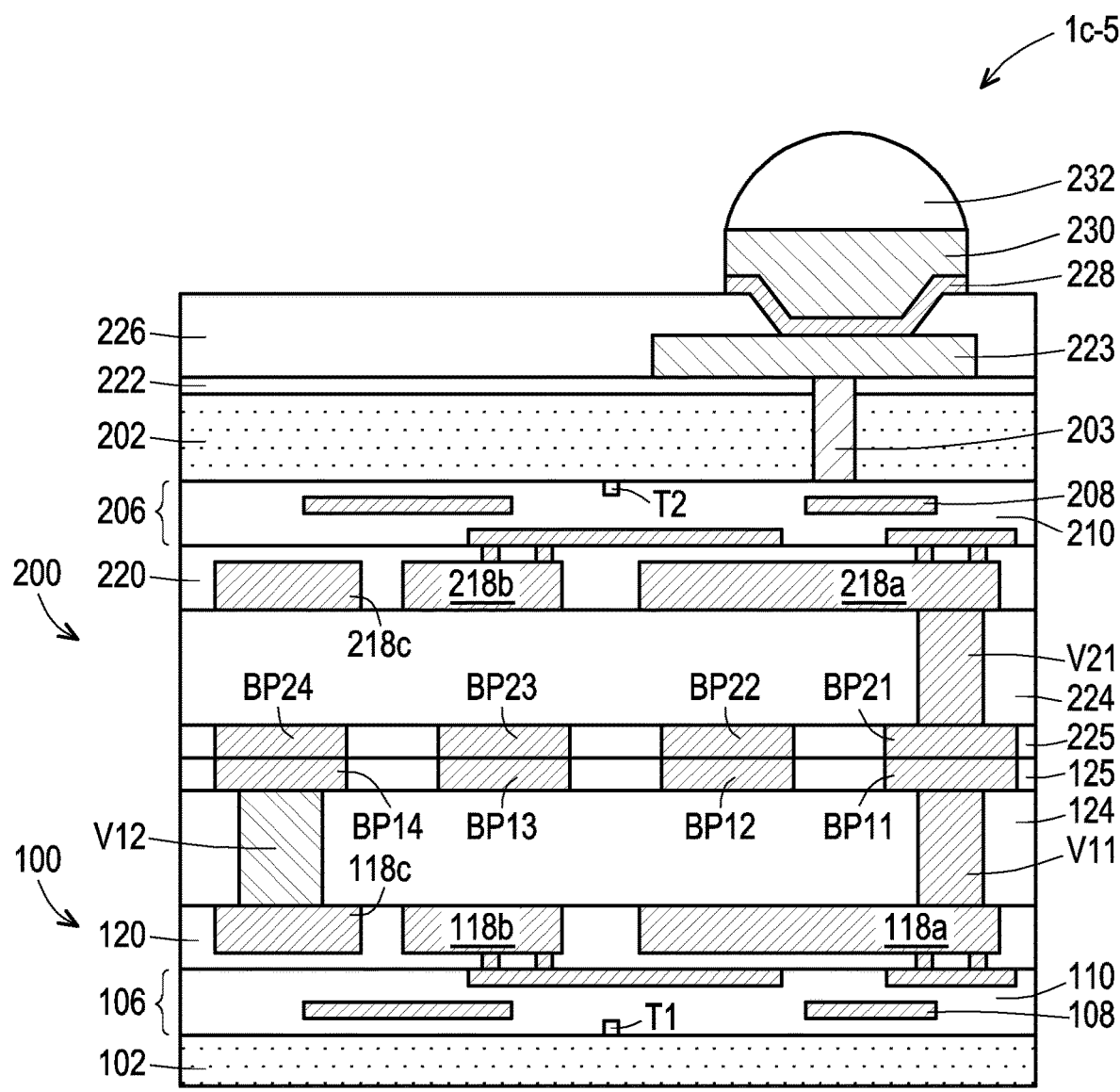
Figure 38:
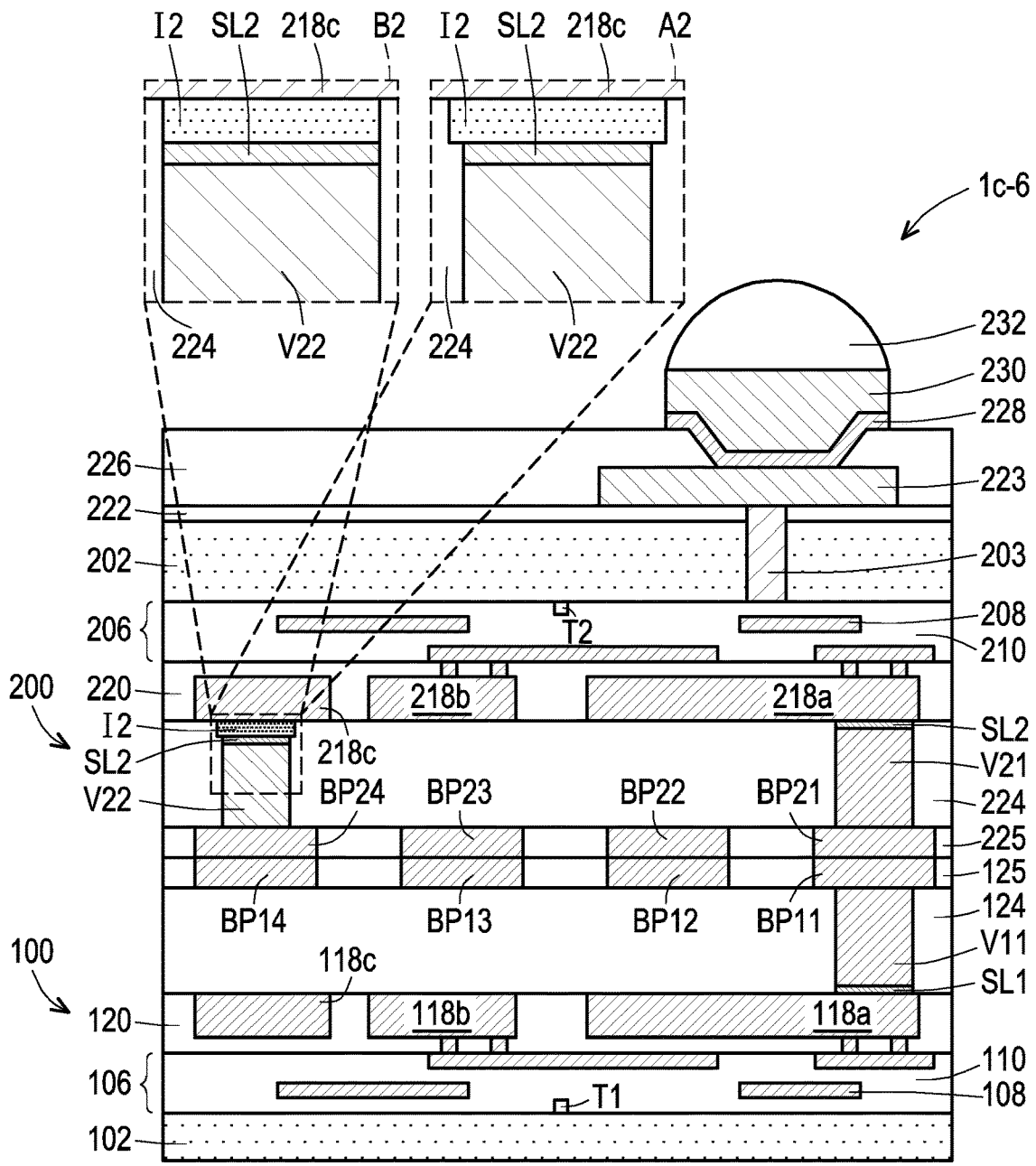
Figure 39:
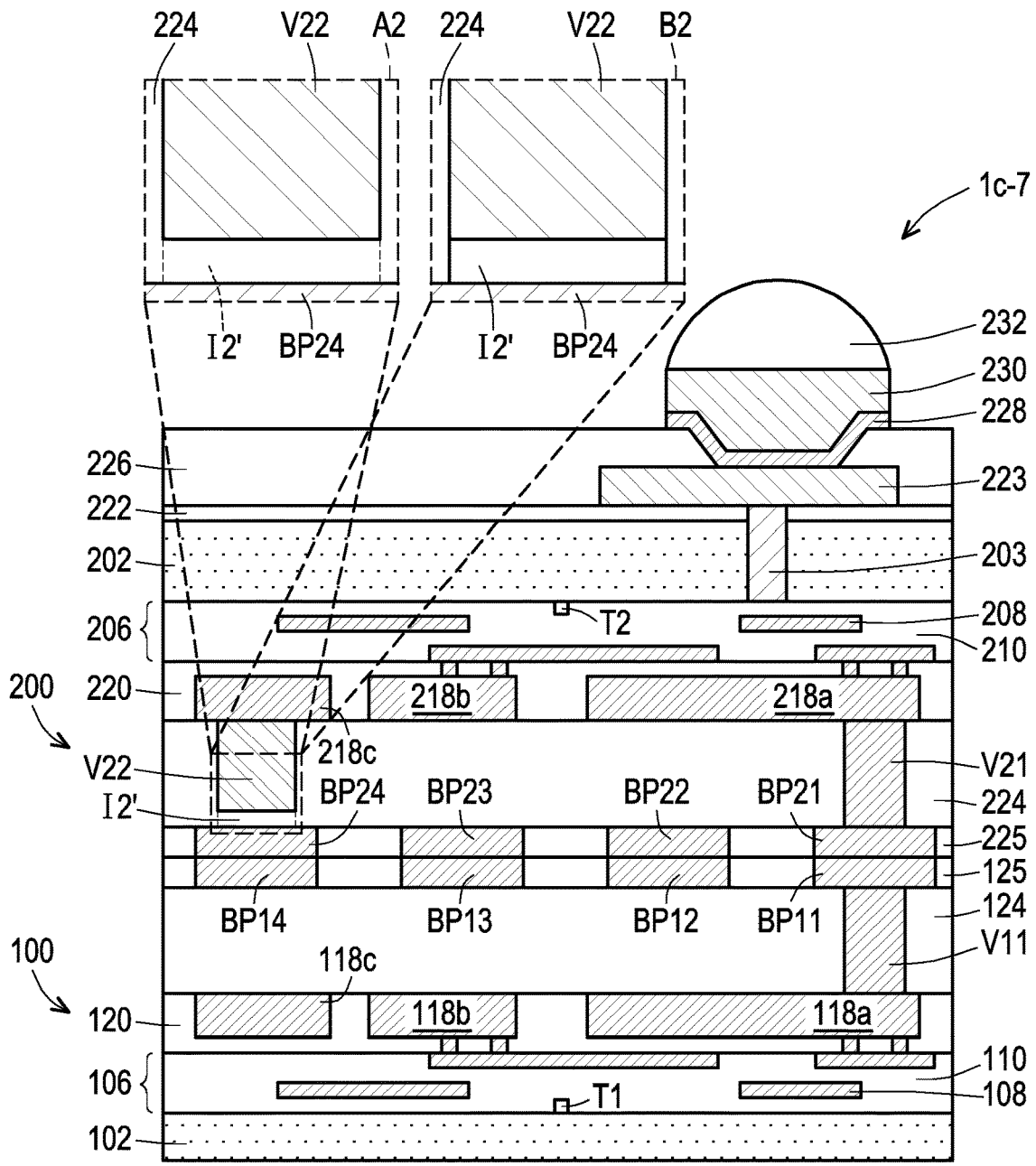
Figure 40:
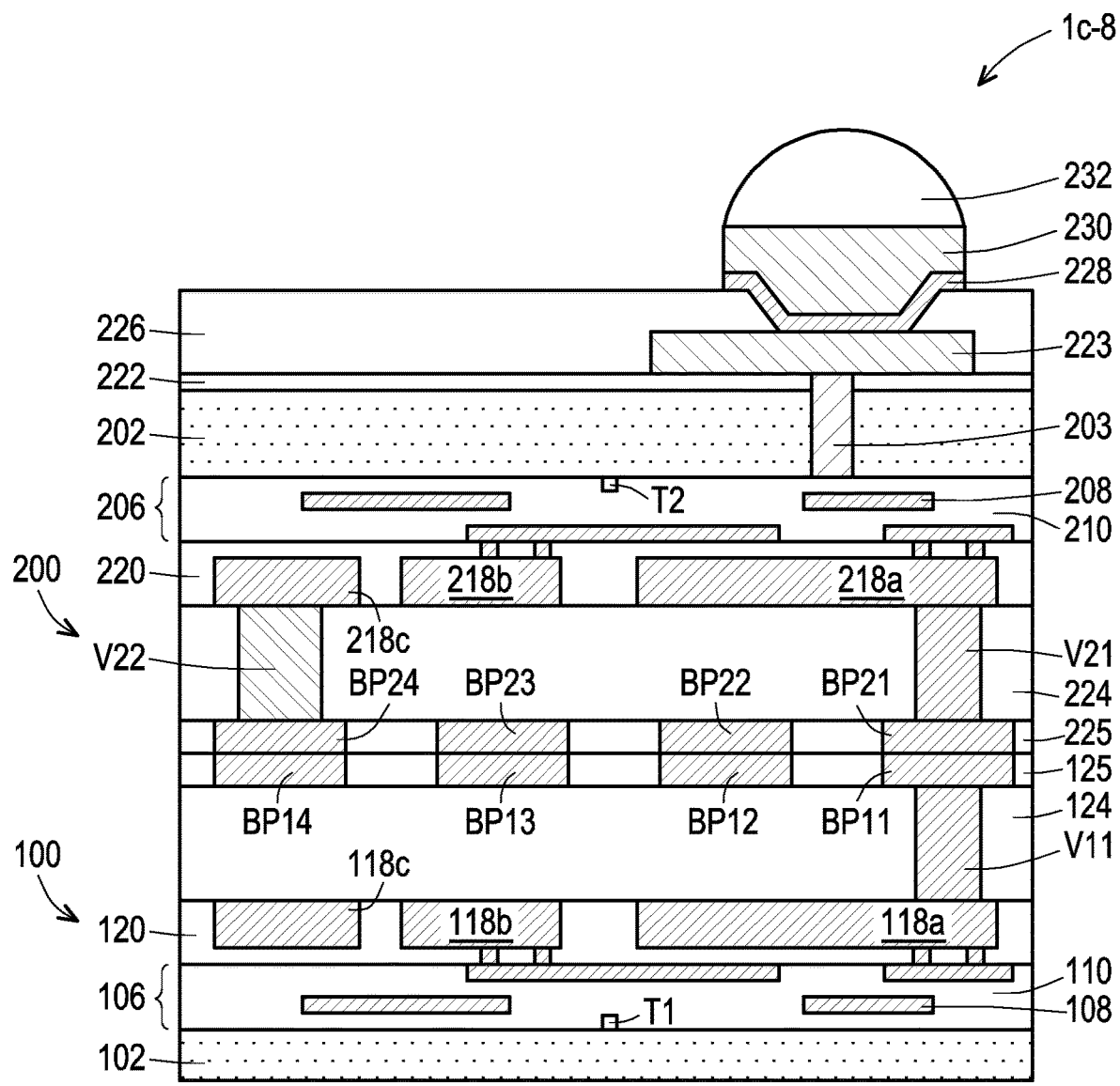
Figure 41:
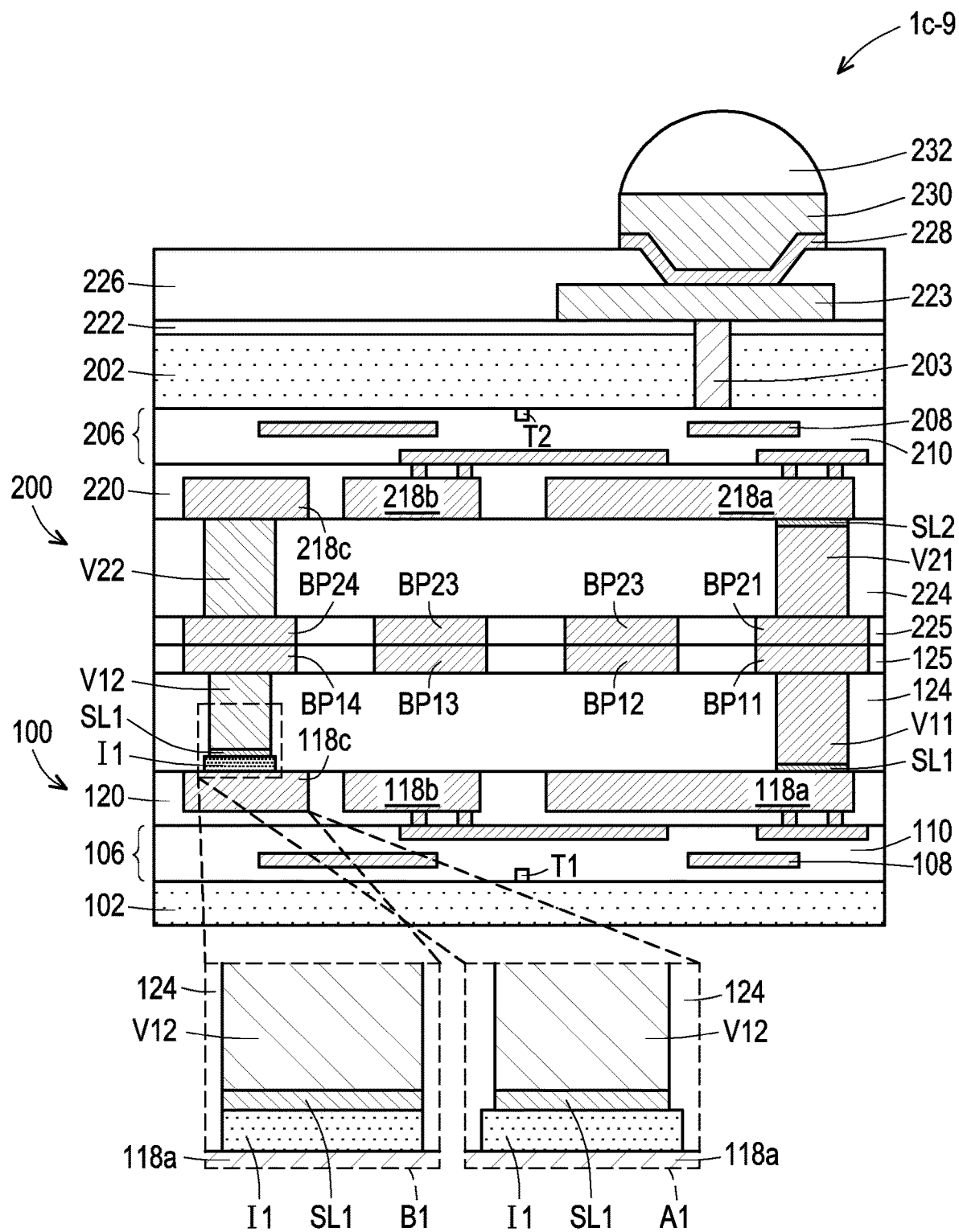
Figure 42:
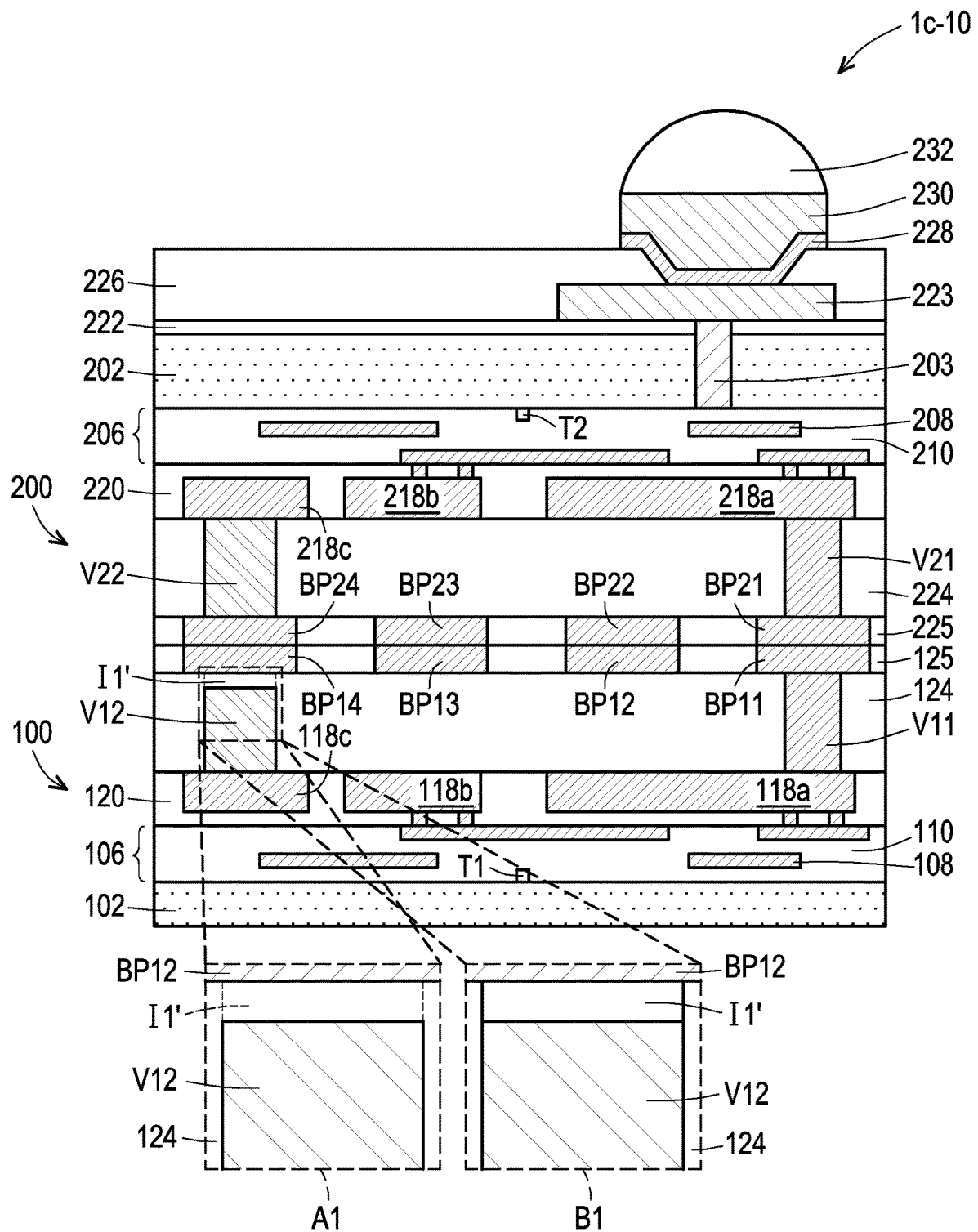
Figure 43:
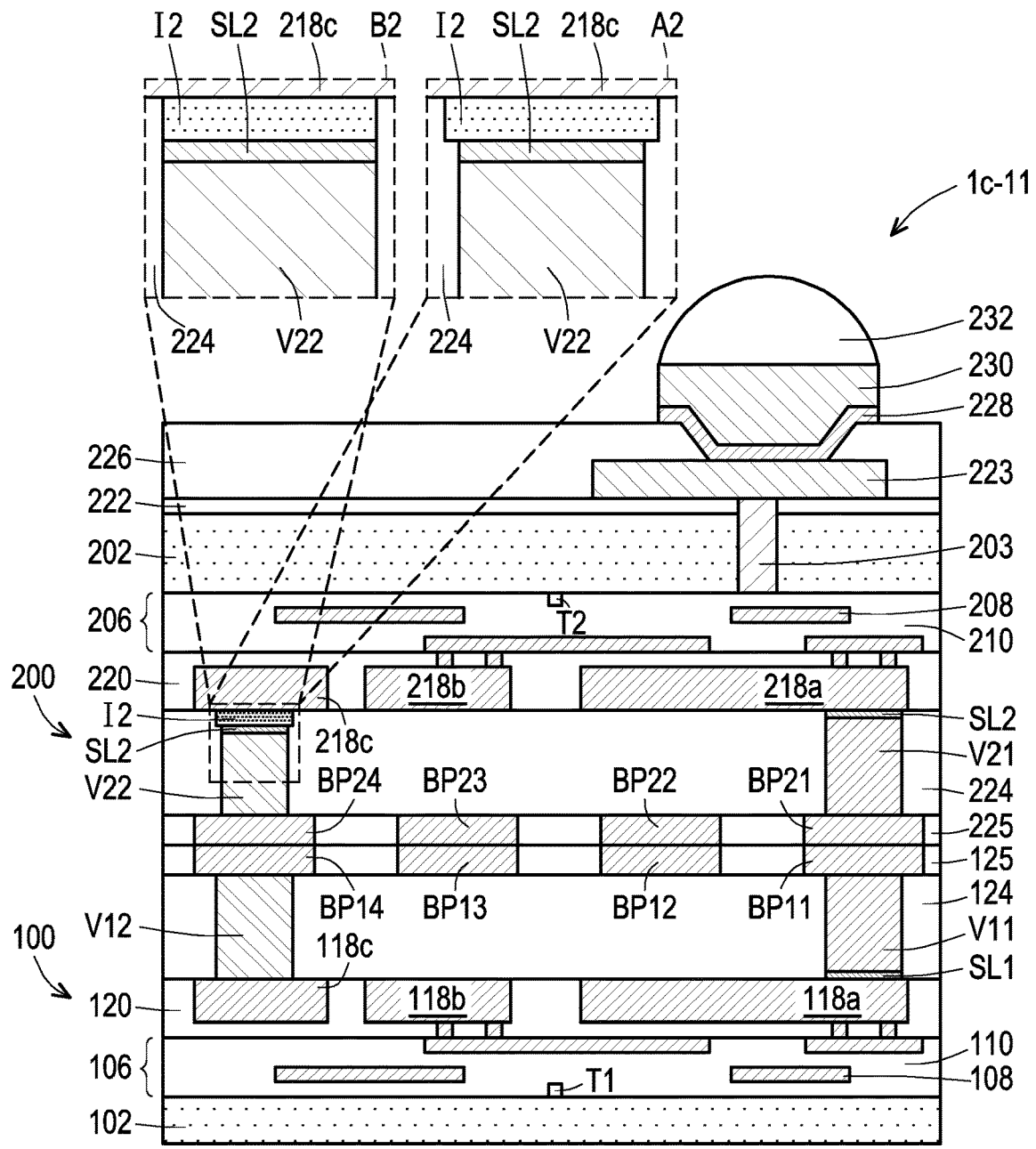
Figure 44:
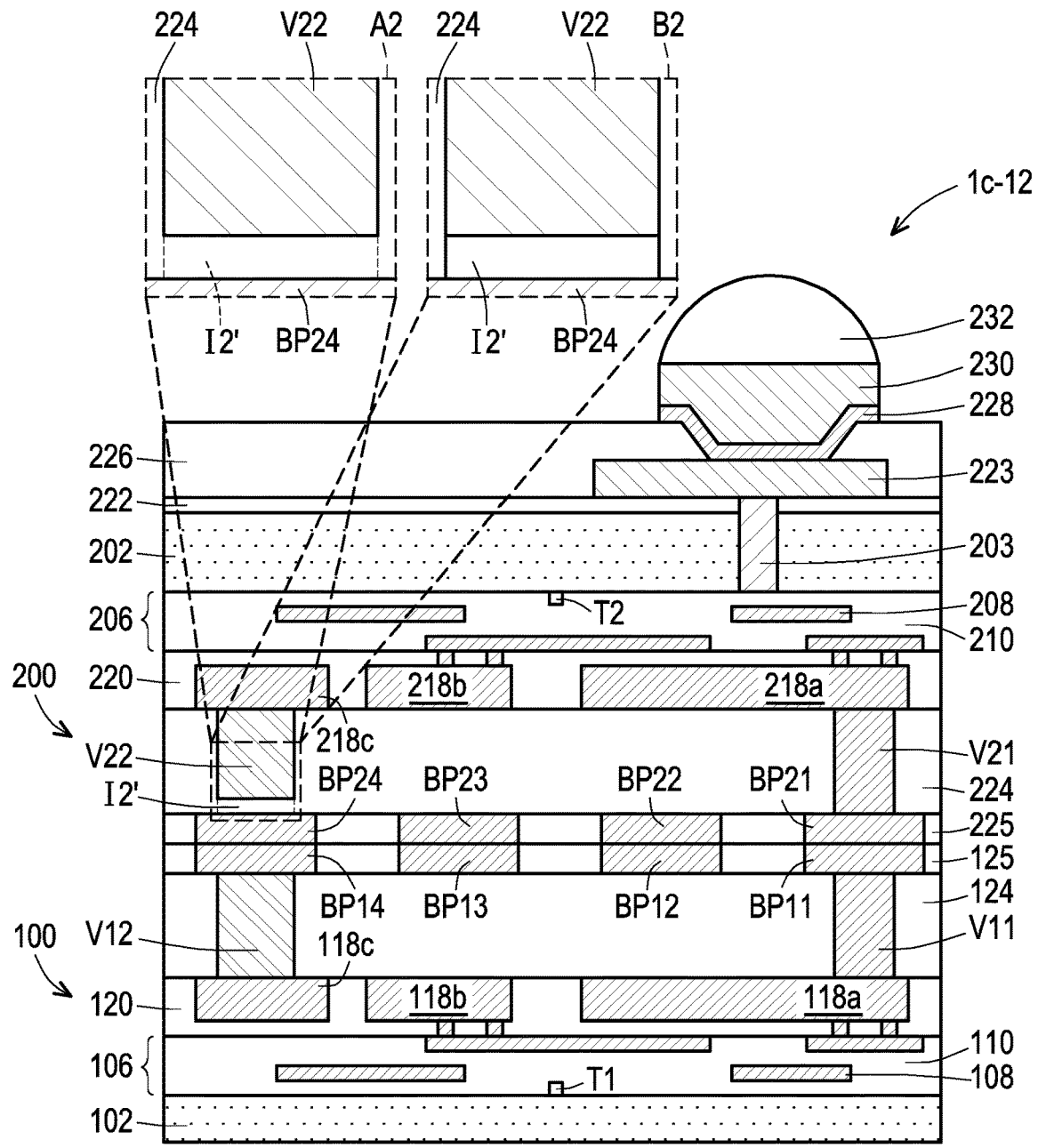

The integrated circuit package 1*a*-12 of FIG. 20 is similar to the integrated circuit packages 1*a*-2 of FIG. 10, and the difference between them lies in that, in the integrated circuit package 1*a*-12 of FIG. 20, the insulator I1' is omitted from the semiconductor die 100 facing away from the ball array. In this embodiment, the thermal via V12 is in physical contact with the bonding pad BP2 and the die pad 118*a* but electrically insulated from the device T2.

FIG. 21 to FIG. 32 are cross-sectional views schematically illustrating integrated circuit packages in accordance with some embodiments of the present disclosure. The integrated circuit packages 1b-1 to 1b-12 of FIG. 21 to FIG. 32 are similar to the integrated circuit packages 1a-1 to 1a-12 of FIG. 6 and FIG. 10 to FIG. 20, wherein like reference numerals refer to like elements. The materials, configurations and forming methods of elements of FIG. 21 to FIG. 32 may refer to those of similar elements described in the previous embodiments. The integrated circuit packages of FIG. 21 to FIG. 32 may be beneficial for product flexibility.

The integrated circuit packages 1b-1 to 1b-12 of FIG. 21 to FIG. 32 are similar to the integrated circuit packages 1a-1 to 1a-12 of FIG. 6 and FIG. 10 to FIG. 20, and the difference lies in that, in FIG. 21 to FIG. 32, the thermal via V12 and the conductive V11 are landed on different die pads 118b and 118a, and the thermal via V22 and the conductive V21 are landed on different die pads 218b and 218a. The die pads 118b and 118a are active die pads electrically connected to the device T1, and the die pads 218b and 218a are active die pads electrically connected to the device T2. Due to the location shift, the thermal via V12 is located between the die pad 118b and the bonding pad BP13, and the thermal via V22 is located between the die pad 218b and the bonding pad BP23. In these embodiments, the bonding pads BP13 and BP23 are called "thermal pads", and the bonding pads BP12, BP22, BP14 and BP24 are called "dummy bonding pads".

FIG. 33 to FIG. 44 are cross-sectional views schematically illustrating integrated circuit packages in accordance with some embodiments of the present disclosure. The integrated circuit packages 1c-1 to 1c-12 of FIG. 33 to FIG. 44 are similar to the integrated circuit packages 1a-1 to 1a-12 of FIG. 6 and FIG. 10 to FIG. 20, wherein like reference numerals refer to like elements. The materials, configurations and forming methods of elements of FIG. 33 to FIG. 44 may refer to those of similar elements described in the previous embodiments. The integrated circuit packages of FIG. 33 to FIG. 44 may be beneficial for product flexibility.

The integrated circuit packages 1c-1 to 1c-12 of FIG. 33 to FIG. 44 are similar to the integrated circuit packages 1a-1 to 1a-12 of FIG. 6 and FIG. 10 to FIG. 20, and the difference lies in that, in FIG. 33 to FIG. 44, the thermal via V12 and the conductive V11 are landed on different die pads 118c and 118a, and the thermal via V22 and the conductive V21 are landed on different die pads 218c and 218a. The die pad 118a is an active die pad electrically connected to the device T1, but the die pad 118c is a dummy die pad electrically insulated from the device T1. The die pad 218a is an active die pad electrically connected to the device T2, but the die pad 218c is a dummy die pad electrically insulated from the device T2. Due to the location shift, the thermal via V12 is located between the die pad 118c and the bonding pad BP14, and the thermal via V22 is located between the die pad 218c and the bonding pad BP24. In these embodiments, the bonding pads BP14 and BP24 are called "thermal pads", and the bonding pads BP12, BP22, BP13 and BP23 are called "dummy bonding pads".

Figure 45:
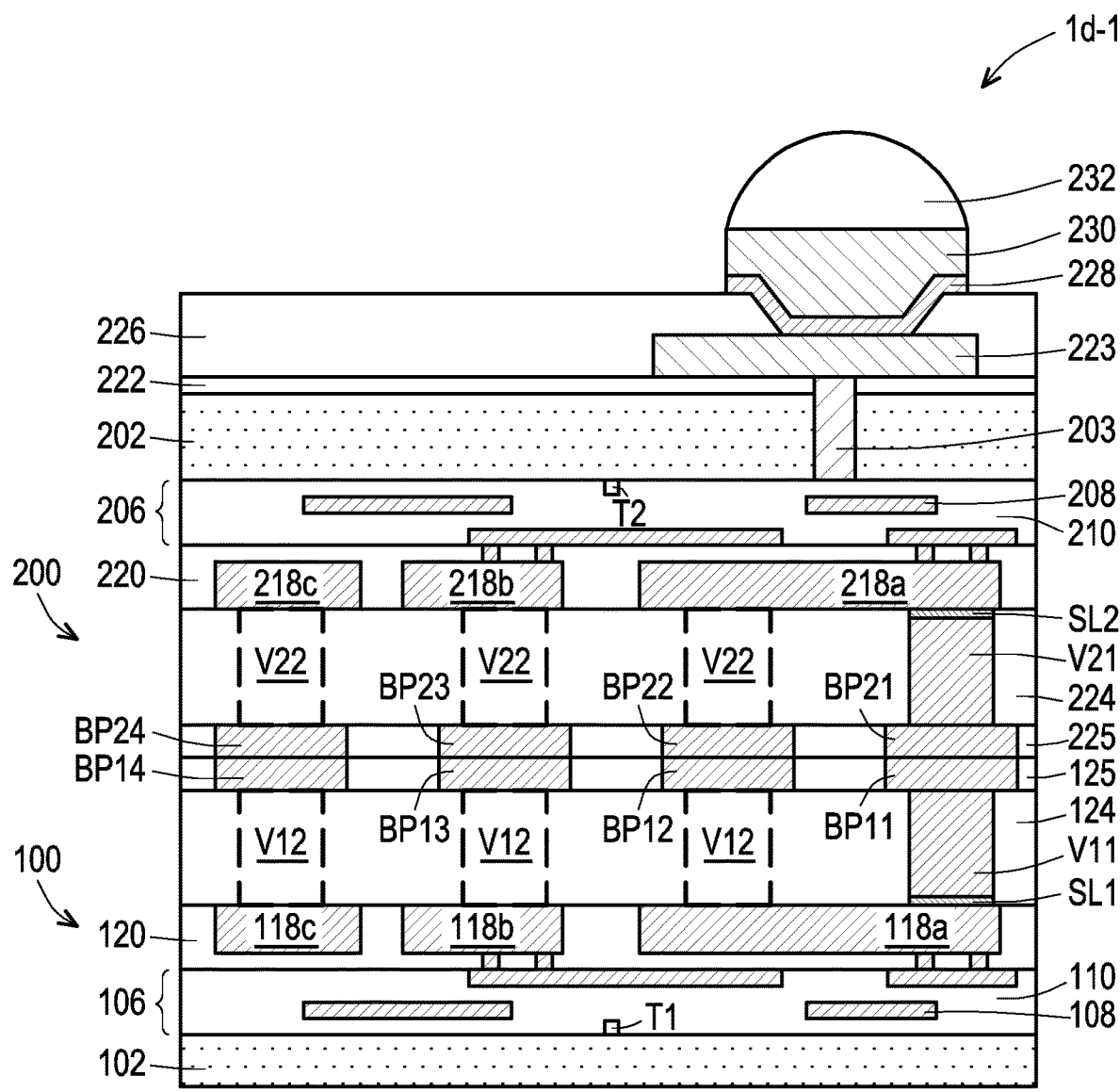

FIG. 45 illustrates an integrated circuit package 1d-1 including combinations of the previous embodiments. Specifically, the dummy via V12/V22 between the bonding pad BP12/BP22 and the die pad 118a/218a can refer to one of configurations as shown in FIG. 6, FIG. 10 to FIG. 20, the dummy via V12/V22 between the bonding pad BP13/BP23 and the die pad 118b/218b can refer to one of configurations as shown in FIG. 21 to FIG. 32, and the dummy via V12/V22 between the bonding pad BP14/BP24 and the die pad 118c/218c can refer to one of configurations as shown in FIG. 33 to FIG. 44. Several configurations are provided below for illustration purposes, but the disclosure is not limited to.

Figure 46:
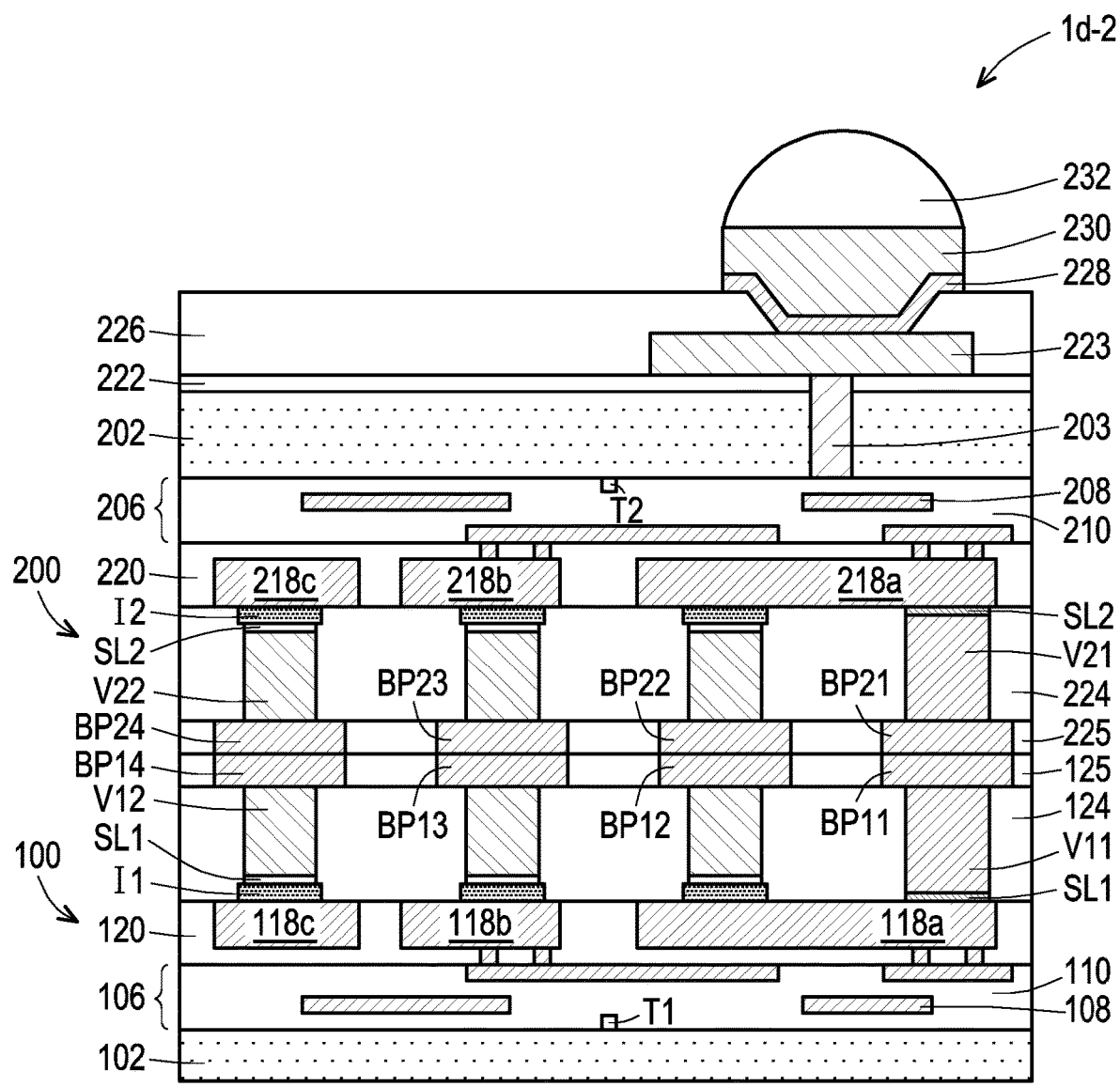

For example, in the integrated circuit package 1d-2 of FIG. 46, three bonding vias V12 and three bonding vias V22 are disposed around the bonding interface between two adjacent semiconductor dies 100 and 200, and the bonding vias V12 correspond to the bonding vias V22, respectively. Specifically, each of the thermal vias V12 and V22 is thermally conductive to the bonding pads BP12/BP13/BP14 and BP22/BP23/BP24, but electrically insulated from the device T1 and the device T2 by inserting the insulators I1 and I2 to block the electrical paths. In this embodiment, the bonding pads BP12/BP13/BP14 and BP22/BP23/BP24 are called "thermal bonding pads". The thermal resistance of SoIC bond is significantly reduced by adding the thermal vias and/or thermal bonding pads of the disclosure.

Figure 47:
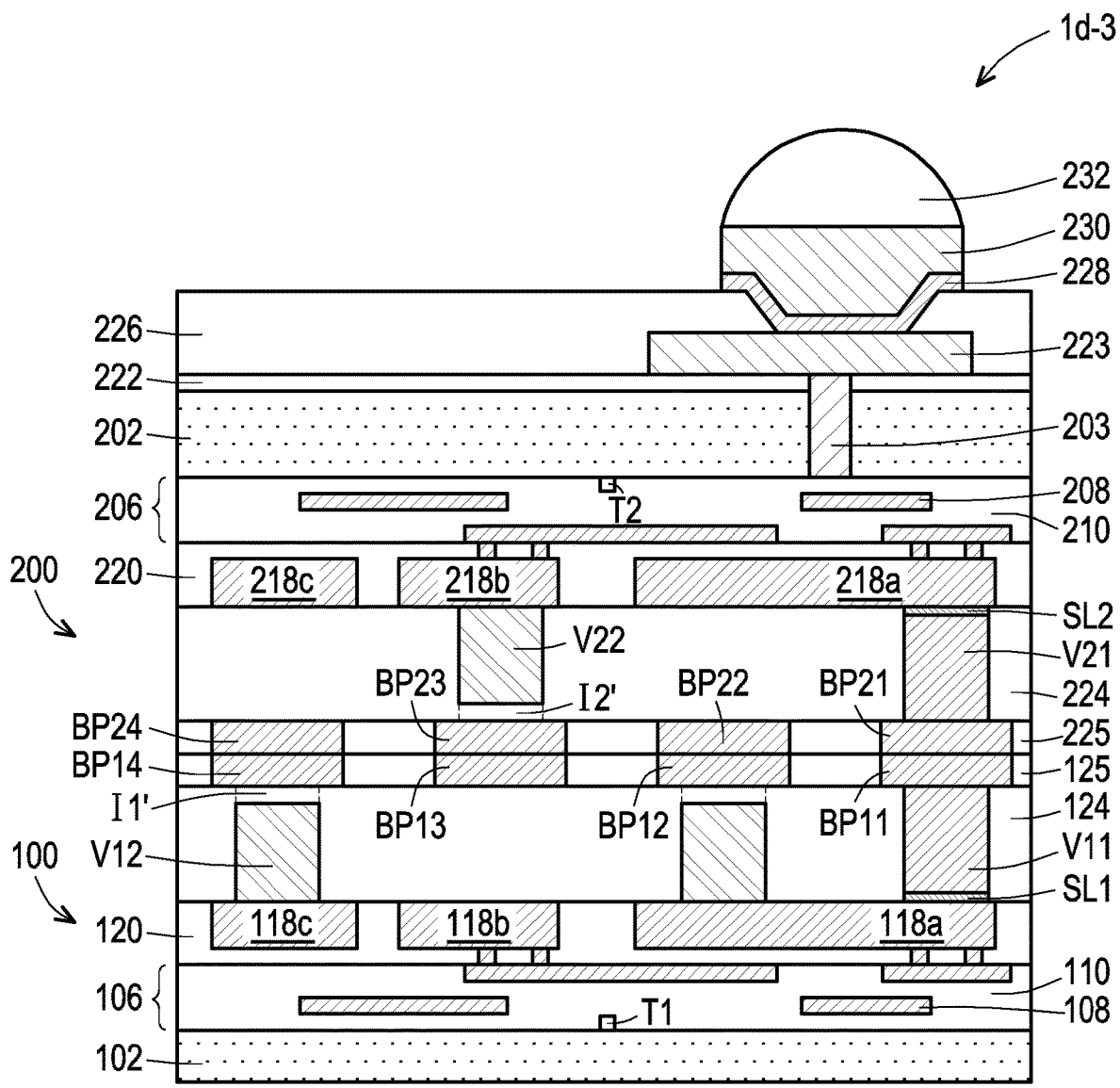

For example, in the integrated circuit package 1d-3 of FIG. 47, two bonding vias V12 and one bonding via V22 are disposed around the bonding interface between two adjacent semiconductor dies 100 and 200, and the bonding vias V12 are misaligned with the thermal via V22. Specifically, the bonding via V22 is disposed between the bonding vias V12. In other embodiments, when multiple bonding vias V22 and multiple bonding vias V12 are provided around the bonding interface, the bonding vias V22 and the bonding vias V21 may be arranged alternately. In this embodiments, each thermal via V12 is thermally conductive to the die pads 118a/118c, but electrically insulated from the device T1 and the device T2 by inserting the insulators I1' to block the electrical paths. Besides, the thermal via V22 is thermally conductive to the die pads 218b, but electrically insulated from the device T1 and the device T2 by inserting the insulators I2' to block the conductive paths. In this embodiment, the bonding pads BP12/BP13/BP14 and BP22/BP23/BP24 are called "thermal bonding pads". The thermal resistance of SoIC bond is significantly reduced by adding the thermal vias and/or thermal bonding pads of the disclosure.

Figure 48:
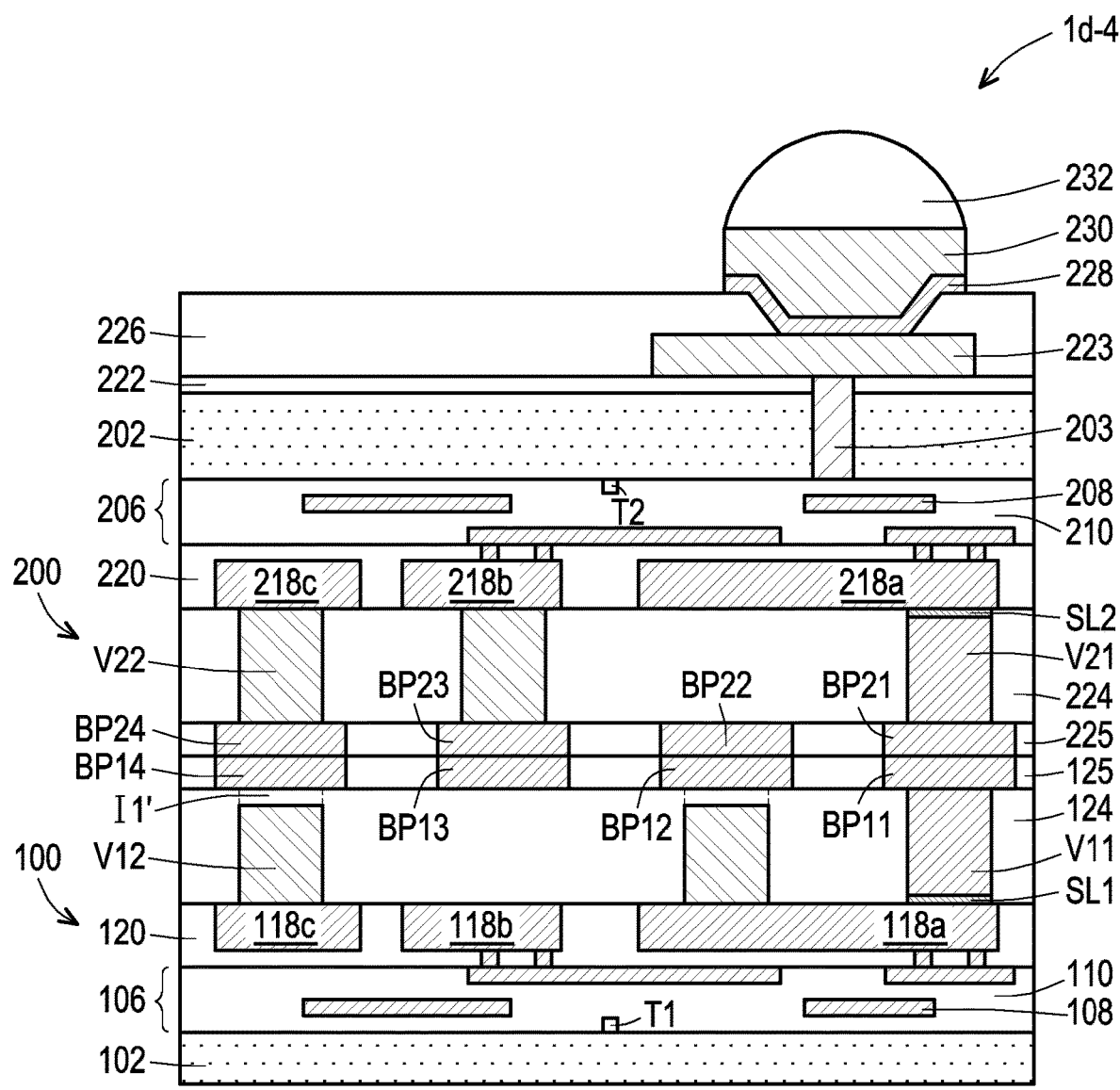

For example, in the integrated circuit package 1d-4 of FIG. 48, two bonding vias V12 and two bonding vias V22 are disposed around the bonding interface between two adjacent semiconductor dies 100 and 200. In this embodiments, each thermal via V12 is thermally conductive to the die pads 118a/118c, but electrically insulated from the device T1 and the device T2 by inserting the insulators I1' to block the electrical paths. Besides, one of the thermal via V22 is thermally conductive to the active die pad 218b but electrically insulated from the device T1, and another of the thermal vias V22 is thermally conductive to the dummy die pad 218c but electrically insulated from the device T1 and the device T2. In this embodiment, the bonding pads BP12/BP13/BP14 and BP22/BP23/BP24 are called "thermal bonding pads". The thermal resistance of SoIC bond is significantly reduced by adding the thermal vias and/or thermal bonding pads of the disclosure.

The above embodiments of FIG. 46 to FIG. 48 in which thermal vias are provided within both of the facing semiconductor dies are provided for illustration purposes, and are not construed as limiting the present disclosure. In other embodiments, upon the design requirements (e.g., shorter cycle time or cost reduction), the thermal vias may be provided in only one of the facing semiconductor dies.

In the above embodiments, the semiconductor die 200 and the semiconductor die 100 are bonded in a face-to-face alignment with a hybrid bonding. However, the disclosure is not limited thereto. In other embodiments, the semiconductor die 200 and the semiconductor die 100 are bonded in a face-to-back alignment or a back-to-back alignment with a hybrid bonding, a fusion bonding, a eutectic bonding or an adhesive bonding upon the actual requirements. Several configurations are provided below for illustration purposes, but the disclosure is not limited to.

Figure 49:
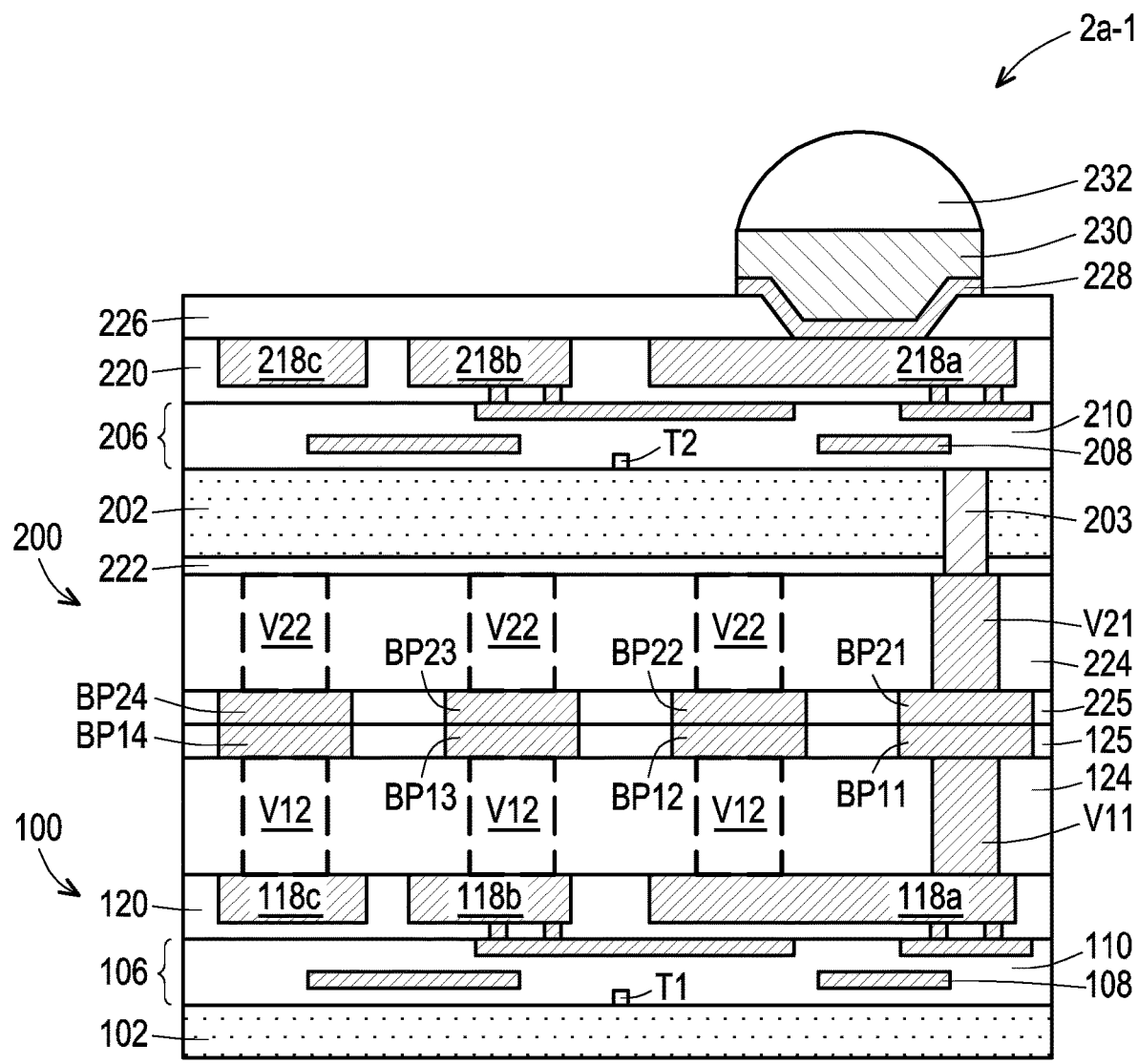
FIG. 49 to FIG. 52 are cross-sectional views schematically illustrating integrated circuit packages in accordance with other embodiments of the present disclosure.

FIG. 49 is a cross-sectional view schematically illustrating an integrated circuit packages in accordance with other embodiments of the present disclosure. The integrated circuit packages 2a-1 of FIG. 49 is similar to the integrated circuit packages 1d-1 of FIG. 45, wherein like reference numerals refer to like elements.

The integrated circuit packages 2a-1 of FIG. 49 is similar to the integrated circuit packages 1d-1 of FIG. 45, and the difference lies in that, in the integrated circuit packages 2a-1 of FIG. 49, the semiconductor die 200 and the semiconductor die 100 are bonded in a face-to-back alignment, rather than the face-to-face alignment of the integrated circuit package 2d-1. The materials, configurations and forming methods of elements of FIG. 49 may refer to those of similar elements described in the previous embodiments. The integrated circuit package of FIG. 49 may be beneficial for product flexibility.

Referring to FIG. 49, a semiconductor die 100 is provided. In some embodiments, the semiconductor device 100 may be formed with operations similar to those described in FIG. 1 to FIG. 4 or FIG. 7 to FIG. 9. In some embodiments, the semiconductor device 100 includes a first interconnect structure 106, first die pads 118a/118b/118c, first thermal vias V12, and first bonding pads BP11/BP12/BP13/BP14 sequentially formed on a front side of a first semiconductor substrate 102.

Thereafter, a semiconductor device 200 is provided. In some embodiments, the semiconductor device 200 includes a second interconnect structure 206, second die pads 218a/218b/218c, and a passivation layer 226 sequentially formed on a front side of a second semiconductor substrate 202. The second semiconductor substrate 200 has at least one through substrate via (TSV) 203 formed therein.

The semiconductor substrate 200 may be thinned to expose the upper portion of the TSV 203, and the isolation layer 222 is formed aside the upper portion of the TSV 203.

Afterwards, second thermal vias V22 and second bonding pads BP21/BP22/BP23/BP24 are sequentially formed on a backside of the second semiconductor substrate 202.

The bump including a lower portion 230 (e.g., Cu pillar) and an upper portion 232 (e.g., solder ball) is then formed through the passivation layer 226 and electrically connected to the die pad 218a.

The integrated circuit package 2a-1 of FIG. 49 includes combinations of the previous embodiments. Specifically, the dummy via V12/V22 between the bonding pad BP12/BP22 and the die pad 118a/218a can refer to one of configurations as shown in FIG. 6, FIG. 10 to FIG. 20, the dummy via V12/V22 between the bonding pad BP13/BP23 and the die pad 118b/218b can refer to one of configurations as shown in FIG. 21 to FIG. 32, and the dummy via V12/V22 between the bonding pad BP14/BP24 and the die pad 118c/218c can refer to one of configurations as shown in FIG. 33 to FIG. 44. Several configurations are provided below for illustration purposes, but the disclosure is not limited to.

Figure 50:
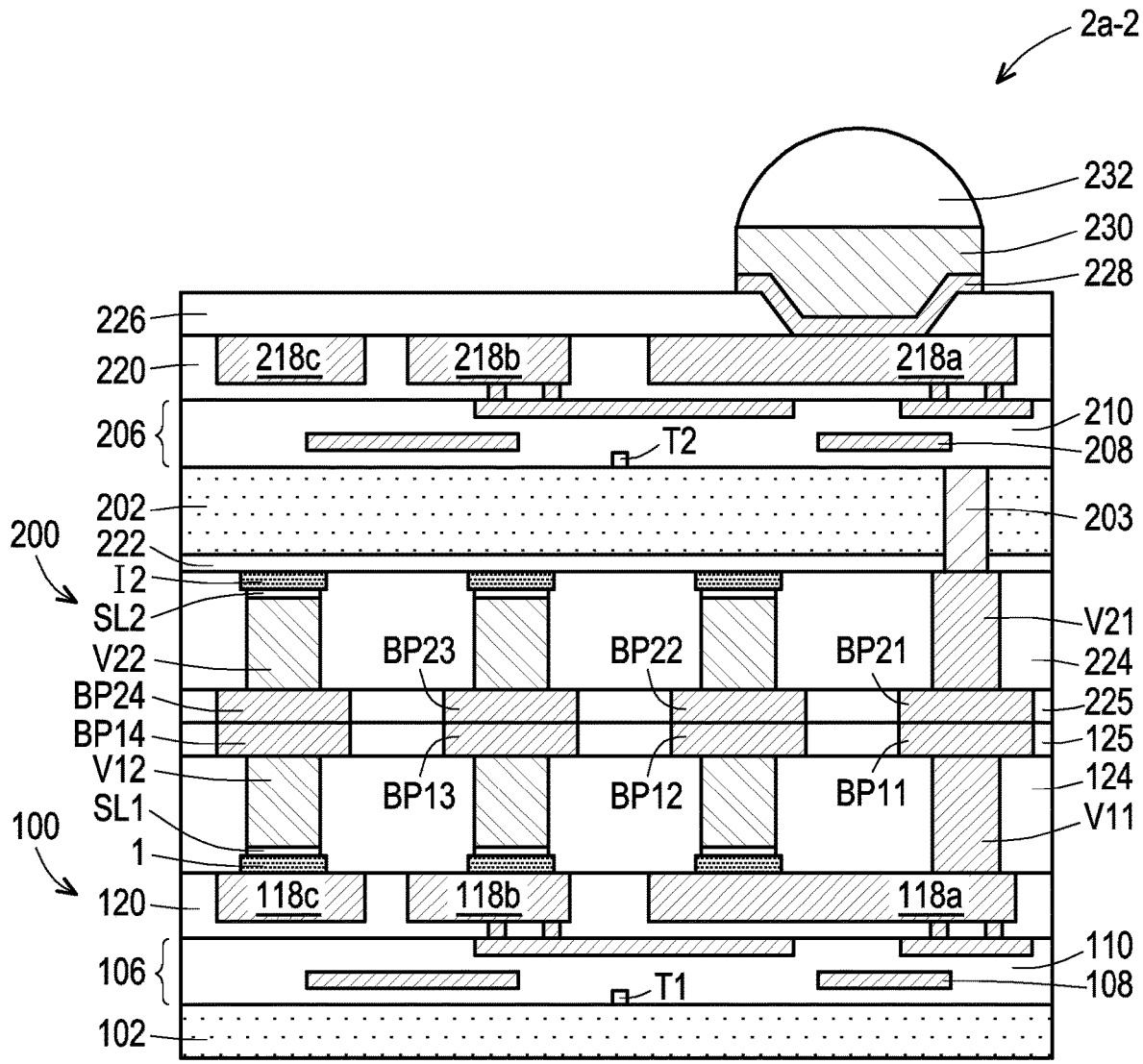

For example, in the integrated circuit package 2a-2 of FIG. 50, three bonding vias V12 and three bonding vias V22 are disposed around the bonding interface between two adjacent semiconductor dies 100 and 200, and the bonding vias V12 correspond to the bonding vias V22, respectively. Specifically, each of the thermal vias V12 and V22 is thermally conductive to the bonding pads BP12/BP13/BP14 and BP22/BP23/BP24, but electrically insulated from the device T1 and the device T2 by inserting the insulators I1 and I2 to block the electrical paths. In some embodiments, upon the process requirements, dummy TSVs may be provided within the semiconductor substrate 202 and correspond to the thermal vias V22, so as to improve the heat dissipation efficiency. In this embodiment, the bonding pads BP12/BP13/BP14 and BP22/BP23/BP24 are called "thermal bonding pads". The thermal resistance of SoIC bond is significantly reduced by adding the thermal vias and/or thermal bonding pads of the disclosure.

Figure 51:
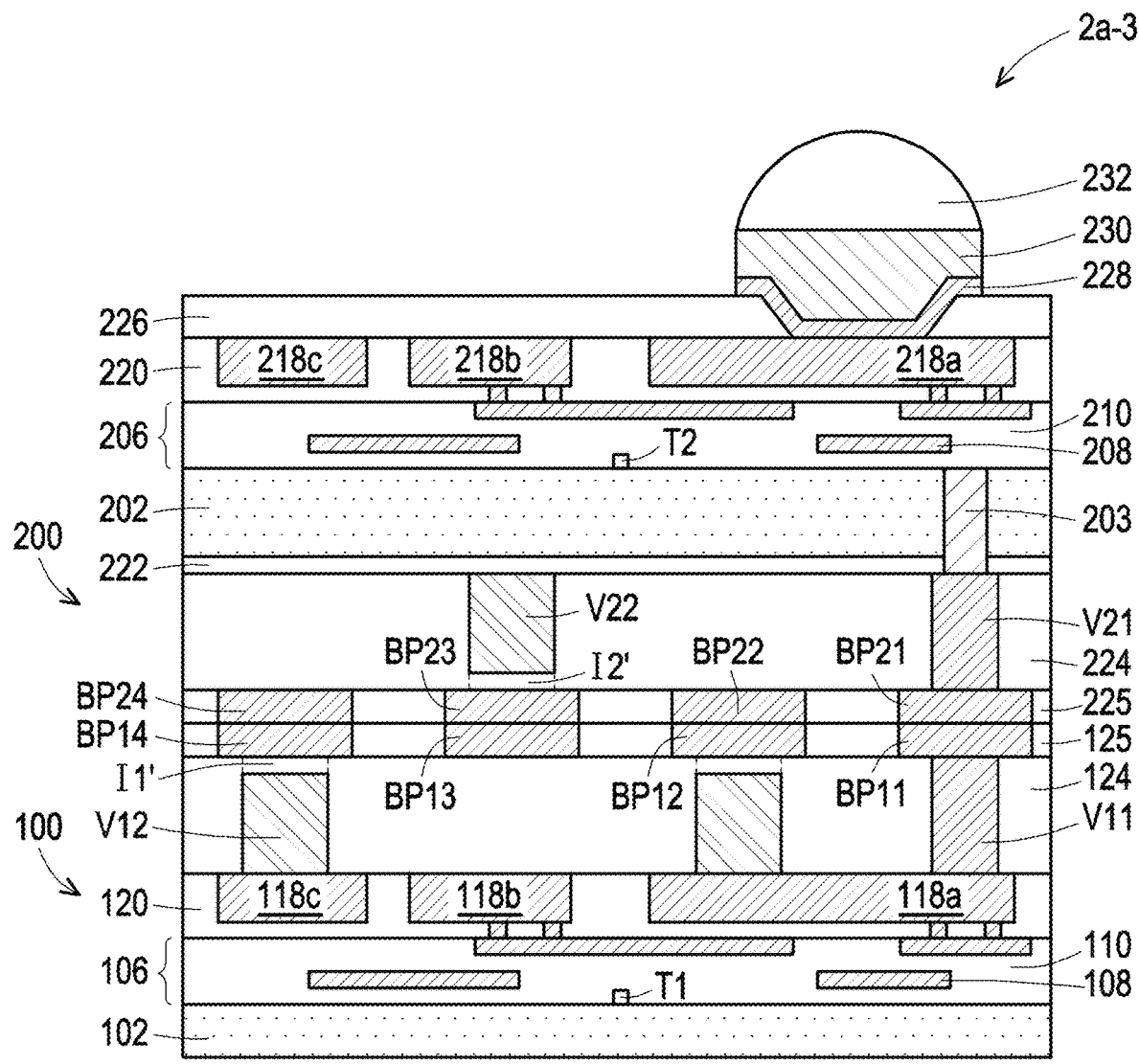

For example, in the integrated circuit package 2a-3 of FIG. 51, two bonding vias V12 and one bonding via V22 are disposed around the bonding interface between two adjacent semiconductor dies 100 and 200, and the bonding vias V12 are misaligned with the thermal via V22. Specifically, the bonding via V22 is disposed between the bonding vias V12. In other embodiments, when multiple bonding vias V22 and multiple bonding vias V12 are provided around the bonding interface, the bonding vias V22 and the bonding vias V21 may be arranged alternately. In some embodiments, upon the process requirements, dummy TSVs may be provided within the semiconductor substrate 202 and correspond to the thermal vias V22, so as to improve the heat dissipation efficiency. In this embodiments, each thermal via V12 is thermally conductive to the die pads 118a/118c, but electrically insulated from the device T1 and the device T2 by inserting the insulators I1' to block the electrical paths. Besides, the thermal via V12 is thermally conductive to the die pads 118b, but electrically insulated from the device T1 and the device T2 by inserting the insulators I2' to block the conductive path. In this embodiment, the bonding pads BP12/BP13/BP14 and BP22/BP23/BP24 are called "thermal bonding pads". The thermal resistance of SoIC bond is significantly reduced by adding the thermal vias and/or thermal bonding pads of the disclosure.

Figure 52:
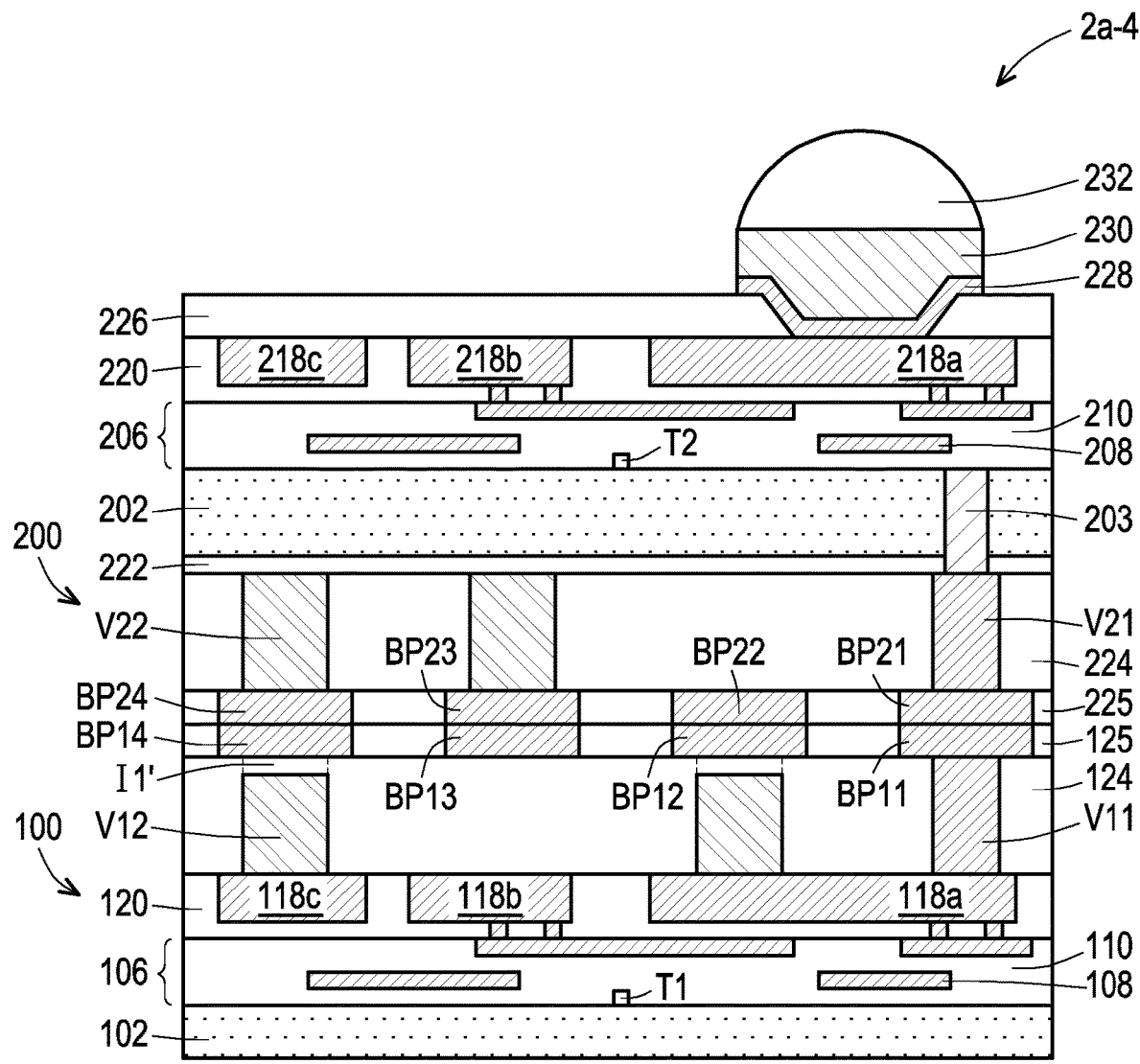

For example, in the integrated circuit package 2a-4 of FIG. 52, two bonding vias V12 and two bonding vias V22 are disposed around the bonding interface between two adjacent semiconductor dies 100 and 200. In this embodiments, each thermal via V12 is thermally conductive to the die pads 118a/118c, but electrically insulated from the device T1 and the device T2 by inserting the insulators I1' to block the electrical paths. Besides, one of the thermal via V22 is thermally conductive to the active die pad 218b but electrically insulated from the device T1, and another of the thermal vias V22 is thermally conductive to the dummy die pad 218c but electrically insulated from the device T1 and the device T2. In some embodiments, upon the process requirements, dummy TSVs may be provided within the semiconductor substrate 202 and correspond to the thermal vias V22, so as to improve the heat dissipation efficiency. In this embodiment, the bonding pads BP12/BP13/BP14 and BP22/BP23/BP24 are called "thermal bonding pads". The thermal resistance of SoIC bond is significantly reduced by adding the thermal vias and/or thermal bonding pads of the disclosure.

The above embodiments of FIG. 50 to FIG. 52 in which thermal vias are provided within both of the facing semiconductor dies are provided for illustration purposes, and are not construed as limiting the present disclosure. In other embodiments, upon the design requirements (e.g., shorter cycle time or cost reduction), the thermal vias may be provided in only one of the facing semiconductor dies.

The structures of the integrated circuit packages of the disclosure are illustrated below with reference to the previous figures.

In some embodiments, an integrated circuit package (e.g., 1*a*-1 to 1*a*-12, 1*b*-1 to 1*b*-12, 1*c*-1 to 1*c*-12, 1*d*-1 to 1*d*-4, 2*a*-1 to 2*a*-4) includes a first semiconductor die (e.g., 100) and a second semiconductor die (e.g., 200) bonded to each other. The first semiconductor die includes a plurality of first die pads (e.g., 118*a* to 118*c*) over a first device (e.g., T1) and a plurality of first bonding pads (e.g., BP11 to BP14) over the first die pads.

In some embodiments, in the integrated circuit package (e.g., 1*a*-1, 1*a*-3, 1*a*-9), a first conductive via (e.g., V11) is disposed between and electrically connected to a first one (e.g., right side of 118*a*) of the first die pads and a first one (e.g., BP11) of the first bonding pads, and a first thermal via (e.g., V12) is disposed between a second one (e.g., left side of 118*a*) of the first die pads and a second one (e.g., BP12) of the first bonding pads and electrically insulated from the second one of the first die pads. In some embodiments, the second one (e.g., left side of 118*a*) of the first die pads is an active die pad electrically connected to the first device (e.g., T1). In some embodiments, the first one (e.g., right side of 118*a*) of the first die pads is connected to the second one (e.g., left side of 118*a*) of the first die pads. In some embodiments, the first semiconductor die further includes a first insulator (e.g., I1) between the first thermal via (e.g., V11) and the second one (e.g., left side of 118*a*) of the first die pads. Besides, the second semiconductor die (e.g., 200) includes a plurality of second bonding pads (e.g., BP21 to BP24), wherein the first one (e.g., BP11) of the first bonding pads is connected to a first one (e.g., BP21) of the second bonding pads, and the second one (e.g., BP12) of the first bonding pads is connected to a second one (e.g., BP22) of the second bonding pads.

In some embodiments, in the integrated circuit package (e.g., 1*b*-1, 1*b*-3, 1*b*-9), a first conductive via (e.g., V11) is disposed between and electrically connected to a first one (e.g., 118*a*) of the first die pads and a first one (e.g., BP11) of the first bonding pads, and a first thermal via (e.g., V12) is disposed between a second one (e.g., 118*b*) of the first die pads and a second one (e.g., BP13) of the first bonding pads and electrically insulated from the second one of the first die pads. In some embodiments, the second one (e.g., 118*b*) of the first die pads is an active die pad electrically connected to the first device (e.g., T1). In some embodiments, the second one (e.g., 118*b*) of the first die pads is an active die pad electrically connected to the first device (e.g., T1). In some embodiments, the first one (e.g., 118*a*) of the first die pads is separated from the second one (e.g., 118*b*) of the first die pads. In some embodiments, the first semiconductor die further includes a first insulator (e.g., I1) between the first thermal via (e.g., V11) and the second one (e.g., left side of 118*a*) of the first die pads. Besides, the second semiconductor die (e.g., 200) includes a plurality of second bonding pads (e.g., BP21 to BP24), wherein the first one (e.g., BP11) of the first bonding pads is connected to a first one (e.g., BP21) of the second bonding pads, and the second one (e.g., BP13) of the first bonding pads is connected to a second one (e.g., BP23) of the second bonding pads.

In some embodiments, in the integrated circuit package (e.g., 1*c*-1, 1*c*-3, 1*c*-9), a first conductive via (e.g., V11) is disposed between and electrically connected to a first one (e.g., 118*a*) of the first die pads and a first one (e.g., BP11) of the first bonding pads, and a first thermal via (e.g., V12) is disposed between a second one (e.g., 118*c*) of the first die pads and a second one (e.g., BP14) of the first bonding pads and electrically insulated from the second one of the first die pads. In some embodiments, the second one (e.g., 118*c*) of the first die pads is an active die pad electrically connected to the first device (e.g., T1). In some embodiments, the second one (e.g., 118*c*) of the first die pads is a floating die pad electrically insulated from the first device (e.g., T1). In some embodiments, the first one (e.g., 118*a*) of the first die pads is separated from the second one (e.g., 118*c*) of the first die pads. In some embodiments, the first semiconductor die further includes a first insulator (e.g., I1) between the first thermal via (e.g., V11) and the second one (e.g., 118*c*) of the first die pads. Besides, the second semiconductor die (e.g., 200) includes a plurality of second bonding pads (e.g., BP21 to BP24), wherein the first one (e.g., BP11) of the first bonding pads is connected to a first one (e.g., BP21) of the second bonding pads, and the second one (e.g., BP14) of the first bonding pads is connected to a second one (e.g., BP24) of the second bonding pads.

In some embodiments, in the integrated circuit package (e.g., 1*a*-2, 1*a*-4, 1*a*-10), a first conductive via (e.g., V11) is disposed between and electrically connected to a first one (e.g., right side of 118*a*) of the first die pads and a first one (e.g., BP11) of the first bonding pads, and a first thermal via (e.g., V12) is disposed between a second one (e.g., left side of 118*a*) of the first die pads and a second one (e.g., BP12) of the first bonding pads and electrically insulated from the second one of the first bonding pads. In some embodiments, the second one (e.g., left side of 118*a*) of the first die pads is an active die pad electrically connected to the first device (e.g., T1). In some embodiments, the first one (e.g., right side of 118*a*) of the first die pads is connected to the second one (e.g., left side of 118*a*) of the first die pads. In some embodiments, the first semiconductor die further includes a first insulator (e.g., I1') between the first thermal via (e.g., V11) and the second one (e.g., left side of 118*a*) of the first bonding pads. Besides, the second semiconductor die (e.g., 200) includes a plurality of second bonding pads (e.g., BP21 to BP24), wherein the first one (e.g., BP11) of the first bonding pads is connected to a first one (e.g., BP21) of the second bonding pads, and the second one (e.g., BP12) of the first bonding pads is connected to a second one (e.g., BP22) of the second bonding pads.

In some embodiments, in the integrated circuit package (e.g., 1*b*-2, 1*b*-4, 1*b*-10), a first conductive via (e.g., V11) is disposed between and electrically connected to a first one (e.g., 118*a*) of the first die pads and a first one (e.g., BP11) of the first bonding pads, and a first thermal via (e.g., V12) is disposed between a second one (e.g., 118*b*) of the first die pads and a second one (e.g., BP13) of the first bonding pads and electrically insulated from the second one of the first bonding pads. In some embodiments, the second one (e.g., 118*b*) of the first die pads is an active die pad electrically connected to the first device (e.g., T1). In some embodiments, the first one (e.g., 118*a*) of the first die pads is separated from the second one (e.g., 118*b*) of the first die pads. In some embodiments, the first semiconductor die further includes a first insulator (e.g., I1') between the first thermal via (e.g., V11) and the second one (e.g., 118*b*) of the first bonding pads. Besides, the second semiconductor die (e.g., 200) includes a plurality of second bonding pads (e.g., BP21 to BP24), wherein the first one (e.g., BP11) of the first bonding pads is connected to a first one (e.g., BP21) of the second bonding pads, and the second one (e.g., BP13) of the first bonding pads is connected to a second one (e.g., BP23) of the second bonding pads.

In some embodiments, in the integrated circuit package (e.g., 1c-2, 1c-4, 1c-10), a first conductive via (e.g., V11) is disposed between and electrically connected to a first one (e.g., 118a) of the first die pads and a first one (e.g., BP11) of the first bonding pads, and a first thermal via (e.g., V12) is disposed between a second one (e.g., 118c) of the first die pads and a second one (e.g., BP14) of the first bonding pads and electrically insulated from the second one of the first bonding pads. In some embodiments, the second one (e.g., 118c) of the first die pads is a floating die pad electrically insulated from the first device (e.g., T1). In some embodiments, the first one (e.g., 118a) of the first die pads is separated from the second one (e.g., 118c) of the first die pads. In some embodiments, the first semiconductor die further includes a first insulator (e.g., I1') between the first thermal via (e.g., V11) and the second one (e.g., 118c) of the first bonding pads. Besides, the second semiconductor die (e.g., 200) includes a plurality of second bonding pads (e.g., BP21 to BP24), wherein the first one (e.g., BP11) of the first bonding pads is connected to a first one (e.g., BP21) of the second bonding pads, and the second one (e.g., BP14) of the first bonding pads is connected to a second one (e.g., BP24) of the second bonding pads.

In some embodiments, in the integrated circuit package (e.g., 1a-5, 1a-11, 1a-12), a first conductive via (e.g., V11) is disposed between and electrically connected to a first one (e.g., right side of 118a) of the first die pads and a first one (e.g., BP11) of the first bonding pads, and a first thermal via (e.g., V12) is disposed between a second one (e.g., left side of 118a) of the first die pads and a second one (e.g., BP12) of the first bonding pads and electrically insulated from a second device (e.g., T2) of the semiconductor device. In some embodiments, the first one (e.g., right side of 118a) of the first die pads is connected to the second one (e.g., left side of 118a) of the first die pads. Besides, the second semiconductor die (e.g., 200) includes a plurality of second bonding pads (e.g., BP21 to BP24), wherein the first one (e.g., BP11) of the first die pads is connected to a first one (e.g., BP21) of the second bonding pads, and the second one (e.g., BP12) of the first die pads is connected to a second one (e.g., BP22) of the second bonding pads.

In some embodiments, in the integrated circuit package (e.g., 1b-5, 1b-11, 1b-12), a first conductive via (e.g., V11) is disposed between and electrically connected to a first one (e.g., 118a) of the first die pads and a first one (e.g., BP11) of the first bonding pads, and a first thermal via (e.g., V12) is disposed between a second one (e.g., 118c) of the first die pads and a second one (e.g., BP13) of the first bonding pads and electrically insulated from a second device (e.g., T2) of the semiconductor device. In some embodiments, the first one (e.g., 118a) of the first die pads is separated from the second one (e.g., 118c) of the first die pads. Besides, the second semiconductor die (e.g., 200) includes a plurality of second bonding pads (e.g., BP21 to BP24), wherein the first one (e.g., BP11) of the first die pads is connected to a first one (e.g., BP21) of the second bonding pads, and the second one (e.g., BP13) of the first die pads is connected to a second one (e.g., BP23) of the second bonding pads.

In some embodiments, in the integrated circuit package (e.g., 1c-5, 1c-11, 1c-12), a first conductive via (e.g., V11) is disposed between and electrically connected to a first one (e.g., 118a) of the first die pads and a first one (e.g., BP11) of the first bonding pads, and a first thermal via (e.g., V12) is disposed between a second one (e.g., 118c) of the first die pads and a second one (e.g., BP14) of the first bonding pads and electrically insulated from the second one of the first die pads. In some embodiments, the second one (e.g., 118c) of the first die pads is a floating die pad electrically insulated from the first device (e.g., T1). In some embodiments, the first one (e.g., 118a) of the first die pads is separated from the second one (e.g., 118c) of the first die pads. Besides, the second semiconductor die (e.g., 200) includes a plurality of second bonding pads (e.g., BP21 to BP24), wherein the first one (e.g., BP11) of the first die pads is connected to a first one (e.g., BP21) of the second bonding pads, and the second one (e.g., BP14) of the first die pads is connected to a second one (e.g., BP24) of the second bonding pads.

The relationships of components described above may be applied to different locations of thermal vias V22 in the second semiconductor dies 200, as shown in some of integrated circuit packages (e.g., e.g., 1a-6, 1a-7, 1a-8, 1b-6, 1b-7, 1b-8, 1c-6, 1c-7, 1c-8), so the details are not iterated herein.

In some embodiments, a dimension of the first conductive via (e.g., V11) is different from a dimension of the first thermal via (e.g., V12). In some embodiments, the dimension includes a height, a width, a top-view area or a combination thereof.

In some embodiments, in the integrated circuit package (e.g., 1a-1 to 1a-12, 1b-1 to 1b-12, 1c-1 to 1c-12, 1d-1 to 1d-4), the first semiconductor die is bonded to the second semiconductor die through a face-to-face bonding.

In some embodiments, in the integrated circuit package (e.g., 2a-1 to 2a-4), the first semiconductor die is bonded to the second semiconductor die through a face-to-back bonding.

In some embodiments, an integrated circuit package (e.g., 1a-1 to 1a-12, 1b-1 to 1b-12, 1c-1 to 1c-12, 1d-1 to 1d-4, 2a-1 to 2a-4) includes a first semiconductor die (e.g., 100) bonded to a second semiconductor die (e.g., 200). The first semiconductor die includes a plurality of first die pads (e.g., 118a to 118c) over a first device (e.g., T1), a plurality of first bonding pads (e.g., BP11 to BP14) over the first die pads, a first conductive via (e.g., V11) disposed between and electrically connected to a first one of the first die pads and a first one of the first bonding pads, and a first thermal via (e.g., V12) disposed between a second one of the first die pads and a second one of the first bonding pads. The second semiconductor die (e.g., 200) includes a plurality of second bonding pads (e.g., BP21 to BP24), wherein the first one of the first die pads is connected to a first one of the second bonding pads, and the second one of the first die pads is connected to a second one of the second bonding pads. Besides, the first thermal via (e.g., V12) is electrically insulated from a second device (e.g., T2) of the second semiconductor die (e.g., 200).

In some embodiments, in the integrated circuit package (e.g., 1a-1, 1a-3, 1a-9, 1b-1, 1b-3, 1b-9, 1c-1, 1c-3, 1c-9), the first thermal via (e.g., V12) is electrically insulated from the second one of the first die pads.

In some embodiments, in the integrated circuit package (e.g., 1a-2, 1a-4, 1a-10, 1b-2, 1b-4, 1b-10, 1c-2, 1c-4, 1c-10), the first thermal via (e.g., V12) is electrically insulated from the second one of the first bonding pads.

In some embodiments, in the integrated circuit package (e.g., 1a-5, 1a-11, 1a-12, 1b-5, 1b-11, 1b-12, 1c-5, 1c-11, 1c-12), the first thermal via (e.g., V12) is electrically connected to the second one of the first die pads and the second one of the first bonding pads, and the second one of the first die pads is a dummy die pad.

The relationships of components described above may be applied to different locations of thermal vias V22 in the second semiconductor dies 200, as shown in some of integrated circuit packages (e.g., e.g., 1a-6, 1a-7, 1a-8, 1b-6, 1b-7, 1b-8, 1c-6, 1c-7, 1c-8), so the details are not iterated herein.

In some embodiments, in the integrated circuit package (e.g., 1d-1 to 1d-4, 2a-1 to 2a-4), the first semiconductor die further includes a second thermal via (e.g., V12 away from V11) disposed aside the first thermal via (e.g., V12 adjacent to V11).

In view of the above, in the disclosure, the thermal control performance is improved by adding one or more thermal vias around the bonding interface between two adjacent semiconductor dies.

In accordance with some embodiments of the disclosure, an integrated circuit package includes a first semiconductor die and a second semiconductor die bonded to each other. The first semiconductor die includes a plurality of first die pads over a first device, a plurality of first bonding pads over the first die pads, a first conductive via disposed between and electrically connected to a first one of the first die pads and a first one of the first bonding pads, and a first thermal via disposed between a second one of the first die pads and a second one of the first bonding pads and electrically insulated from the second one of the first die pads or the second one of the first bonding pads. The second semiconductor die includes a plurality of second bonding pads, wherein the first one of the first die pads is connected to a first one of the second bonding pads, and the second one of the first die pads is connected to a second one of the second bonding pads.

In some embodiments, the first semiconductor die further includes a first insulator between the first thermal via and the second one of the first die pads. In some embodiments, the first semiconductor die further includes a first insulator between the first thermal via and the second one of the first bonding pads. In some embodiments, the first one of the first die pads is connected to the second one of the first die pads. In some embodiments, the first one of the first die pads is separated from the second one of the first die pads. In some embodiments, a dimension of the first conductive via is different from a dimension of the first thermal via. In some embodiments, the dimension includes a height, a width, a top-view area or a combination thereof. In some embodiments, the second one of the first die pads is an active die pad electrically connected to the first device. In some embodiments, the second one of the first die pads is a floating die pad electrically insulated from the first device. In some embodiments, the first semiconductor die is bonded to the second semiconductor die through a face-to-face bonding. In some embodiments, the first semiconductor die is bonded to the second semiconductor die through a face-to-back bonding.

In accordance with some embodiments of the disclosure, an integrated circuit package includes a first semiconductor die bonded to a second semiconductor die. The first semiconductor die includes a plurality of first die pads over a first device, a plurality of first bonding pads over the first die pads, a first conductive via disposed between and electrically connected to a first one of the first die pads and a first one of the first bonding pads, and a first thermal via disposed between a second one of the first die pads and a second one of the first bonding pads. The second semiconductor die includes a plurality of second bonding pads, wherein the first one of the first bonding pads is connected to a first one of the second bonding pads, and the second one of the first bonding pads is connected to a second one of the second bonding pads. Besides, the first thermal via is electrically insulated from a second device of the second semiconductor die.

In some embodiments, the first thermal via is electrically insulated from the second one of the first die pads. In some embodiments, the first thermal via is electrically insulated from the second one of the first bonding pads. In some embodiments, the first thermal via is electrically connected to the second one of the first die pads and the second one of the first bonding pads, and the second one of the first die pads is a dummy die pad. In some embodiments, the first semiconductor die further includes a second thermal via disposed aside the first thermal via.

In accordance with some embodiments of the disclosure, a method of forming an integrated circuit package includes forming first die pads on a first semiconductor substrate; forming a first insulator on a first one of the first die pads; forming a first conductive via and a first thermal via on the first one of the first die pads, wherein the first insulator is between the first thermal via and the first one of the first die pads; and forming first bonding pads on the first conductive via and the first thermal via, so as to obtain a first semiconductor die.

In some embodiments, a method of forming the first conductive via and the first thermal via includes forming a seed layer over the first insulator and the first one of the first die pads, forming a photoresist layer on the seed layer, wherein the photoresist layer has a first opening corresponding to the first insulator and a second opening corresponding to the first one of the die pad, forming the first conductive via and the first thermal via by using the seed layer as a seed, and removing the photoresist layer. In some embodiments, the method further includes forming a second thermal via on a second one of the first die pads. In some embodiments, the method further includes bonding a second semiconductor die to the first semiconductor die through a metal-to-metal bonding and a dielectric-to-dielectric bonding.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit package, comprising:
   a first semiconductor die, comprising:
     a plurality of first die pads over a first device;
     a plurality of first bonding pads over the first die pads;
     a first conductive via disposed between and electrically connected to a first one of the first die pads and a first one of the first bonding pads; and a first thermal via disposed between a second one of the first die pads and a second one of the first bonding pads and electrically insulated from the second one of the first die pads or the second one of the first bonding pads; and a second semiconductor die bonded to the first semiconductor die and comprising:
a plurality of second bonding pads, wherein the first one of the first bonding pads is connected to a first one of the second bonding pads, and the second one of the first bonding pads is connected to a second one of the second bonding pads.

2. The integrated circuit package of claim 1, wherein the first semiconductor die further comprises a first insulator between the first thermal via and the second one of the first die pads.

3. The integrated circuit package of claim 1, wherein the first semiconductor die further comprises a first insulator between the first thermal via and the second one of the first bonding pads.

4. The integrated circuit package of claim 1, wherein the first one of the first die pads is connected to the second one of the first die pads.

5. The integrated circuit package of claim 1, wherein the first one of the first die pads is separated from the second one of the first die pads.

6. The integrated circuit package of claim 1, wherein a dimension of the first conductive via is different from a dimension of the first thermal via.

7. The integrated circuit package of claim 6, wherein the dimension comprises a height, a width, a top-view area or a combination thereof.

8. The integrated circuit package of claim 1, wherein the second one of the first die pads is an active die pad electrically connected to the first device.

9. The integrated circuit package of claim 1, wherein the second one of the first die pads is a floating die pad electrically insulated from the first device.

10. The integrated circuit package of claim 1, wherein the first semiconductor die is bonded to the second semiconductor die through a face-to-face bonding.

11. The integrated circuit package of claim 1, wherein the first semiconductor die is bonded to the second semiconductor die through a face-to-back bonding.

12. An integrated circuit package, comprising:
a first semiconductor die, comprising:
a plurality of first die pads over a first device;
a plurality of first bonding pads over the first die pads;
a first conductive via disposed between and electrically connected to a first one of the first die pads and a first one of the first bonding pads; and
a first thermal via disposed between a second one of the first die pads and a second one of the first bonding pads; and a second semiconductor die bonded to the first semiconductor die and comprising:
a plurality of second bonding pads, wherein the first one of the first die pads is connected to a first one of the second bonding pads, and the second one of the first die pads is connected to a second one of the second bonding pads,
wherein the first thermal via is electrically insulated from a second device of the second semiconductor die.

13. The integrated circuit package of claim 12, wherein the first thermal via is electrically insulated from the second one of the first die pads.

14. The integrated circuit package of claim 12, wherein the first thermal via is electrically insulated from the second one of the first bonding pads.

15. The integrated circuit package of claim 12, wherein the first thermal via is electrically connected to the second one of the first die pads and the second one of the first bonding pads, and the second one of the first die pads is a dummy die pad.

16. The integrated circuit package of claim 12, wherein the first semiconductor die further comprises a second thermal via disposed aside the first thermal via.

17. A method of forming an integrated circuit package, comprising:
forming first die pads on a first semiconductor substrate;
forming a first insulator on a first one of the first die pads;
forming a first conductive via and a first thermal via on the first one of the first die pads, wherein the first insulator is between the first thermal via and the first one of the first die pads; and
forming first bonding pads on the first conductive via and the first thermal via, so as to obtain a first semiconductor die.

18. The method of claim 17, wherein a method of forming the first conductive via and the first thermal via comprises:
forming a seed layer over the first insulator and the first one of the first die pads;
forming a photoresist layer on the seed layer, wherein the photoresist layer has a first opening corresponding to the first insulator and a second opening corresponding to the first one of the die pad;
forming the first conductive via and the first thermal via by using the seed layer as a seed; and
removing the photoresist layer.

19. The method of claim 17, further comprising forming a second thermal via on a second one of the first die pads.

20. The method of claim 17, further comprising bonding a second semiconductor die to the first semiconductor die through a metal-to-metal bonding and a dielectric-to-dielectric bonding.

* * * * *